United States Patent

Osawa et al.

[11] Patent Number: 5,903,579
[45] Date of Patent: May 11, 1999

[54] SCAN PATH FORMING CIRCUIT

[75] Inventors: Tokuya Osawa; Hideshi Maeno, both of Tokyo, Japan

[73] Assignee: Mitsubishi Denki Kabushiki Kaisha, Tokyo, Japan

[21] Appl. No.: 08/653,471

[22] Filed: May 24, 1996

[30] Foreign Application Priority Data

Dec. 20, 1995 [JP] Japan .................................... 7-332123

[51] Int. Cl.⁶ .................................................. G01R 31/28
[52] U.S. Cl. ........................................................ 371/22.31
[58] Field of Search ............................. 371/22.31, 22.32, 371/22.34; 324/73.1, 158.1

[56] References Cited

U.S. PATENT DOCUMENTS

| 5,150,044 | 9/1992 | Hashizume et al. . |
| 5,392,296 | 2/1995 | Suzuki . |
| 5,621,740 | 4/1997 | Kamada ................................ 371/22.3 |

FOREIGN PATENT DOCUMENTS

| 40 41 897 | 12/1990 | Germany . |
| 63-135880 | 6/1988 | Japan . |
| 6 102327 | 4/1994 | Japan . |

Primary Examiner—Hoa T. Nguyen
Attorney, Agent, or Firm—Oblon, Spivak, McClelland, Maier & Neustadt, P.C.

[57] ABSTRACT

A connection circuit (CC) is formed by selectors (2,3) and a flip-flop (4). Th selectors (2,3) are switch-controlled by a test holding control signal (thld) and a shift mode control signal (sm) respectively. A scan-in terminal (si) is connected to a data input 0 terminal of the selector (2), while an output terminal of the flip-flop (4) is connected to its data input 1 terminal. An output terminal of the selector (2) is connected to a data input 1 terminal of the selector (3). An input terminal (d) is connected to a data input 0 terminal of the selector (3). An output terminal of the selector (3) is connected to an input terminal of the flip-flop (4). The output terminal of the flip-flop (4) is also connected to a scan-out terminal (so) and an output terminal (q) of the connection circuit (CC). In an ordinary operation, data is inputted through the input terminal (d). Thus, a scan path forming circuit attaining a high-speed operation in an ordinary operation is provided.

20 Claims, 26 Drawing Sheets

F I G. 9
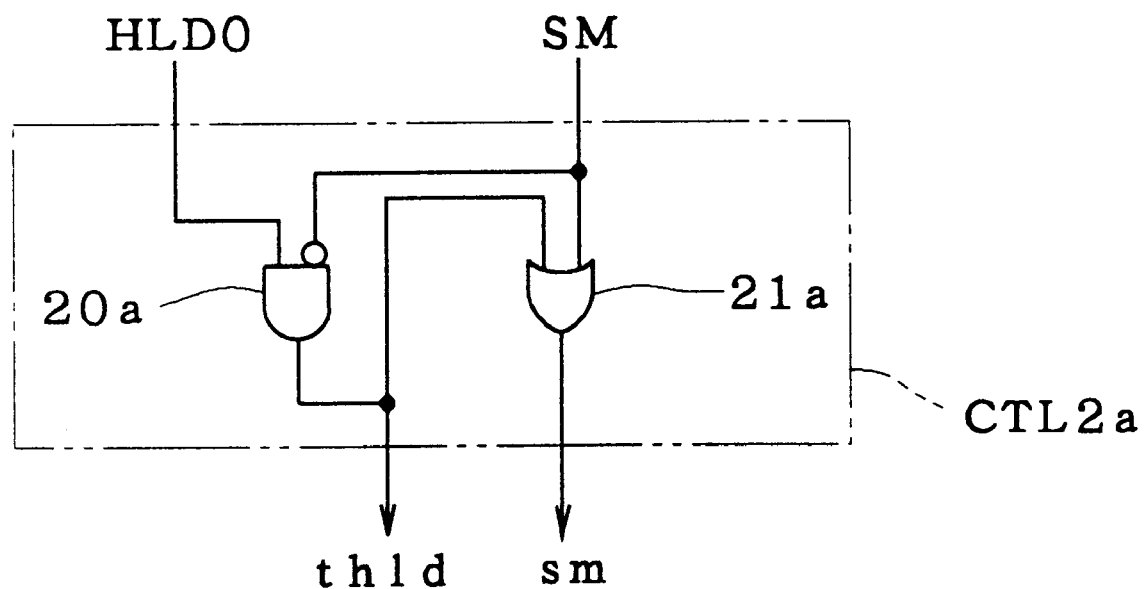

SCAN PATH FORMING CIRCUIT

BACKGROUND OF THE INVENTION

1. Field of the Invention

The present invention relates to a testing circuit, and more particularly, it relates to a scan path forming circuit which is provided around a logic circuit provided in a semiconductor device for testing the same.

2. Description of the Background Art

In general, a design of providing a test simplifying circuit has been applied to a semiconductor device, for an operation test of a logic circuit which is provided in the semiconductor device.

Before explaining a scan test by the test simplifying design, a data circuit which is a logic circuit and input/output operations of the data circuit are now described with reference to FIG. 30.

FIG. 30 is a circuit diagram showing a data circuit 1 and circuits for inputting and outputting data in and from the data circuit 1.

Throughout the specification, symbols denote data or signals and terminals in common. For example, symbol IN[0] may denote input data or a data input terminal.

The data circuit 1 is now described. The data circuit 1 comprises input terminals DI[0] to DI[3] and output terminals DO[0] to DO[3]. This data circuit 1 is a circuit outputting output data DO[0] to DO[3], which are specific to input data DI[0] to DI[3] supplied to the input terminals DI[0] to DI[3], from the output terminals DO[0] to DO[3]. The data circuit 1 can be a combinational circuit or a memory circuit such as a RAM (random access memory). Data input terminals IN[0] to IN[3] and data output terminals OUT[0] to OUT[3] are connected to the input terminals DI[0] to DI[3] and the output terminals DO[0] to DO[3] through selectors 102[0] to 102[3] and flip-flops 4[0] to 4[3] described later respectively. [Numbers] which are added to the data or terminals express bit numbers of data. As described above, the data inputted in or outputted from the terminals are associated with each other by bit numbers respectively. Therefore, the bit numbers are hereinafter omitted when the data or terminals are generically called or no variation with the bit numbers may be taken into consideration. Also when the bit numbers are omitted, the respective data correspond to the terminals of the respective bit numbers.

The circuits which are related to data input/output are now described. The selectors 102 and the flip-flops 4 are inserted between the input terminals DI of the data circuit 1 and the data input terminals IN and between the output terminals DO and the data output terminals OUT respectively, in order to hold input or output data. All selectors 102 are simultaneously controlled by a holding control signal HLD0 which is inputted from a holding terminal HLD0. The flip-flops are D flip-flops, or flip-flops having functions which are similar to those of D flip-flops. Functions of the selectors 102 and the flip-flops 4 are similar in every bit number, and identical to each other on the input and output sides. While the following description is made on the selectors 102 and the flip-flops 4 provided on the input side, this also applies to the output side.

The state of connection is now described. Each selector 102 comprises two data input terminals, i.e., a data input 0 terminal which is selected and connected when the holding control signal HLD0 is "0" and a data input 1 terminal which is selected and connected when the holding control signal HLD0 is "1". The data input 0 terminal is connected with each data input terminal IN, while the data input 1 terminal is connected with an output terminal of the flip-flop 4. An output terminal of each selector 102 is connected to an input terminal of each flip-flop 4. The output terminal of the flip-flop 4 is connected to each input terminal DI and the data input 1 terminal of the selector 102 in common.

Circuit operations in the aforementioned state of connection are now described. When the holding control signal HLD0 is "0", data which are inputted in the data input 0 terminals of the selectors 102 are connected to the output terminals of the selectors 102. Therefore, input data IN are supplied to the input terminals DI through the selectors 102 and the flip-flops 4. When the holding control signal HLD0 is "1", on the other hand, the data input 1 terminals are selected, whereby data outputted from the output terminals of the flip-flops 4 are supplied to the input terminals of the flip-flops 4 through the selectors 102. Thus, the data of the flip-flops 4 are held.

The circuit operations in the circuits shown in FIG. 30 are summarized with respect to the input and output sides as follows: When the holding control signal HLD0 is "0", the input data IN are inputted in the input terminals DI, and output data DO are outputted from the data output terminals OUT. Namely, the input operation and the output operation are synchronized with each other. When the holding control signal HLD0 is "1", on the other hand, the input data DI and the output data DO are held by the selectors 102 and the flip-flops 4 respectively.

The scan test is now described.

The scan test is adapted to:

1. provide a scan path on the circuit to be tested,
2. supply test patterns from the scan path to the circuit,
3. incorporate output data outputted from the circuit with respect to the test patterns in the scan path again, and
4. analyze the results.

The scan test is a technique of a test simplifying design. The scan path is implemented by converting flip-flops which are connected to input or output terminals of the tested circuit to scan flip-flops.

FIG. 31 is a circuit diagram showing a state of converting a flip-flop 4 to a scan flip-flop SFF. In this case, scan conversion is adapted to connect a selector 103 to an input terminal of the flip-flop 4. An output of the selector 103 is switched by a shift mode signal SM. Data D and scan-in data SI are inputted in a data input 0 terminal and a data input 1 terminal of the selector 103 respectively. The data D is selected when the shift mode signal SM is "0", while the scan-in data SI is selected when the signal SM is "1", to be inputted in the flip-flop 4.

FIG. 32 is a circuit diagram showing a data circuit 1 which is provided with a scan path. Connection circuits PCC[0] to PCC[3] consisting of selectors 102 and 103 and flip-flops 4 are connected between data input terminals IN[0] to IN[3] and input terminals DI[0] to DI[3] respectively on the input side. Similarly, connection circuits PCC[0] to PCC[3] are connected between data output terminals DO[0] to DO[3] and output terminals OUT[0] to OUT[3] respectively on the output side. FIG. 33 shows each connection circuit PCC.

The functions of the connection circuits PCC provided on the input and output sides are identical to each other, and hence description is made on the state of connection of the connection circuit PCC shown in FIG. 33 with reference to the input side, similarly to FIG. 30.

The selector 102 has a data input 0 terminal which is connected with a data input terminal IN, and a data input 1 terminal which is connected with an output terminal of the flip-flop 4. An output terminal of the selector 102 is connected to a data input 0 terminal of the selector 103. A data input 1 terminal of the selector 103 is connected with a scan-in terminal SI. An output terminal of the selector 103 is connected to an input terminal of the flip-flop 4, while output data of the flip-flop 4 is inputted in the data input 1 terminal of the selector 102 as described above, and further outputted as scan-out data SO of the connection circuit PCC or serial input data Q.

As shown in FIG. 32, each scan-out data SO defines scan-in data SI of a connection circuit PCC having the next bit number, and is inputted to the shift-in terminal SI of the connection circuit PCC. The scan-out data SO of the input side connection circuit PCC[3] defines the scan-in data SI of the output side connection circuit PCC[0], and the scan-out data SO of the output side connection circuit PCC[3] is outputted as the scan-out data SO of the overall scan path.

The circuit operations are now described. The operations of the circuits shown in FIG. 32 include an ordinary operation and a scan test operation.

The ordinary operation is first described. The ordinary operation of the circuits shown in FIG. 32 is similar to the operation of the circuits shown in FIG. 30.

In the ordinary operation, the shift mode control signal SM is set at "0". At this time, input data IN are incorporated in the input terminals DI of the data circuit 1 through the connection circuits PCC on the input side if a holding control signal HLD0 is "0". On the other hand, output data DO are outputted from the data output terminals OUT through the connection circuits PCC on the output side. If the holding control signal HLD0 is "1", on the other hand, the input and output data IN and DO are held in the connection circuits PCC respectively.

The scan test operation is now described. In the scan test, shift-in of test patterns, execution, and shift-out of test results are successively performed.

1. Shift-In of Test Patterns

In preparation for inputting of test patterns in the data circuit 1, the test patterns are shifted in the input side connection circuits PCC. When the shift mode control signal SM is set at "1", the shift patterns to be inputted in the data circuit 1 can be shifted in from the scan-in terminal SI. The data circuit 1 of this prior art is of four bits, and hence 4-bit test patterns are shifted in the connection circuits PCC. The test patterns are shifted in the following order of the input side connection circuits PCC[0]→PCC[1]→PCC[2]→PCC[3], to be inputted in the input side connection circuits PCC[0] to PCC[3].

2. Execution

The shift mode control signal SM is set at "0". If the holding control signal HLD0 is "1", data after completion of the test pattern shift-in, i.e., the test patterns, are held in the input side connection circuits PCC, while data after completion of the test pattern shift-in are held in the output side connection circuits PCC. If the holding control signal HLD0 is "0" when the shift mode control signal SM is set at "0", the input data IN are incorporated in the input terminals DI, and the output data DO which are the test results of the data circuit 1 are outputted from the data output terminals OUT. When the holding control signal HLD0 is thereafter converted from "0" to "1", the input data IN are held in the input side connection circuits PCC while the output data DO which are the test results are held in the output side connection circuits PCC.

3. Shift-Out of Test Results

The shift mode control signal SM is set at "1". At this time, the test results are successively shifted out from the scan-out terminals SO.

The above are the circuit operations of the circuits shown in FIG. 32.

As shown in FIG. 32, two selectors 102 and 103 are included between each data input terminal IN for the ordinary operation and each input terminal DI of the data circuit 1. Similarly, two selectors 102 and 103 are included between each output terminal DO of the data circuit 1 and each data output terminal OUT for the ordinary operation. Therefore, set-up is increased and the circuit speed in the ordinary operation is disadvantageously reduced.

SUMMARY OF THE INVENTION

According to a first aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first and second control input terminals for the control circuit, first and second control output terminals for the control circuit and a test terminal for the control circuit, first and second control input signals for the control circuit and a test signal for the control circuit are inputted in the first and second control input terminals for the control circuit and the test terminal for the control circuit respectively while first and second control output signals are outputted from the first and second control output terminals for the control circuit respectively, the first and second control input signals for the control circuit, the first and second control output signals for the control circuit, and the test signal for the control circuit take the two-valued logic respectively, the logics of the first and second control output signals for the control circuit are equal to that of the second control input signal for the control circuit when the test signal for the control circuit takes either one of the two-valued logic, the logic of the first control output signal for the control circuit is equal to an inverted logic of the first control input signal for the control circuit and the logic of the second control output signal for the control circuit is equal to that of the first control input signal for the control circuit when the test signal for the control circuit takes the other one of the two-valued logic, the first control output terminal for the control circuit is connected to the first control terminal for the connection circuit, and the second control output terminal for the control circuit is connected to the second control terminal for the connection circuit, thereby controlling the connection circuit.

According to a second aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first and second control input terminals for the control circuit and first and second control output terminals for the control circuit, first and second control input signals for the control circuit are inputted in the first and second control input terminals for the control circuit respectively while first and second control output signals for the control circuit are outputted from the first and second control output terminals for the control circuit respectively, the first and second control input signals for the control circuit and the first and second control output signals for the control circuit take the two-valued logic respectively, the logics of the first and second control output signals for the control circuit are equal to that of the second control input signal for the control circuit when the first control input signal for the control circuit takes the first logic, the logic of the first control output signal for the control circuit is equal to an inverted logic of the first control input signal for the control circuit and the logic of the second control output signal for the control circuit is equal to that of the first control input signal for the control circuit when the first control input signal for the control circuit takes the second logic, the first control output terminal for the control circuit is connected to the first control terminal for the connection circuit, and the second control output terminal for the control circuit is connected to the second control terminal for the connection circuit, thereby controlling the connection circuit.

According to a third aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first to third control input terminals for the control circuit, first and second control output terminals for the control circuit and a test terminal for the control circuit, first to third control input signals for the control circuit and a test signal for the control circuit are inputted in the first to third control input terminals for the control circuit and the test terminal for the control circuit respectively while first and second control output signals for the control circuit are outputted from the first and second control output terminals for the control circuit respectively, the first to third control input signals for the control circuit, the first and second control output signals for the control circuit, and the test signal for the control circuit take the two-valued logic respectively, the logics of the first and second control output signals for the control circuit are equal to that of the second control input signal for the control circuit when the test signal for the control circuit takes either one of the two-valued logic, the logics of the first and second control output signals for the control circuit are equal to those of the first and third control input signals for the control circuit respectively when the test signal for the control circuit takes the other one of the two-valued logic, the first control output terminal for the control circuit is connected to the first control terminal for the connection circuit, and the second control output terminal for the control circuit is connected to the second control terminal for the connection circuit, thereby controlling the connection circuit.

According to a fourth aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first to third control input terminals for the control circuit, first and second control output terminals for the control circuit and a test terminal for the control circuit, first to third control input signals for the control circuit and a test signal for the control circuit are inputted in the first to third control input terminals for the control circuit and the test terminal for the control circuit respectively while first and second control output signals for the control circuit are outputted from the first and second control output terminals for the control circuit respectively, the first to third control input signals for the control circuit, the first and second control output signals for the control circuit, and the test signal for the control circuit take the two-valued logic respectively, the logics of the first and second control output signals for the control circuit are equal to that of the second control input signal for the control circuit when the test signal for the control circuit takes either one of the two-valued logic and the first and third control input signals for the control circuit take the first logic respectively, the logics of the first and second control output signals for the control circuit are equal to those of the first and third control input signals for the control circuit respectively when the test signal for the control circuit takes the other one of the two-valued logic, the first control output terminal for the control circuit is connected to the first control terminal for the connection circuit, and the second control output terminal for the control circuit is connected to the second control terminal for the connection circuit, thereby controlling the connection circuit.

According to a fifth aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first to third control input terminals for the control circuit and first and second control output terminals for the control circuit, first to third control input signals for the control circuit are inputted in the first to third control input terminals for the control circuit respectively while first and second control output signals for the control circuit are outputted from the first and second control output terminals for the control circuit respectively, the first to third control input signals for the control circuit and the first and second control output signals for the control circuit take the two-valued logic respectively, the logics of the first and second control output signals for said control circuit are equal to that of the second control input signal for the control circuit when the first control input signal for the control circuit takes the first logic, the logics of the first and second control output signals for the control circuit are equal to those of the first and third control input signals for the control circuit respectively when the first control input signal for the control circuit takes the second logic, the first control output terminal for the control circuit is connected to the first control terminal for the connection circuit, and the second control output terminal for the control circuit is connected to the second control terminal for the connection circuit, thereby controlling the connection circuit.

According to a sixth aspect of the present invention, a scan path forming circuit comprises a connection circuit and a control circuit, wherein the connection circuit includes first and second switching circuits, a storage circuit, an input terminal for the connection circuit, a test input terminal for the connection circuit, an output terminal for the connection circuit and first and second control terminals for the connection circuit, first and second control signals for the connection circuit which are inputted in the first and second control terminals respectively for the connection circuit take two-valued logic consisting of first and second logics which are different from each other respectively, the first switching circuit has a first input terminal for the first switching circuit, a second input terminal for the first switching circuit, an output terminal for the first switching circuit, and a control terminal for the first switching circuit, the second switching circuit has a first input terminal for the second switching circuit, a second input terminal for the second switching circuit, an output terminal for the second switching circuit, and a control terminal for the second switching circuit, the storage circuit has input and output terminals for the storage circuit, the control terminal for the first switching circuit forms the first control terminal for the connection circuit, the first input terminal for the first switching circuit forms the input terminal for the connection circuit, the first input terminal for the first switching circuit is connected to the output terminal for the first switching circuit when the first control signal for the connection circuit takes the first logic, the second input terminal for the first switching circuit is connected to the output terminal for the first switching circuit when the first control signal for the connection circuit takes the second logic, the control terminal for the second switching circuit forms the second control terminal for the connection circuit, the first input terminal for the second switching circuit forms the test input terminal for the connection circuit, the first input terminal for the second switching circuit is connected to the output terminal for the second switching circuit when the second control signal for the connection circuit takes the first logic, the second input terminal for the second switching circuit is connected to the output terminal for the second switching circuit when the second control signal for the connection circuit takes the second logic, the output terminal for the second switching circuit is connected to the second input terminal for the first switching circuit, the output terminal for the first switching circuit is connected to the input terminal for the storage circuit, the output terminal for the storage circuit forms the output terminal for the connection circuit and is connected to the second input terminal for the second switching circuit, the control circuit includes first to third control input terminals for the control circuit and first and second control output terminals for the control circuit, first to third control input signals for the control circuit are inputted in the first to third control input terminals for the control circuit respectively while first and second control output signals for the control circuit are outputted from the first and second control output terminals for the control circuit respectively, the first to third control input signals for the control circuit and the first and second control output signals for the control circuit take the two-valued logic respectively, the logics of the first and second control output signals for the control circuit are equal to that of the second control input signal for the control circuit when the first and third control input signals for the control circuit take the first logic, the logics of the first and second control output signals for the control circuit are equal to those of the first and third control input signals for the control circuit respectively when the first control input signal for the control circuit takes the second logic, the first control output terminal for the control circuit is connected to the first control terminal for the connection circuit, and the second control output terminal for the control circuit is connected to the second control terminal for the connection circuit, thereby controlling the connection circuit.

According to a seventh aspect of the present invention, a scan path forming circuit comprises a connection circuit and a control circuit, wherein the connection circuit includes an input terminal for the connection circuit, a test input terminal for the connection circuit, an output terminal for the connection circuit and first and second control terminals for the connection circuit, first and second control signals for the connection circuit which are inputted in the first and second control terminals for the connection circuit take two-valued logic consisting of first and second logics which are different from each other respectively, the connection circuit outputs a signal inputted in the input terminal for the connection circuit from the output terminal for the connection circuit when the first control signal for the connection circuit takes the first logic, the connection circuit outputs a signal inputted in the test input terminal for the connection circuit from the output terminal for the connection circuit when the first control signal for the connection circuit takes the second logic and the second control signal for the connection circuit takes the first logic, the connection circuit keeps on outputting a signal having been outputted from the output terminal for the connection circuit from the output terminal for the connection circuit if the logic of a signal inputted in the expectation terminal and that of the signal inputted in the input terminal for the connection circuit are in agreement and keeps on outputting the first logic from the output terminal for the connection circuit if the logic of the signal inputted in the expectation terminal and that of the signal inputted in the input terminal for the connection circuit are in disagreement when the first and second control signals for the connection circuit each take the second logic, the control circuit includes first to third control input terminals for the control circuit and first and second control output terminals for the control circuit, first to third control input signals for the control circuit are inputted in the first to third control input terminals for the control circuit respectively while first and second control output signals for the control circuit are outputted from the first and second control output terminals for the control circuit respectively, the first to third control input signals for the control circuit and the first and second control output signals for the control circuit take the two-valued logic respectively, the logics of the first and second control output signals for the control circuit are equal to that of the second control input signal for the control circuit when the first and third control input signals for the control circuit take the first logic, the logics of the first and second control output signals for the control circuit are equal to those of the first and third control input signals for the control circuit respectively when the first control input signal for the control circuit takes the second logic, the first control output terminal for the control circuit is connected to the first control terminal for the connection circuit, and the second control output terminal for the control circuit is connected to the second control terminal for the connection circuit, thereby controlling the connection circuit.

According to an eighth aspect of the present invention, the connection circuit further comprises a comparison terminal and an expectation terminal, and includes an exclusive OR element, a NAND element and an AND element, a comparison signal which is inputted in the comparison terminal takes the two-valued logic, the exclusive OR element comprises an output terminal for the exclusive OR element and two input terminals for the exclusive OR element, the NAND element comprises an output terminal for the NAND element and two input terminals for the NAND element, the AND element comprises an output terminal for the AND element and two input terminals for the AND element, connection between the output terminal for the storage circuit and the second input terminal for the second switching circuit is that through the AND element, either one of the input terminals for the exclusive OR element forms the expectation terminal, the other one of the input terminals for the exclusive OR element and the first input terminal for the first switching circuit are connected in common, the output terminal for the exclusive OR element is connected to either one of the input terminals for the NAND element, the other one of the input terminals for the NAND element forms the comparison terminal, the output terminal for the NAND element is connected to one of the input terminals for the AND element, and the output terminal for the storage circuit is connected to the other one of the input terminals for the AND element.

According to a ninth aspect of the present invention, the connection circuit further comprises a comparison terminal and an expectation terminal, and includes an exclusive OR element and a NAND element, the storage circuit further comprises an initialization terminal for the storage circuit, a comparison signal which is inputted in the comparison terminal takes the two-valued logic, the exclusive OR element comprises an output terminal for the exclusive OR element and two input terminals for the exclusive OR element, the NAND element comprises an output terminal for the NAND element and two input terminals for the NAND element, either one of the input terminals for the exclusive OR element forms the expectation terminal, the other one of the input terminals for the exclusive OR element and the first input terminal for the first switching circuit are connected in common, the output terminal for the exclusive OR element is connected to either one of the input terminals for the NAND element, the other one of the input terminals for the NAND element forms the comparison terminal, and the output terminal for the NAND element is connected to the initialization terminal for the storage circuit.

According to a tenth aspect of the present invention, the scan path forming circuit is a scan path forming circuit provided for a RAM comprising a write terminal and a read terminal, the connection circuit is prepared every write terminal and every read terminal, the write terminal is connected to the output terminal for the connection circuit in the connection circuit which is prepared for the write terminal, the read terminal is connected to the input terminal for the connection circuit in the connection circuit which is prepared for the read terminal, a write control circuit controlling the connection circuit which is prepared every write terminal is the control circuit, a read control circuit controlling the connection circuit which is prepared every read terminal is the control circuit, and control by the write control circuit and that by the read control circuit are independent of each other.

In the structure according to each of the first to sixth aspects of the present invention, a single switching circuit is included between the input and output terminals for the connection circuit. Therefore, the set-up is reduced by connecting the terminal for an ordinary operation to the input terminal for the connection circuit, whereby the circuit speed in the ordinary operation is improved.

In the structure according to the first aspect of the present invention, employed is the control circuit ignoring the logic of either one of the first and second control input signals for the control circuit in control of the connection circuit by receiving the test signal for the control circuit. Therefore, the connection circuit can be controlled independently of the logic of the ignored control input signal.

In the structure according to the second aspect of the present invention, employed is the control circuit controlling the connection circuit by receiving the first and second control input signals for the control circuit. Therefore, the connection circuit can be controlled by a smaller number of control signals than that according to the first aspect of the present invention.

In the structure according to the third aspect of the present invention, employed is the control circuit which ignores either the first and third control input signals for the control circuit or the second control input signal for the control circuit in control of the connection circuit by receiving the test signal for the control circuit. Thus, the connection circuit can be controlled independently of the logic of the ignored control input signal(s).

In the structure according to the fourth aspect of the present invention, employed is the control circuit which ignores either the first and third control input signals for the control circuit or the second control input signal for the control circuit in control of the connection circuit by receiving the test signal for the control circuit under such setting that the first and third control input signals take the first logic when the test signal for the control circuit takes the first logic. Therefore, the connection circuit can be controlled independently of the logic of the ignored control input signal(s).

In the structure according to the fifth aspect of the present invention, employed is the control circuit which ignores either the first and third control input signals for the control circuit or the second control input signal for the control circuit in control of the connection circuit by receiving the first control input signal for the control circuit under such setting that the first control input signal for the control circuit takes the first logic in the ordinary operation. Thus, the connection circuit can be controlled independently of the logic of the ignored control input signal(s).

In the structure according to the sixth aspect of the present invention, employed is the control circuit which ignores either the first and third control input signals for the control circuit or the second control input signal for the control circuit in control of the connection circuit by receiving the first control input signal for the control circuit under such setting that the first and third control input signals for the control input signal take the first logic in the ordinary operation. Thus, the connection circuit can be controlled independently of the logic of the ignored control input signal(s).

In the structure according to the seventh aspect of the present invention, the connection circuit performs signal holding and compression of test results when the first and second control input signals for the control circuit take the second logic. Thus, the number of times for observing the test results can be reduced by compressing the test results.

In the structure according to each of the eighth and ninth aspects of the present invention, the logic of the comparison signal is switched for holding the data stored in the storage circuit and compressing the test results when the first and second control input signals for the connection circuit take the second logic. Thus, the number of times for observing the test results can be reduced by compressing the test results.

In the structure according to the tenth aspect of the present invention, control by the write control circuit and that by the read control circuit are independent of each other. Thus, the synchronous operation in the write terminal and that in the read terminal can be controlled independently of each other.

In the structure according to the eleventh aspect of the present invention, control by the write address control circuit, that by the write input control circuit, that by the read address control circuit and that by the read output control circuit are independent of each other. Thus, the respective synchronous operations in the write address terminal, in the write input terminal, in the read address terminal and in the read output terminal can be controlled independently of each other.

Accordingly, an object of the present invention is to provide a scan path forming circuit for an operation test of a logic circuit, which can attain a high-speed ordinary operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a circuit diagram showing a control circuit CTL2a;

FIG. 22 is a circuit diagram showing a control circuit CTL5a;

FIG. 24 is a circuit diagram showing a control circuit CTL6a;

FIG. 26 is a circuit diagram showing a control circuit CTL7a;

DESCRIPTION OF THE PREFERRED EMBODIMENTS

Embodiment 1

Figure 1:
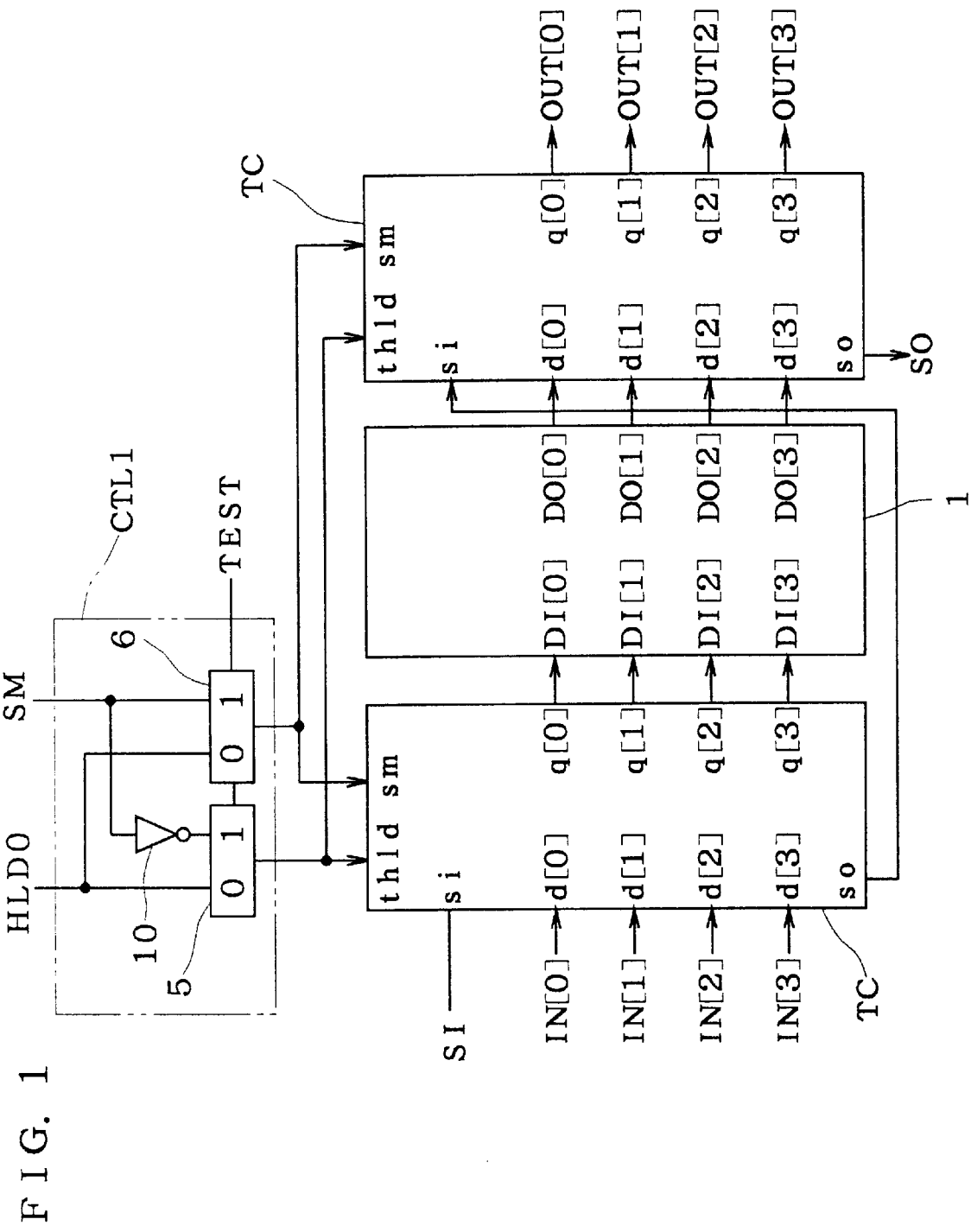
FIG. 1 is a circuit diagram showing a logic circuit provided with a testing circuit consisting of test circuits TC and a control circuit CTL1 according to an embodiment 1 of the present invention.

FIG. 1 is a circuit diagram of a logic circuit which is provided with a control circuit and a testing circuit according to an embodiment 1 of the present invention. Circuits which are identical in structure, function etc. to those shown in the prior art are denoted by the same reference numerals.

As shown in FIG. 1, input/output of a data circuit 1 which is a logic circuit is controlled by test circuits TC, which define the testing circuit.

The data circuit 1 is now described. The data circuit 1 comprises input terminals DI[0] to DI[3] and output terminals DO[0] to DO[3]. The data circuit 1 is a circuit outputting output data DO[0] to DO[3] which are specific to input data DI[0] to DI[3] supplied to the input terminals DI[0] to DI[3] from the output terminals DO[0] to DO[3]. A combinational circuit or a storage circuit such as a RAM can be listed as the data circuit 1.

While the data circuit 1 shown in this embodiment is of four bits, application of the inventive testing circuit is not restricted to such a 4-bit logic circuit, but the testing circuit according to the present invention can be applied to a logic circuit of any bit number. [Numbers] which are added to the data or the terminals express bit numbers of data. As described above, the data inputted in or outputted from the terminals are associated with each other by bit numbers respectively. Therefore, the bit numbers are hereinafter omitted when the data or terminals are generically called or no variation with the bit numbers may be taken into consideration. Also even when the bit numbers are omitted, the respective data correspond to the terminals of the respective bit numbers. In order to clarify the correspondence of every bit in particular, description is made as DI[N]. N represents an arbitrary number among 0, 1, 2 and 3, unless otherwise stated.

The circuits related to input/output of data are now described. The test circuits TC are inserted between the input terminals DI of the data circuit 1 and data input terminals IN, and between the output terminals DO and data output terminals OUT respectively. Each test circuit TC comprises input terminals d[0] to d[3], output terminals q[0] to q[3], a scan-in terminal si, a test holding terminal thld, a shift mode terminal sm and a scan-out terminal so.

The operations of each test circuit TC by a test holding control signal thld and a shift mode control signal sm which are inputted in the test holding terminal thld and the shift mode terminal sm respectively are now described. When the shift mode control signal sm is "0", the test circuit TC incorporates data inputted in the input terminals d, and outputs the same from the output terminals q as such. When the shift mode control signal sm is "1" and the test holding control circuit thld is "0", the test circuit TC incorporates data inputted in the scan-in terminal si and outputs the same from the scan-out terminal so. When the shift mode control signal sm is "1" and the test holding control signal thld is "1", data are held in connection circuits CC which are provided in the test circuit TC as described later.

Figure 2:
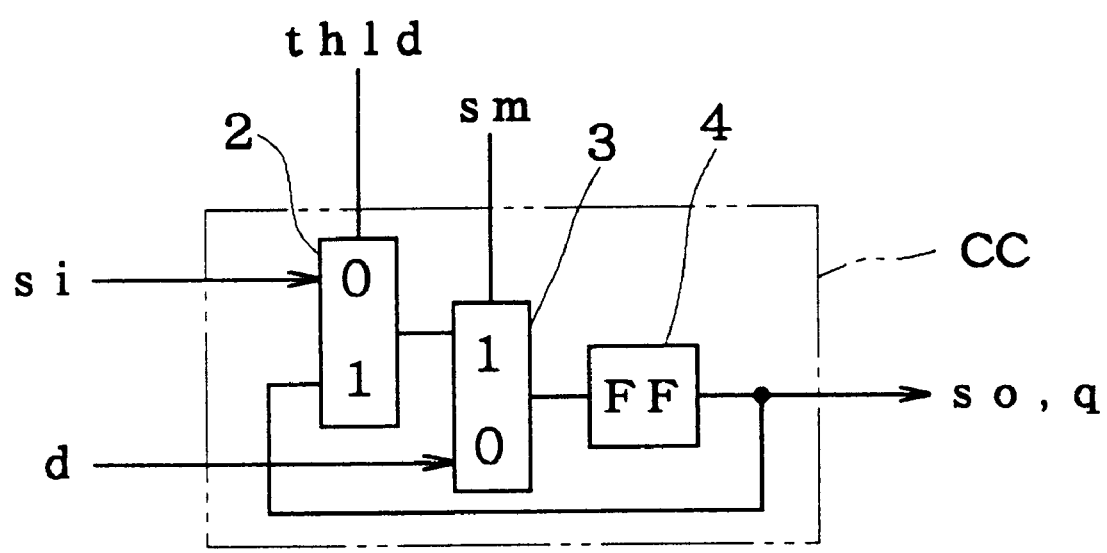
FIG. 2 is a circuit diagram showing each connection circuit CC.

The test circuit TC performing the aforementioned circuit operations is obtained by employing the connection circuits CC. The connection circuit CC is shown in FIG. 2. This connection circuit CC is now described. The connection circuit CC is formed by selectors 2 and 3 and a flip-flop 4. Each of the selectors 2 and 3 has a data input 0 terminal, a data input 1 terminal, an output terminal, and a control terminal. A control signal for switching the selector is inputted in the control terminal of each selector. The data input 0 terminal is selected and connected to the output terminal when the control signal is "0". On the other hand, the data input 1 terminal is selected and connected to the output terminal when the control signal is "1". Thus, data outputted from the selector can be selected by switching the control signal which is inputted in the selector between "1" and "0". The selectors 2 and 3 are switch-controlled by the test holding control signal thld and the shift mode control signal sm respectively. The scan-in terminal si is connected to the data input 0 terminal of the selector 2, while an output terminal of the flip-flop 4 is connected to the data input I terminal thereof. The output terminal of the selector 2 is connected to the data input 1 terminal of the selector 3. Each input terminal d is connected to the data input 0 terminal of the selector 3. The output terminal of the selector 3 is connected to an input terminal of the flip-flop 4. Output data of the flip-flop 4 is inputted in the data input 1 terminal of the selector 2 as described above, and further outputted as scan-out data so or serial input data q of the connection circuit CC. The serial input data is that outputted in an ordinary operation. The flip-flop 4 is a D flip-flop or a flip-flop having a function which is similar to that of the D flip-flop.

The circuit operations of the connection circuit CC are now described. The connection circuit CC is a circuit outputting a signal which is inputted in the input terminal d when the shift mode control signal sm is "0". When the shift mode control signal sm is "1" and the test holding control signal thld is "0", the connection circuit CC outputs the data inputted in the scan-in terminal si. When the shift mode control signal sm is "1" and the test holding control signal thld is "1", the connection circuit CC holds data of the scan flip-flip 4. Such connection circuits CC[0] to CC[3] are inserted and connected between the data input terminals d[0] to d[3] and the output terminals q[0] to q[3] respectively, thereby forming the 4-bit test circuit TC.

Figure 3:
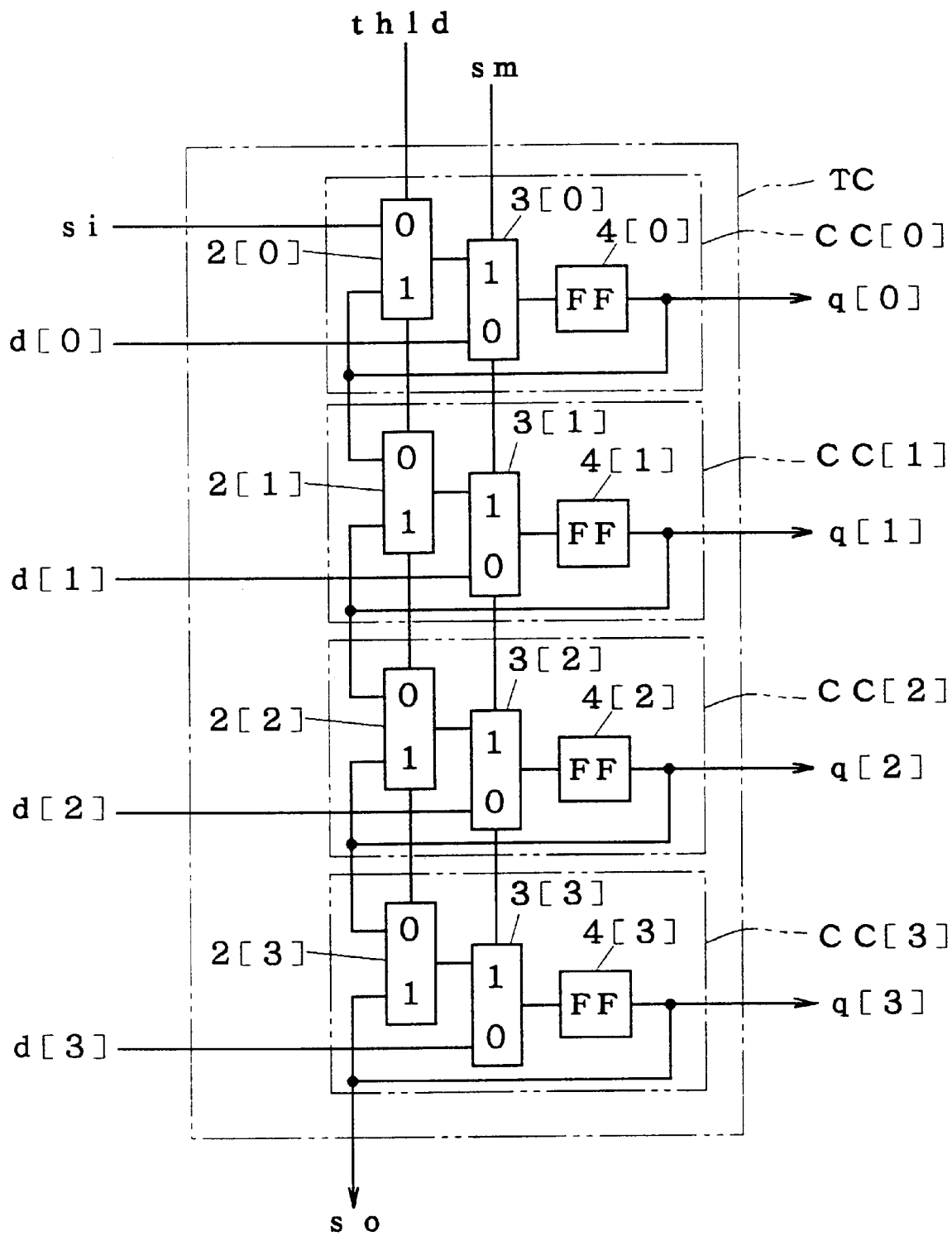
FIG. 3 is a circuit diagram showing each test circuit TC according to the present invention.

FIG. 3 is a circuit diagram showing the structure of each test circuit TC. The connection circuits CC are successively connected with each other to form the test circuit TC. The connection between the connection circuits CC is now described. The data input 0 terminal of the selector 2[0] of the connection circuit CC[0] is connected to the scan-in terminal si of the test circuit TC. As to N=1 to 3, scan-out data so[N-1] of the connection circuit CC[N-1] is inputted in the data input 0 terminal of the selector 2[N] of the connection circuit CC[N]. The output terminal of the flip-flop 4[3] of the connection circuit CC[3] is connected to the scan-out terminal so of the test circuit TC. In addition to the aforementioned connection, the scan-out terminal so[N] of each connection circuit CC[N] also forms the output terminal q[N] of the test circuit TC.

The circuit including the data circuit 1 and a scan path according to this embodiment is now described with reference to FIG. 1.

First, description is made on connection between the data input terminals IN, the data output terminals OUT, the data circuit 1 and the test circuits TC which are necessary for the ordinary operation. On the input side of the data circuit 1, the input terminals d[N] and the output terminals q[N] of the test circuit TC are connected with the data input terminals IN[N] and the input terminals DI[N] of the data circuit 1 respectively. Also on the output side, the input terminals d[N] and the output terminals q[N] of the test circuit TC are connected with the output terminals DO[N] of the data circuit 1 and the data output terminals OUT[N] respectively.

Scan-in terminals SI and si and scan-out terminals SO and so which are employed in case of making a scan test are now described. The scan-in terminal SI is connected to the scan-in terminal si of the input side test circuit TC. The scan-out terminal so of the input side test circuit TC is connected to the scan-in terminal si of the output side test circuit TC. The scan-out terminal so of the output side test circuit TC is connected to the scan-out terminal SO which is the final output terminal of the scan path.

A control circuit CTL1 according to this embodiment, which supplies the test holding control signal thld and the shift mode control signal sm to the test circuits TC, is now described. The control circuit CTL1 is supplied with a test control signal TEST, a shift mode control signal SM and a holding control signal HLD0, and outputs the test holding control signal thld and the shift mode control signal sm to the test circuits TC.

When the test control signal TEST is "0", the control circuit CTL1 outputs the holding control signal HLD0 as the test holding control signal thld and the shift mode control signal sm. When the test control signal TEST is "1", on the other hand, the control circuit CTL1 outputs a logically inverted signal of the shift mode control signal SM as the test holding control signal thld while outputting the shift mode control signal SM as the shift mode control signal sm. The logically inverted signal is now described. The logically inverted signal is "1" when the input signal is "0", and vice versa.

Connection of the control circuit CTL1 is described. The control circuit CTL1 is formed by selectors 5 and 6 and an invertor 10. Each of the selectors 5 and 6 has a data input 0 terminal, a data input 1 terminal, an output terminal, and a control terminal. The test control signal TEST for simultaneously switching the selectors 5 and 6 is inputted in the control terminals of the selectors 5 and 6. Each data input 0 terminal is selected and connected to the output terminal when the test control signal TEST is "0". On the other hand, each data input 1 terminal is selected and connected to the output terminal when the test control signal TEST is "1". Therefore, data outputted from the selectors 5 and 6 respectively can be selected by switching the test control signal TEST which is inputted in the selectors 5 and 6 between "1" and "0". A holding terminal HLD0 is connected to the respective data input 0 terminals of the selectors 5 and 6 in common. A shift mode terminal SM is connected to the data input 1 terminal of the selector 5 through the invertor 10, while being connected to the data input 1 terminal of the selector 6 through no means. The output terminal of the selector 5 is connected to the test holding terminals thld of the test circuits TC. The output terminal of the selector 6 is connected to the shift mode terminals sm of the test circuits TC.

The circuit operations of the circuit shown in FIG. 1 are summarized as follows: The circuit operations include the ordinary operation and the scan test operation. Table 1 shows optimum set values of the respective signals and data in the ordinary operation and the scan test. Referring to Table 1, symbol DC indicates "don't care", which means that the signals or the data are not related to the operations.

TABLE 1

|  | Ordinary Operation | | Scan Test | | |
| --- | --- | --- | --- | --- | --- |
|  | Input/Output Synchronization | Hold | Data Input | Execution | Data Output |
| TEST | 0 |  | 1 | 1 | 1 |
| SM | 0 |  | 1 | 0 | 1 |
| HLD0 | 0 | 1 | DC | 1/0 | DC |
| SI | DC |  | 1/0 | DC | 1/0 |

The ordinary operation is first described. In the ordinary operation, the test control signal TEST is set at "0". The selectors 5 and 6 output data inputted in the data input 0 terminals when the test control signal TEST is "0", and hence the holding control signal HLD0 is supplied to the input and output side test circuits TC as the test holding control signal thld and the shift mode control signal sm. If the holding control signal HLD0 is "0" at this time, input data IN are incorporated in the input terminals DI of the data circuit 1 on the input side through the input side connection circuits CC. Similarly, output data DO are incorporated in the output terminals OUT of the data circuit 1 on the output side through the output side connection circuits CC. If the holding control signal HLD0 is "1", on the other hand, the input data IN and output data DO are held in the connection circuits CC respectively.

The scan test operation is now described. In the scan test, shift-in of test patterns, execution and shift-out of test results are successively performed. In the scan test, the test control signal TEST is set at "1". When the test control signal TEST is "1", the inverted logic of the shift mode control signal SM and the shift mode control signal SM are supplied to the input and output side test circuits TC as the test holding control signal thld and the shift mode control signal sm respectively.

1. Shift-In of Test Patterns

In preparation for inputting of test patterns in the data circuit 1, the test patterns are shifted in the input side connection circuits CC. When the shift mode control signal SM is set at "1", the test patterns to be inputted in the data circuit 1 can be shifted in from the scan-in terminal SI. The data circuit 1 of this embodiment is of four bits, and hence 4-bit test patterns are shifted in. The test patterns are shifted in the input side connection circuits in the order of CC[0] →CC[1]→CC[2]→CC[3], to be inputted therein. The input and output side test circuits TC are simultaneously controlled by the shift mode control signal SM, whereby data shifting takes place also in the output side connection circuits CC[0] to CC[3].

2. Execution

The shift mode control signal SM is set at "0". At this time, the input data IN are incorporated in the input terminals DI through the respective connection circuits CC on the input side, and output data DO which are the test results of the data circuit 1 are outputted from the data output terminals OUT on the output side.

3. Shift-Out of Test Results

The shift mode control signal SM is set at "1". At this time, the test results are successively shifted out from the scan-out terminal SO.

The above are the circuit operations of the circuit shown in FIG. 1. Also when the data input 0 terminals and the data input I terminals of the selectors 2 and 3 shown in FIG. 2 are replaced with each other and "0" and "1" of the test holding control signal thld and the shift mode control signal sm inputted in the respective control terminals of the selectors 2 and 3 are replaced with each other, the circuit operations of the testing circuit according to the present invention remain unchanged.

Figure 4:
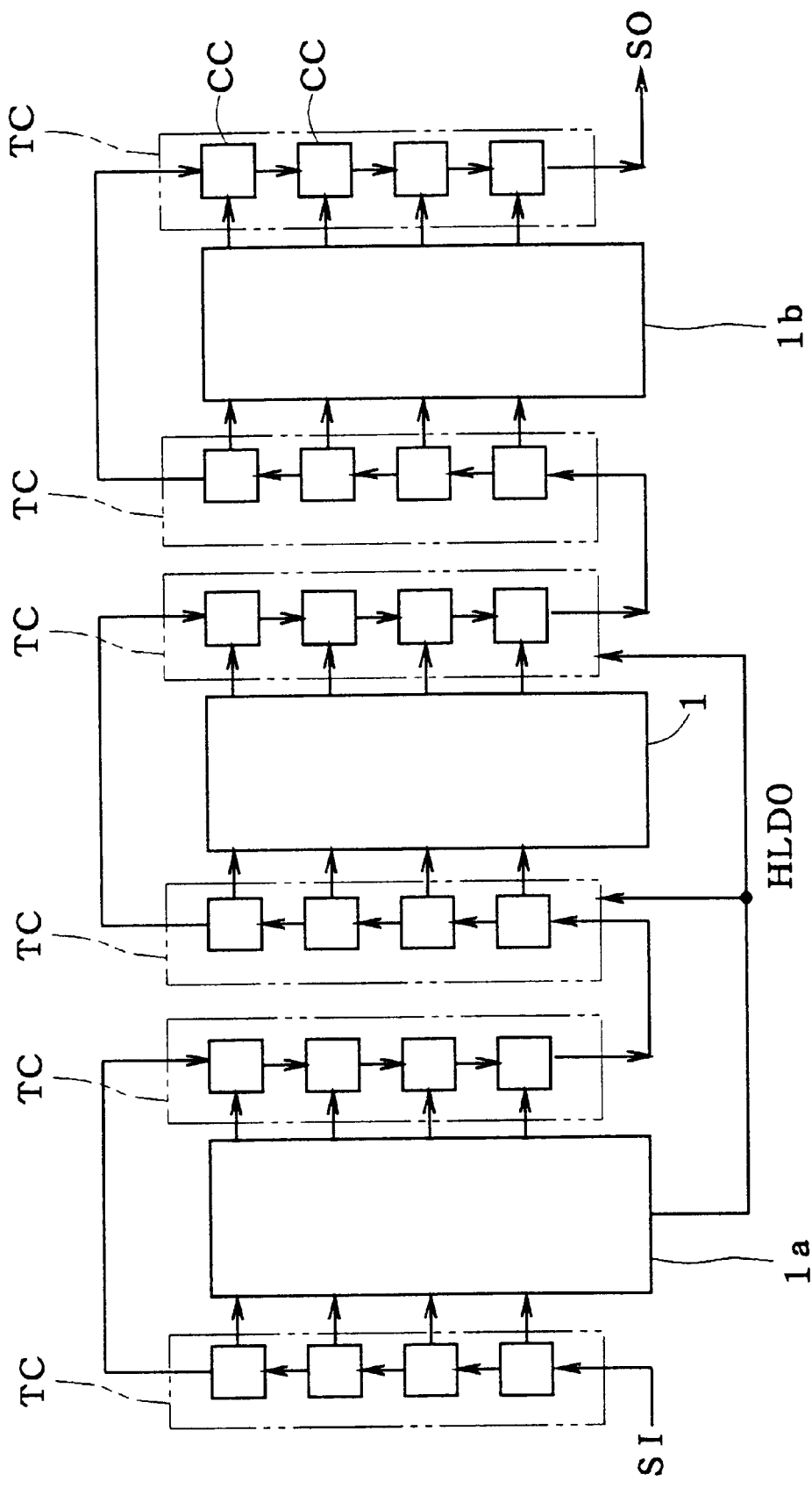
FIG. 4 is a circuit diagram showing a plurality of logic circuits provided with a scan path consisting of test circuits TC.

When the control circuit CTL1 shown in FIG. 1 is employed, the following advantages are attained:

FIG. 4 is a circuit diagram showing a circuit forming a scan path by providing test circuits TC on input and output sides of data circuits 1, 1a and 1b respectively. The data circuits 1a and 1b are logic circuits, while the data circuit 1 is controlled by a control circuit CTL1 (not shown). A holding control signal HLD0 which is inputted in the test circuits TC on the input and output sides of the data circuit 1 is outputted from the data circuit 1a.

The data circuits 1a, 1 and 1b are successively lined up, and the scan path is formed as a scan-in terminal SI→the test circuit TC on the input side of the data circuit 1a→the test circuit TC on the output side of the data circuit 1a→the test circuit TC on the input side of the data circuit 1→the test circuit TC on the output side of the data circuit 1→the test circuit TC on the input side of the data circuit 1b→the test circuit TC on the output side of the data circuit 1b.

In the circuit shown in FIG. 4, as described above, the holding control signal HLD0 is supplied from the data circuit 1a to the test circuits TC provided on the input and output sides of the data circuit 1 respectively. The control circuit CTL1 controls which one of the holding control signal HLD0 and a shift mode terminal SM is selected by a test control signal TEST. Therefore, a scan test of the data circuit 1 can be made independently of the holding control signal HLD0 which is supplied from the data circuit 1a by controlling the test circuits TC provided on the input and output sides of the data circuit 1 by the control circuit CTL1, whereby formation of the test patterns is simplified.

Figure 5:
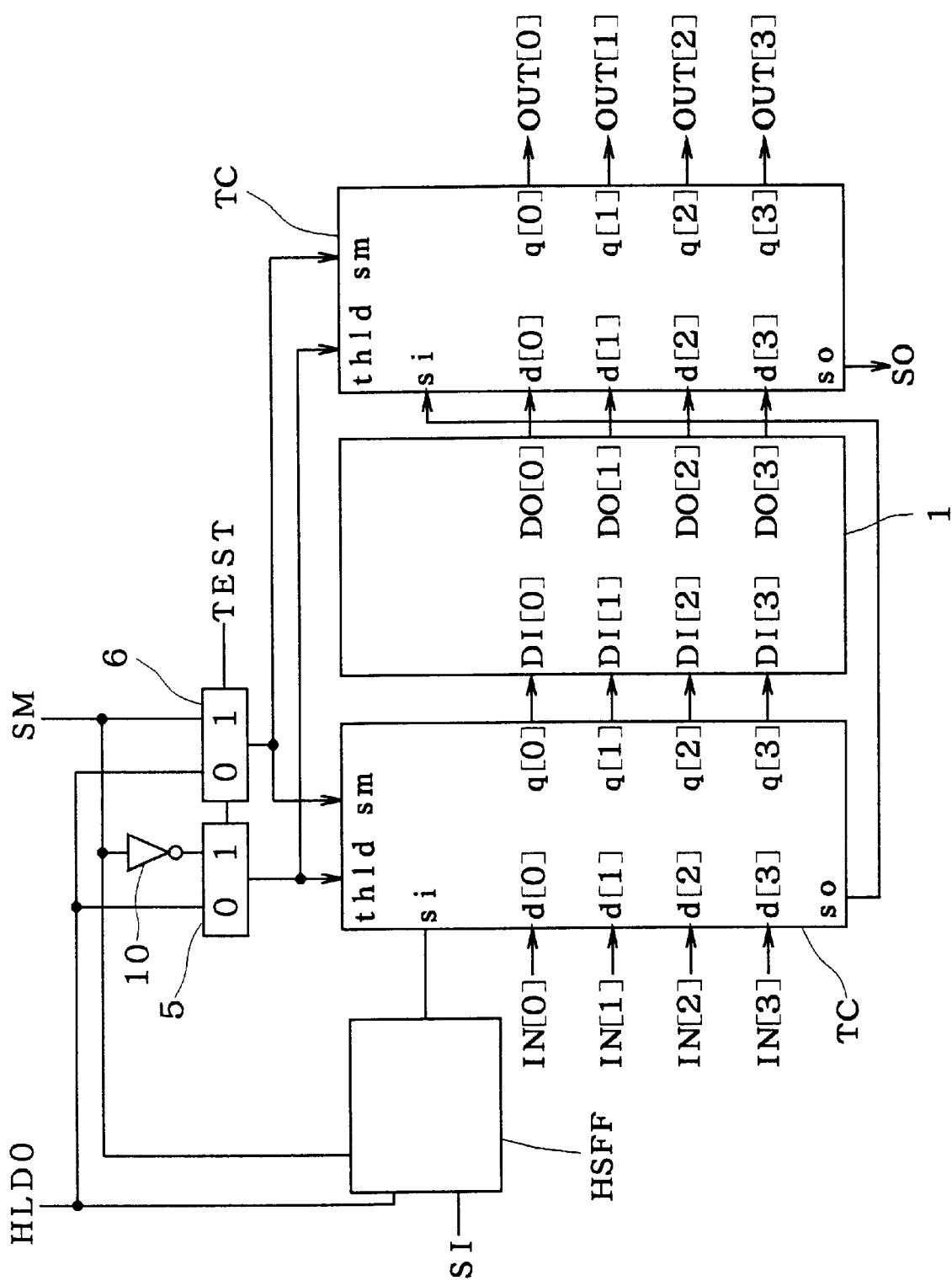
FIG. 5 is a circuit diagram showing a circuit comprising a scan flip-flip HSFF.

As shown in FIG. 5, it is also possible to connect a scan-in terminal SI to a scan-in terminal si of an input side test circuit TC through a scan flip-flop HSFF.

Figure 6:
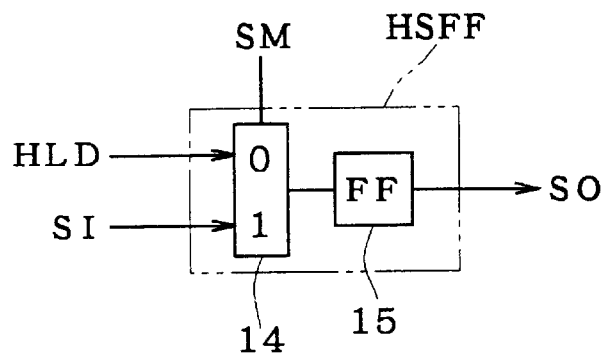
FIG. 6 is a circuit diagram showing the scan flip-flop HSFF according to the present invention.

FIG. 6 is a circuit diagram showing the scan flip-flop HSFF. The scan flip-flop HSFF is a circuit consisting of a selector 14 and a flip-flop 15. This scan flip-flop 15 is provided for confirming a holding control signal HLD which is inputted in the control circuit controlling test circuits TC. The holding control signal HLD is a signal including the holding control signal HLD0. The selector 14 has a data input 0 terminal, a data input 1 terminal, an output terminal, and a control terminal. The shift mode control signal SM for switching the selector 14 is inputted in the control terminal. The data input 0 terminal is selected and connected to the output terminal when the shift mode control signal SM is "0". On the other hand, the data input 1 terminal is selected and connected to the output terminal when the shift mode control signal SM is "1". Therefore, the data outputted from the selector 14 can be selected by switching the shift mode control signal SM which is inputted in the selector 14 between "1" and "0". The scan-in terminal SI is connected to the data input 1 terminal of the selector 14, while a holding terminal HLD is connected to the data input 0 terminal. The output terminal of the selector 14 is connected to an input terminal of the flip-flop 15. An output terminal of the flip-flop 15 defines a scan-out terminal SO of the scan flip-flop HSFF. The flip-flop 15 is a D flip-flop or a flip-flop having a function which is similar to that of the D flip-flop.

The holding control signal HLD is inputted in the control circuit. The holding control signal HLD which is inputted in the control circuit is adapted to control the test circuits TC, i.e., to switch connection of the selectors 2 included in the test circuits TC in more detail, and hence the holding control signal HLD itself is not outputted from the test circuits 1 or the scan path as output data. When no scan flip-flop HSFF is provided, therefore, it is difficult to directly observe the holding control signal HLD. When the holding control signal HLD takes no desired logic, the test circuits TC controlled by the holding control signal HLD perform no desired operations, and it is impossible to rely upon an operation test of the logic circuit. Therefore, the holding control signal HLD must be directly observed. The holding control signal HLD can be directly observed by employing the scan flip-flop HSFF.

It is possible to make the flip-flop 15 store the value of the holding control signal HLD by inputting the holding control signal HLD in the data input 0 terminal of the scan flip-flop HSFF and setting the shift mode control signal SM at "0". As hereinabove described, the selector 14 is controlled by the shift mode control signal SM. However, it is also possible to newly provide a control terminal which is not related to control of the test circuits TC, for controlling the selector 14 by a control signal outputted from this control terminal.

A method of observing the value which is stored in the flip-flop 15 of the scan flip-flop HSFF is described. Referring to FIG. 5, the holding control signal HLD which is inputted in the data input 0 terminal of the selector 14 of the scan flip-flop HSFF is the holding control signal HLD0. In the structure shown in FIG. 5, data held in the scan flip-flop HFSS is inputted in the scan-in terminal si of the input side test circuit TC, whereby the holding control signal HLD0 can be observed after it is taken out from the scan path as the scan-out data SO.

While the scan flip-flop HSFF is inserted between the scan-in terminal SI and the scan-in terminal si of the input side test circuit TC in FIG. 5, the same function is attained also when the scan flip-flop HSFF is inserted between the scan-out terminal so of the input side test circuit TC and the scan-in terminal si of the output side test circuit TC, to enable observation of the holding control signal HLD. Further, the same function is attained also when the flip-flop HSFF is inserted between the scan-out terminal of the output side test circuit TC and the scan-out terminal SO.

As obvious from the above description, the scan flip-flop HSFF is not directly required for the operation test of the data circuit 1. Illustration and description of the scan flip-flop HSFF are hereafter omitted in relation to this embodiment and other embodiments, unless required in particular.

Figure 7:
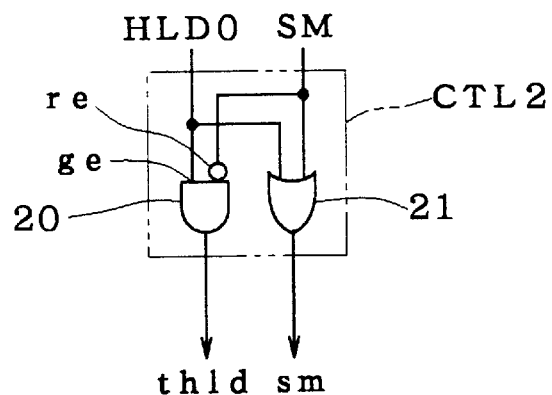
FIG. 7 is a circuit diagram showing a control circuit CTL2.

Another control circuit according to this embodiment is now described. FIG. 7 is a circuit diagram showing a control circuit CTL2 which is employed in place of the control circuit CTL1 shown in FIG. 1.

The control circuit CTL2 is now described. The control circuit CTL2 is a circuit which is supplied with a shift mode control signal SM and a holding control signal HLD0, and outputs a test holding control signal thld and a shift mode control signal sm to the test circuits TC.

When the shift mode control signal SM is "0", the control circuit CTL2 outputs the holding control signal HLD0 as the test holding control signal thld and the shift mode control signal sm. When the shift mode control signal SM is "1", on the other hand, the control circuit CTL2 outputs "0" and "1" as the test holding control signal thld and the shift mode control signal sm respectively.

The structure of the control circuit CTL2 is described with reference to FIG. 7. The control circuit CTL2 can be formed by two gates. Each gate has two input terminals and one output terminal. One gate is a gate 20, and another gate is an OR gate 21. The gate 20 executes the AND operation of an inverted logic of an input signal re which is inputted in an inversion input terminal re and an input signal ge which is inputted in an input terminal ge. The OR gate 21 executes the OR operation of two input signals which are inputted therein.

The state of connection of the control circuit CTL2 is described. The holding terminal HLD0 is connected to the input terminal ge of the gate 20 and the first input terminal of the OR gate 21 in common. The shift mode terminal SM is connected to the inversion input terminal re of the gate 20 and the second input terminal of the OR gate 21 in common. The output terminals of the gate 20 and the OR gate 21 output the test holding control signal thld and the shift mode control signal sm to the test circuits TC respectively. The control circuit CTL2 is different from the control circuit CTL1 in a point that the former has no test terminal TEST.

Circuit operations of the control circuit shown in FIG. 7 are summarized as follows: The circuit operations include control of an ordinary operation and control of a scan test operation. Table 2 shows optimum set values of the respective signals and data related to the control circuit CTL2 in the ordinary operation and the scan test.

TABLE 2

|  | Ordinary Operation | | Scan Test | | |
| --- | --- | --- | --- | --- | --- |
|  | Input/Output Synchronization | Hold | Data Input | Execution | Data Output |
| SM | 0 |  | 1 | 0 | 1 |
| HLD0 | 0 | 1 | DC | 1/0 | DC |
| SI |  | DC | 1/0 | DC | 1/0 |

The ordinary operation is now described. In the ordinary operation, the shift mode control signal SM is set at "0". When the shift mode control signal SM is "0", the gate 20 and the OR gate 21 supply the logic of the holding control signal HLD0 to the input and output side test circuits TC as the test holding control signal thld and the shift mode control signal sm. When the holding control signal HLD0 is "0", the input data IN are incorporated in the input terminals DI of the data circuit 1 on the input side through the input side connection circuits CC. On the output side, the output data DO are outputted from the data output terminals OUT through the output side connection circuits CC. When the holding control signal HLD0 is "1", on the other hand, the input data IN and the output data DO are held in the connection circuits CC respectively.

The scan test operation is now described. In the scan test, shift-in of test patterns, execution and shift-out of test results are successively performed.

1. Shift-in of Test Patterns

When the shift mode control signal SM is set at "1", the test patterns to be inputted in the data circuit 1 can be shifted in from the scan-in terminal SI.

2. Execution

The shift mode control signal SM is set at "0". Since the shift mode control signal SM is "0", the circuit operation is equal to the ordinary operation. At this time, the input data IN are incorporated in the input terminals DI through the respective connection circuits CC on the input or output side, and output data DO which are the test results of the data circuit 1 are outputted from the data output terminals OUT.

3. Shift-Out of Test Results

The shift mode control signal SM is set at "1". At this time, the test results are successively shifted out from the scan-out terminal SO.

The above are the circuit operations of the circuit shown in FIG. 7.

The same circuit operations are attained also when the control circuit CTL2 shown in FIG. 7 is replaced with a control circuit CTL2a shown in FIG. 9. The control circuit CTL2a is now described. Similarly to the control circuit CTL2, the control circuit CTL2a is a circuit which is supplied with the shift mode control signal SM and the holding control signal HLD0, and outputs the test holding control signal thld and the shift mode control signal sm to the test circuits TC.

When the shift mode control signal SM is "0", the control circuit CTL2a outputs the holding control signal HLD0 as the test holding control signal thld and the shift mode control signal sm. When the test mode control signal is "1", the test circuit CTL2a outputs "0" and "1" as the test holding control signal thld and the shift mode control signal sm respectively.

The structure of the control circuit CTL2a is described with reference to FIG. 9. The control circuit CTL2a can be formed by two gates. Each gate has two input terminals and one output terminal. One gate is a gate 20a, and another gate is an OR gate 21a. The gate 20a and the OR gate 21a are identical in structure and function to the gate 20 and the OR gate 21 respectively.

The state of connection of the control circuit CTL2a is described. The holding terminal HLD0 is connected to an input terminal ge of the gate 20a. The shift mode terminal SM is connected to an inversion input terminal re of the gate 20a and a first input terminal of the OR gate 21a in common. The output terminal of the gate 20a is connected to the test holding terminals thld of the test circuits TC and a second input terminal of the gate 21a in common. The output terminal of the OR gate 21a is connected to the shift mode terminals sm of the test circuits TC.

Figure 8:
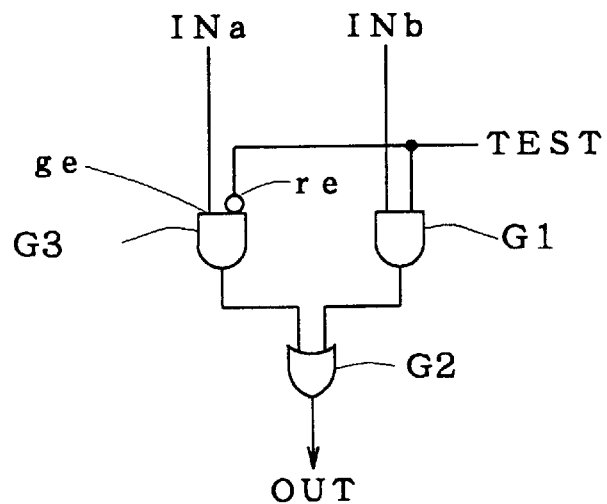
FIG. 8 is a circuit diagram showing the structure of a two-input selector.

When the control circuit CTL2 or CTL2a receiving no test control signal TEST is employed, it is impossible to make the scan test of the data circuit 1 independently of the holding control signal HLD0 which is supplied from the data circuit 1a in the circuit shown in FIG. 4. However, the control circuit CTL1 employs two selectors, i.e., the selectors 5 and 6. A two-input selector is formed by three gates, as shown in FIG. 8. The three gates are formed by an AND gate G1, an OR gate G2, and a gate G3 having an inversion input terminal re and an input terminal ge. Therefore, the circuit area is reduced by replacing the selectors 5 and 6 with two gates, i.e., the gate 20 and the OR gate 21.

Embodiment 2

An embodiment 2 of the present invention shows a testing circuit for a logic circuit to which a function of holding and compressing test results is added. This embodiment further shows a control circuit which enables holding of data in an operation test of the logic circuit. This embodiment additionally shows a testing circuit which controls an input side test circuit and an output side test circuit independently of each other.

Figure 10:
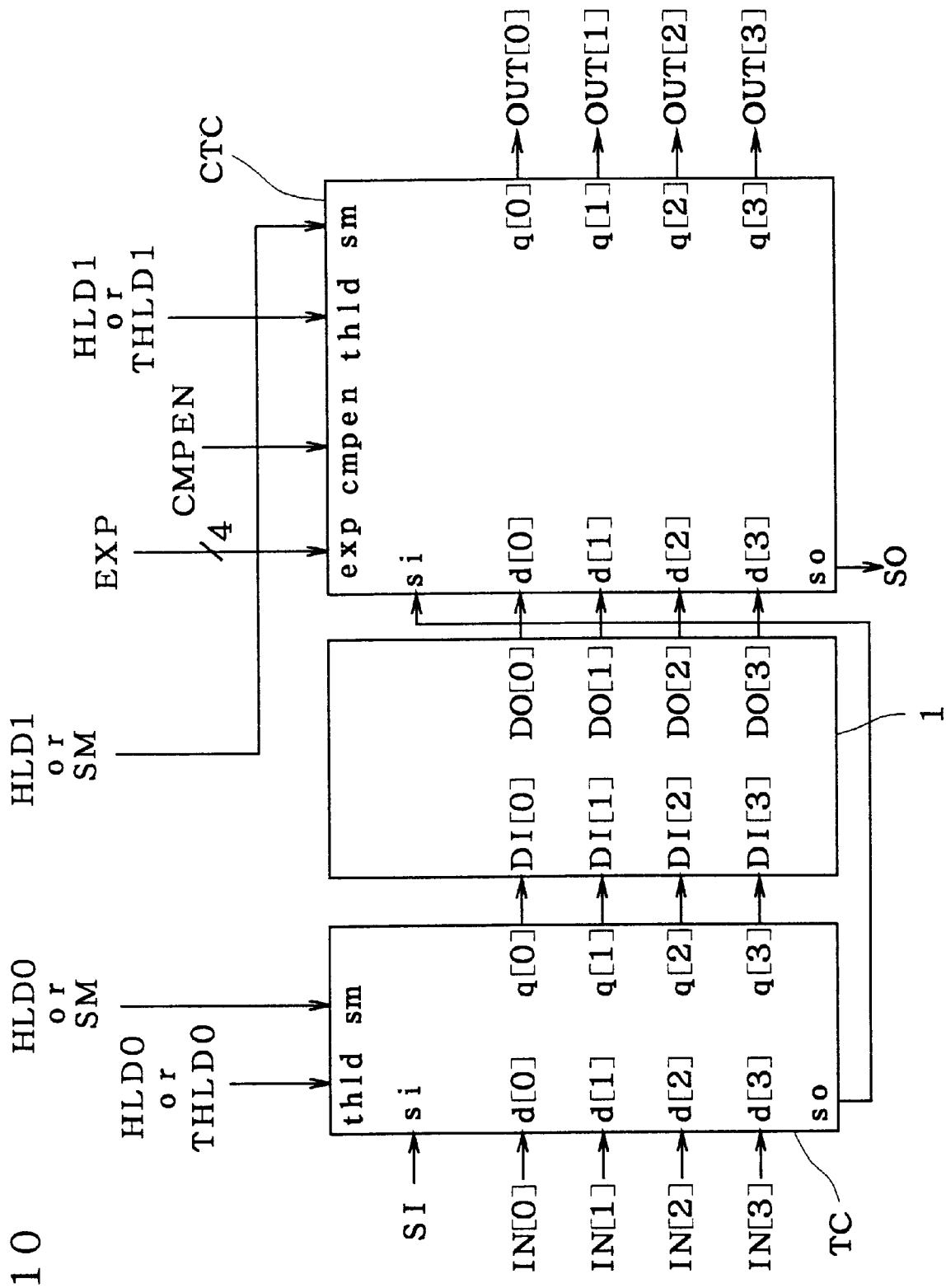
FIG. 10 is a circuit diagram showing a logic circuit comprising a testing circuit including a test circuit CTC according to an embodiment 2 of the present invention.

FIG. 10 is a circuit diagram showing a logic circuit and a testing circuit according to this embodiment. Components having the same structures and functions as the circuits etc. shown in the embodiment 1 are denoted by the same reference numerals, to omit redundant description.

As shown in FIG. 10, input control of a data circuit 1 is performed by a test circuit TC, and output control is performed by a test circuit CTC.

The test circuit CTC is now described. The test circuit CTC is inserted between data output terminals OUT and output terminals DO of the data circuit 1. The test circuit CTC comprises input terminals d[0] to d[3], output terminals q[0] to q[3], a scan-in terminal si, a test holding terminal thld, a shift mode terminal sm and a scan-out terminal so similarly to the test circuit TC, and further comprises an expected data terminal exp and a comparison terminal cmpen. The test circuit CTC has a function of comparing data DO actually outputted from the data circuit 1 in reply to test patterns with expected data EXP, and further has a function of holding the comparison results and compressing test results. The expected data EXP are output data patterns which are specifically outputted from the normally operating data circuit 1 in reply to the test patterns inputted therein. The expected data EXP are inputted in the expected data terminal exp.

Compression of the test results is now described. Before starting the test, the test circuit CTC is so set that "0" is not held therein. When no single determination is made in the test circuit CTC on mismatching of compared data, "0" is not held in the test circuit CTC. When single determination is made on mismatching of the compared data in the test circuit CTC, "0" is held in the test circuit CTC. Once "0" is held, "0" is continuously held. This is the compression of the test results.

A compression test expresses a test utilizing compression of the test results. If it is confirmed that "0" is not held in the test circuit CTC after completion of the test, it is observed that the data circuit 1 outputs data which are identical to all expected output data, and it is confirmed that the data circuit 1 has normally operated. If it is confirmed that "0" is held in the test circuit CTC, it is observed that the data circuit 1 has outputted data which is different from the expected output data at least once, and it is confirmed that the data circuit 1 has not normally operated. Therefore, it is not necessary to observe the test results every time the test patterns are inputted in the data circuit 1. It is possible to make an operation test of the data circuit 1 only by successively inputting a plurality of test patterns in the data circuit 1 while simultaneously compressing test results in the test circuit CTC and observing the compressed test results after completion of the compression test.

Operations of the test circuit CTC by a test holding control signal thld, a shift mode control signal sm, a comparison enable signal CMPEN and the expected data EXP which are inputted in the test holding terminal thld, the shift mode terminal sm, the comparison terminal cmpen and the expected data terminal exp respectively are now described.

The test circuit CTC is a circuit having a function of comparing the expected data EXP and input data d with each other. When the shift mode control signal sm is "0", the test circuit CTC incorporates data inputted in the input terminals d, and outputs the same from the output terminals q as such. When the shift mode control signal sm is "1" and the test holding control signal thld is "0", the test circuit CTC incorporates data from the scan-in terminal si and outputs the data from the scan-out terminal so. When the shift mode control signal sm is "1", the test holding control signal thld is "1" and the comparison enable signal CMPEN is "0", the test circuit CTC holds compressed test results. When the shift mode control signal sm is "1", the test holding control signal thld is "1" and the comparison enable signal CMPEN is "1", the test circuit CTC compresses and holds the comparison results of the inputted expected data EXP and the input data d.

Figure 11:
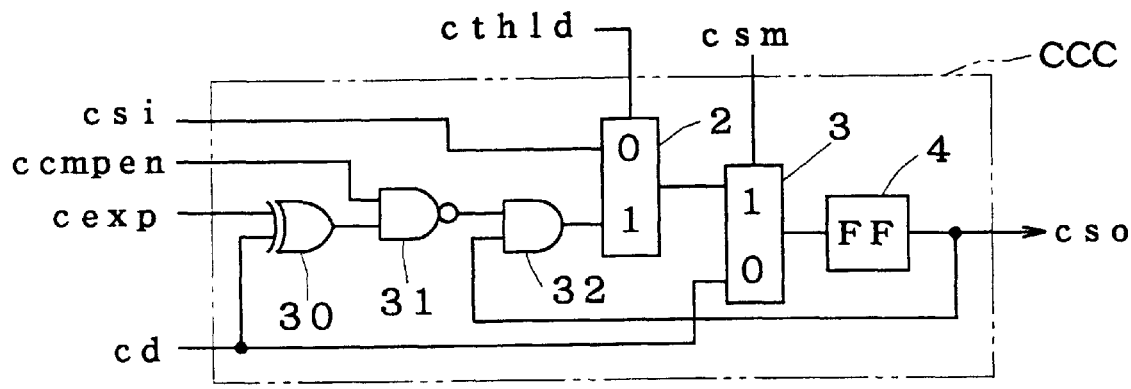
FIG. 11 is a circuit diagram showing each connection circuit CCC.

The test circuit CTC performing the aforementioned operations is obtained by employing connection circuits CCC, each of which is shown in FIG. 11. The connection circuit CCC is now described. The connection circuit CCC comprises an input terminal cd, a scan-in terminal csi, a test holding terminal cthld, a shift mode terminal csm, a scan-out terminal cso, an expected data terminal cexp and a comparison terminal ccmpen. The connection circuit CCC is formed by selectors 2 and 3, a flip-flop 4, an Ex-OR gate 30, a NAND gate 31, and an AND gate 32.

Each of the selectors 2 and 3 has a data input 0 terminal, a data input 1 terminal, an output terminal, and a control terminal. The selectors 2 and 3 are switch-controlled by a test holding control signal cthld and a shift mode control signal csm respectively. The input terminal cd is connected to a first input terminal of the Ex-OR gate 30 and the data input 0 terminal of the selector 3 in common. The expected data terminal cexp is connected to a second input terminal of the Ex-OR gate 30. An output terminal of the Ex-OR gate 30 is connected to a first input terminal of the NAND gate 31, while the comparison terminal ccmpen is connected to a second input terminal of the NAND gate 31. An output terminal of the NAND gate 31 is connected to a first input terminal of the AND gate 32, while an output terminal of the flip-flop 4 is connected to a second input terminal of the AND gate 32. An output terminal of the AND gate 32 is connected to the data input 1 terminal of the selector 2, while the scan-in terminal csi is connected to the data input 0 terminal of the selector 2. The output terminal of the selector 2 is connected to the data input I terminal of the selector 3, while the input terminal cd is connected to the data input 0 terminal of the selector 3 as described above. The output terminal of the selector 3 is connected to an input terminal of the flip-flop 4. Output data of the flip-flop 4 is inputted in the second input terminal of the AND gate 32 as described above, as well as to the scan-out terminal cso of the connection circuit CCC.

Circuit operations of the connection circuit CCC are now described.

1. When the shift mode control signal csm is "0", the connection circuit CCC outputs a signal which is inputted in the input terminal cd through the selector 3 and the flip-flop 4.

2. When the shift mode control signal csm is "1" and the test holding control signal cthld is "0", the connection circuit CCC outputs data which is inputted in the scan-in terminal csi from the scan-out terminal cso through the selectors 2 and 3 and the flip-flop 4.

3. A circuit operation which is performed when the shift mode control signal csm is "1" and the test holding control signal cthld is "1" is hereafter described.

When the comparison enable signal ccmpen inputted from the comparison terminal ccmpen is "0", the NAND gate 31 outputs "1" to the AND gate 32 regardless of output data from the Ex-OR gate 30. At this time, the gate 32 outputs output data of the flip-flop 4 to the flip-flop 4 through the selectors 2 and 3. Therefore, the connection circuit CCC keeps holding the data of the flip-flop 4.

When the comparison enable signal ccmpen inputted from the comparison terminal ccmpen is "1", the NAND gate 31 outputs an inverted logic of output data of the Ex-OR gate 30. The Ex-OR gate 30 outputs "0" when the expected data exp and the input data cd match with each other, while outputting "1" when these data mismatch with each other. When the expected data exp and the input data cd match with each other in the Ex-OR gate 30, therefore, the NAND gate 31 outputs "1" to the AND gate 32. At this time, the AND gate 32 outputs output data of the flip-flop 4 to the flip-flop 4 through the selectors 2 and 3. Therefore, the connection circuit CCC keeps holding the data of the flip-flop 4. When the expected data exp and the input data cd mismatch with each other in the Ex-OR gate 30, the NAND gate 31 outputs "0" to the AND gate 32. At this time, the AND gate 32 outputs "0" to the flip-flop 4 through the selectors 2 and 3, and the flip-flop 4 outputs "0" to the AND gate 32. Thus continued is such a state that "0" is held in the AND gate 32, the selectors 2 and 3 and the flip-flop 4.

The aforementioned circuit operations of the test circuit CTC are obtained by employing such connection circuits CCC.

Figure 13:
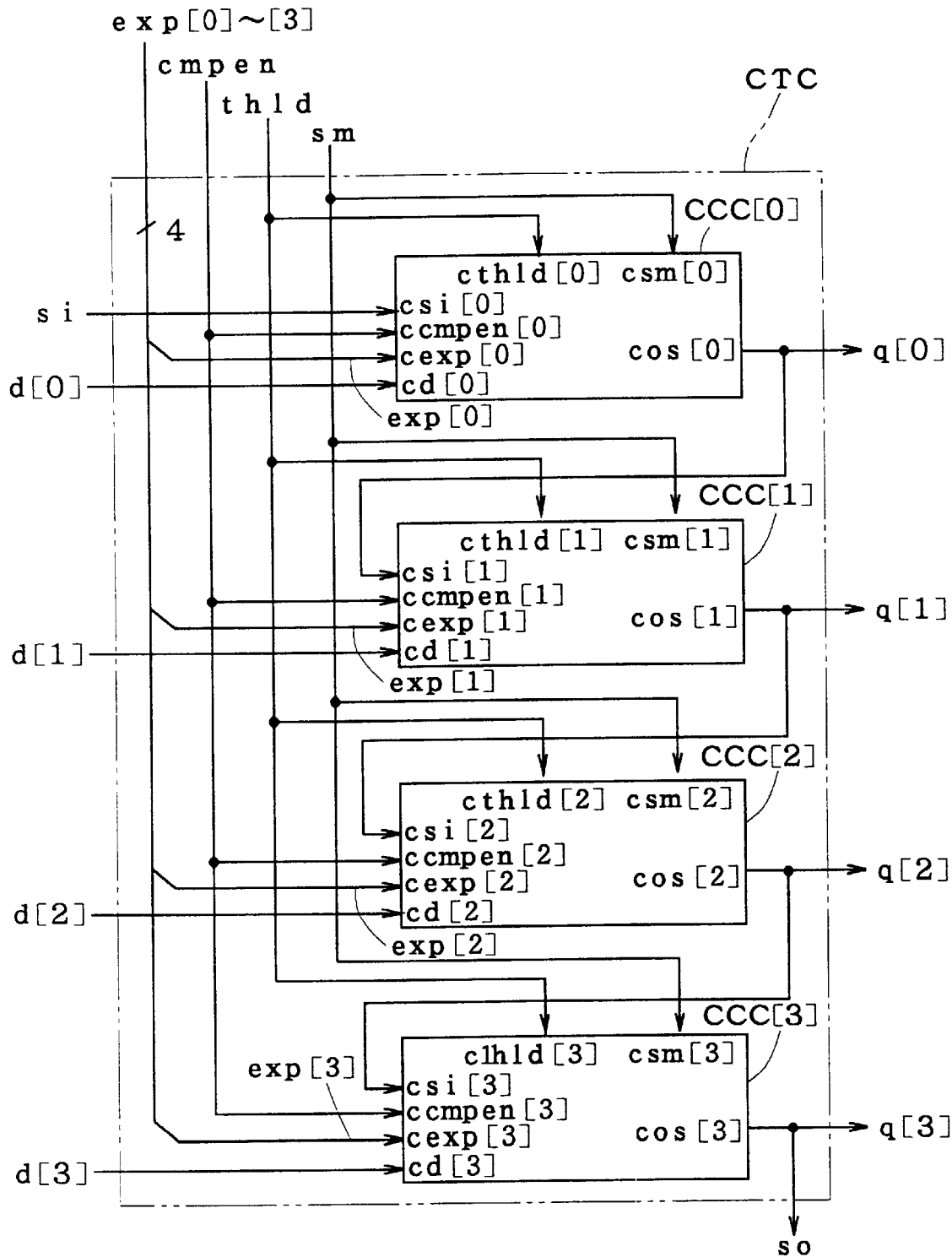
FIG. 13 is a circuit diagram showing the test circuit CTC formed by connection circuits CCC.

Connection circuits CCC[0] to CCC[3] are inserted and connected between the data input terminals d[0] to d[3] and the output terminals q[0] to q[3] respectively for forming the 4-bit test circuit CTC. FIG. 13 shows the test circuit CTC.

The structure of the test circuit CTC is described in detail as follows: The input terminals cd[N], the test holding terminals cthld[N], the shift mode terminals csm[N], the scan-out terminals cso[N], the expected data terminals cexp[N] and the comparison terminals compen[N] of the connection circuits CCC[N] are connected to the input terminals d[N], the test holding terminal thld, the shift mode terminal sm, the output terminals q[N], the expected data terminal exp and the comparison terminal cmpen of the test circuit CTC respectively. Further, the scan-out terminals cso[N] of the connection circuits CCC[N] are connected to the scan-in terminals csi[N+1] of the connection circuits CCC[N+1] respectively. When N=3, the scan-out terminal csi[3] of the connection circuit CCC[3] is connected to the scan-out terminal so of the test circuit CTC. On the other hand, the scan-in terminal csi[0] of the connection circuit CCC[0] is connected to the scan-in terminal si of the test circuit CTC.

The circuit including the logic circuit and the testing circuit according to this embodiment is described with reference to FIG. 10.

Connection between the data input terminals IN, the data output terminals OUT, the data circuit 1 and the test circuits TC and CTC, which is necessary for an ordinary operation, is now described. On the input side of the data circuit 1, the input terminals d[N] and the output terminals q[N] of the test circuit TC are connected with the data input terminals IN[N] and the input terminals DI[N] of the data circuit 1 respectively. Also on the output side, the input terminals d[N] and the output terminals q[N] of the test circuit CTC are connected with the output terminals DO[N] of the data circuit 1 and the output terminals OUT[N] respectively.

Description is now made on connection of the scan-in terminal SI and the respective scan-in terminals si of the test circuits TC and CTC as well as the scan-out terminal SO and the respective scan-out terminals so of the test circuits TC and CTC employed for performing a scan test. The scan-in terminal SI is connected to the scan-in terminal si of the test circuit TC. The scan-out terminal so of the test circuit TC is connected to the scan-in terminal si of the test circuit CTC. The scan-out terminal so of the test circuit CTC is connected to the scan-out terminal SO which is the final output terminal of the scan path.

In this embodiment, either one of a holding control signal HLD0 and a shift mode control signal SM is supplied to the shift mode terminal sm of the test circuit TC, as shown in FIG. 10. Either one of a holding control signal HLD1 and the shift mode control signal SM is supplied to the shift mode terminal sm of the test circuit CTC. Further, either one of the holding control signal HLD0 and a test holding control signal THLD0 is supplied to the test holding terminal thld of the test circuit TC. Either one of the holding control signal HLD1 and a test holding control signal THLD1 is supplied to the test holding terminal thld of the test circuit CTC. The expected data EXP and the comparison enable signal CMPEN are supplied to the expected data terminal exp and the comparison terminal cmpen of the test circuit CTC respectively for performing control.

Figure 14:
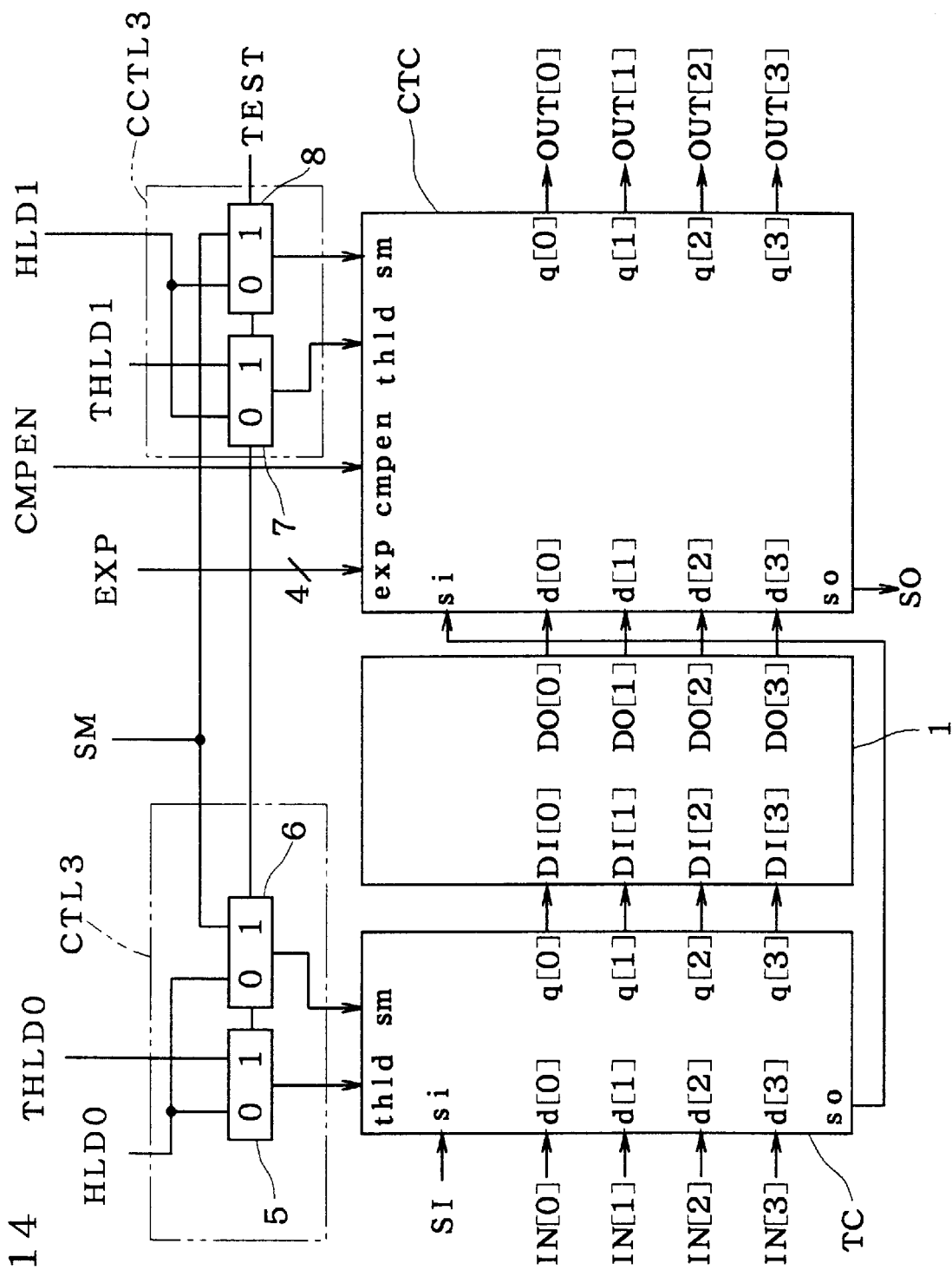
FIG. 14 is a circuit diagram showing control circuits CTL3 and CCTL3 controlling the test circuits TC and CTC respectively.

FIG. 14 shows control circuits providing the aforementioned control signals. FIG. 14 is a circuit diagram showing a circuit which is provided with control circuits CTL3 and CCTL3 controlling the test circuits TC and CTC respectively.

The control circuit CTL3 receives the holding control signal HLD0, the test holding control signal THLD0, the shift mode control signal SM and a test control signal TEST, and supplies the test holding control signal thld and the shift mode control signal sm to the test circuit TC. Similarly to the control circuit CTL3, the control circuit CCTL3 receives the holding control signal HLD1, the test holding control signal THLD1, the shift mode control signal SM and the test control signal TEST, and supplies the test holding control signal thld and the shift mode control signal sm to the test circuit CTC. The shift mode control signal SM and the test control signal TEST are supplied to the control circuits CTL3 and CCTL3 in common. On the other hand, the expected data EXP and the comparison enable signal CMPEN are supplied to the test circuit CTC independently of the control circuit CCTL3.

Circuit operations of the control circuit CTL3 are first described. When the test control signal TEST is "0", the control circuit CTL3 outputs the holding control signal HLD0 as the test holding control signal thld and the shift mode control signal sm. When the test control signal TEST is "1", on the other hand, the control circuit CTL3 outputs the test holding control signal THLD0 and the shift mode control signal SM as the test holding control signal thld and the shift mode control signal sm respectively.

The circuit operations of the control circuit CCTL3 are now described. The circuit operations of the control circuit CCTL3 are similar to those of the control circuit CTL3. When the test control signal TEST is "0", the control circuit CCTL3 outputs the holding control signal HLD1 as the test holding control signal thld and the shift mode control signal sm. When the test control signal TEST is "1", on the other hand, the control circuit CCTL3 outputs the test holding control signal THLD1 and the shift mode control signal SM as the test holding control signal thld and the shift mode control signal sm respectively.

The structure of the control circuit CCTL3 is described with reference to FIG. 14. The control circuit CTL3 is formed by selectors 5 and 6. Each of the selectors 5 and 6 has a data input 0 terminal, a data input 1 terminal, an output terminal, and a control terminal. The test signal TEST is inputted in the control terminals of the selectors 5 and 6 for simultaneously switching these selectors 5 and 6. The data input 0 terminals are selected and connected to the output terminals when the test control signal TEST is "0". On the other hand, the data input 1 terminals are selected and connected to the output terminals when the test control signal TEST is "1". Thus, data outputted from the selectors 5 and 6 respectively can be selected by switching the test control signal TEST which is inputted in the selectors 5 and 6 between "1" and "0". A holding terminal HLD0 is connected to the respective data input 0 terminals of the selectors 5 and 6 in common. A test holding terminal THLD0 is connected to the data input 1 terminal of the selector 5, and a shift mode terminal SM is connected to the data input I terminal of the selector 6. The output terminal of the selector 5 is connected to the test holding terminal thld of the test circuit TC. The output terminal of the selector 6 is connected to the shift mode terminal sm of the test circuit TC.

The structure of the control circuit CCTL3 is now described with reference to FIG. 14. Connection of the control circuit CCTL3 is similar to that of the control circuit CTL3. The control circuit CCTL3 is formed by converting the control circuit CTL3 as follows:

selectors 5 and 6→selectors 7 and 8 holding terminal HLD0→holding terminal HLD1 test holding terminal THLD0→test holding terminal THLD1

The circuit operations of the control circuits shown in FIG. 14 are summarized as follows: The circuit operations include an ordinary operation, an ordinary scan test operation and a scan test operation employing a test result compression function. The ordinary scan test operation is the scan test operation indicated in the embodiment 1. The scan test operation employing the test result compression function is an operation of comparing actual output data of the logic circuit with expected output data of the logic circuit on the output side of the logic circuit, compressing the test results by holding the comparison results, and scanning out the data after the compression. Table 3 shows optimum set values of the respective signals and data in the ordinary operation, the ordinary scan test and the scan test employing the test result compression function.

TABLE 3

| Input/Output | Ordinary Operation | | | | Scan Test | | | | | | Compression Test | | |
|---|---|---|---|---|---|---|---|---|---|---|---|---|---|
| | | Hold | | | | | | Hold | | | | | |
| | Synchro-nization | Input | Output | Input/Output | Data Input | Execution | Data Output | Input | Output | Input/Output | Initialization | Execution | Data Output |
| TEST | | 0 | | | | | 1 | | | | 1 | | |
| SM | | 0 | | | 1 | 0 | 1 | | 1 | | 1 | | |
| HLD0 | 0 | 1 | 0 | 1 | | | DC | | | | DC | | |
| HLD1 | 0 | 0 | 1 | 1 | | | DC | | | | DC | | |
| THLD0 | | DC | | | 0 | 0 | 0 | 1 | 0 | 1 | 0 | 1/0 | 0 |
| THLD1 | | DC | | | 0 | 0 | 0 | 0 | 1 | 1 | 0 | 1 | 0 |
| CMPEN | | 0 | | | | | 0 | | | | 0 | 1/0 | 0 |
| EXP | | DC | | | | | 0 | | | | 0 | 1/0 | 0 |
| SI | | DC | | | 1/0 | DC | DC | | DC | | 1 | 1/0 | DC |

The ordinary operation is now described. In the ordinary operation, the test control signal TEST and the comparison enable signal CMPEN are set at "0". Description is first made on the input side. The selectors 5 and 6 output data which are inputted in the data input 0 terminals when the test control signal TEST is "0", and hence the holding control signal HLD0 is supplied to the test circuit TC as the test holding control signal thld and the shift mode control signal sm. If the holding control signal HLD0 is "0" at this time, input data IN are incorporated in the input terminals DI of the data circuit 1 through connection circuits CC forming the test circuit TC. If the holding control signal HLD0 is "1", on the other hand, the input data IN are held in the connection circuits CC. On the output side, the selectors 7 and 8 output data which are inputted in the data input 0 terminals, and hence the holding control signal HLD1 is supplied to the test circuit CTC as the test holding control signal thld and the shift mode control signal sm. If the holding control signal HLD1 is "0" at this time, the output data DO are outputted from the data output terminals OUT through the connection circuits CCC forming the test circuit CTC. If the holding control signal HLD1 is "1", on the other hand, the output data DO are held in the connection circuits CCC since the comparison enable signal CMPEN is "0".

In the ordinary operation, the ordinary scan test and the scan test employing the test result compression function, the test control signal TEST is set at "1". When the test control signal TEST is "1", the selectors 5 and 6 forming the control circuit CTL3 and the selectors 7 and 8 forming the control circuit CCTL3 output data which are inputted in the data input 1 terminals respectively. On the input side, the test holding control signal THLD0 and the shift mode control signal SM are outputted to the test circuit TC as the test holding control signal thld and the shift mode control signal sm respectively. On the output side, the test holding control signal THLD1 and the shift mode control signal SM are outputted to the test circuit CTC as the test holding control signal thld and the shift mode control signal sm respectively.

The ordinary scan test operation is now described. In the ordinary scan test, the comparison enable signal CMPEN is set at "0". In the ordinary scan test, shift-in of test patterns, execution, and shift-out of test results are successively performed. Data can be held in the connection circuits CC and CCC.

1. Shift-In of Test Patterns

In preparation for inputting of test patterns in the data circuit 1, the test patterns are shifted in the input side connection circuits CC. The test patterns to be inputted in the data circuit 1 can be shifted in from the scan-in terminal SI by setting the test holding control signal THLD0 and the shift mode control signal SM at "0" and "1" respectively. The data circuit 1 is of four bits in this embodiment, and hence 4-bit test patterns are shifted in. The test pattern is shifted in the order of the input side connection circuits CC[0]→CC[1]→CC[2]→CC[3], to be inputted therein.

2. Execution

The shift mode control signal SM is set at "0". At this time, the input data IN are incorporated in the input terminals DI on the input side through the connection circuits CC, while the output data DO which are the test results of the data circuit 1 are outputted from the data output terminals OUT on the output side through the connection circuits CCC.

3. Shift-Out of Test Results

The test holding control signal THLD1 and the shift mode control signal SM are set at "0" and "1" respectively. At this time, the test results are successively shifted out from the scan-out terminal SO.

In order to hold the data in an intermediate stage of the scan test, the shift mode control signal SM is set at "1". If the holding control signal THLD0 is "1", the connection circuits CC hold the data on the input side. If the holding control signal THLD1 is "1", on the other hand, the connection circuits CCC hold the data on the output side.

The aforementioned ordinary operation and the ordinary scan test can be made also when the output side test circuit CTC is replaced with the test circuit TC. The data in the ordinary operation and the ordinary scan test are held in the connection circuit CC or CCC in common, whereby the overhead of the circuit can be reduced and the circuit area can be reduced.

In execution of the scan test, a scan test of a plurality of logic circuits can be made by a single scan path by holding the input data IN incorporated in the input terminals DI in execution in the scan test operation, as described below.

Figure 15:
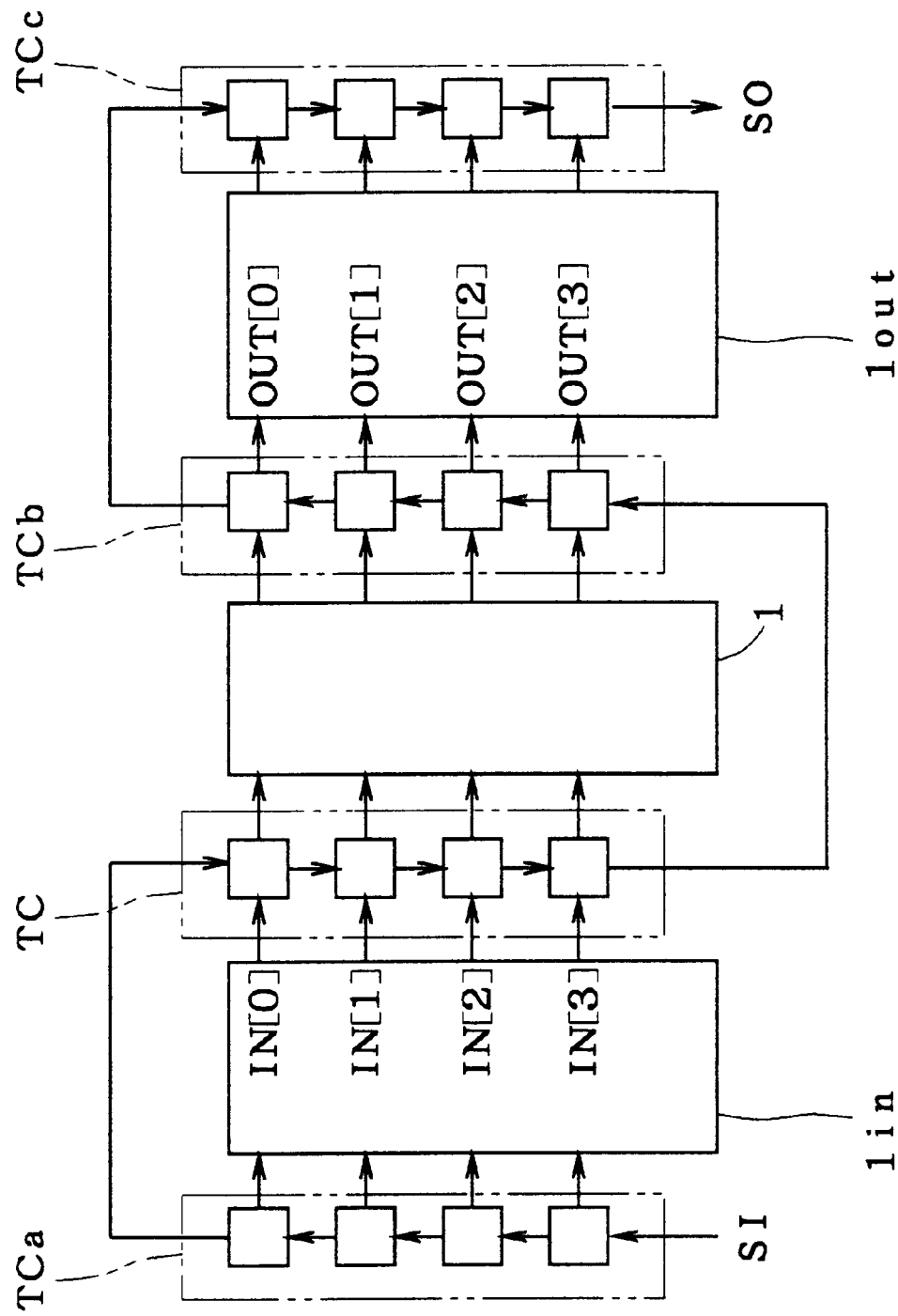
FIG. 15 is a circuit diagram showing a circuit provided with a scan path for a plurality of logic circuits.

FIG. 15 is a circuit diagram showing a circuit which is provided with test circuits TCa, TC, TCb and TCc on an input side of a data circuit 1in, between an output side of the data circuit 1in and an input side of a data circuit 1, between an output side of the data circuit 1 and an input side of a data circuit 1out, and on an output side of the data circuit 1out respectively, for forming a scan path. The data circuits 1in and 1out are logic circuits respectively. The data circuit 1in supplies input data IN to the data circuit 1. The data circuit 1 supplies output data OUT to the data circuit 1out. The test circuits TCa, TC, TCb and TCc are controlled by control circuits CTLTCa, CTL3, CTLTCb and CTLTCc (not shown) respectively. The test circuit TCa has a function which is similar to that of the test circuit TC. The test circuits TCb and TCc have structures and functions which are similar to those of the test circuit TC or CTC.

The data circuits 1in, 1 and 1out are successively lined up, and the scan path is formed as a scan-in terminal SI→the test circuit TCa→the test circuit TC→the test circuit TCb→the test circuit TCc→the scan-out terminal SO.

The input data IN from the data circuit 1in which are incorporated in input terminals DI of the data circuit 1 are held by the test circuit TC and thereafter shifted out and taken out from the scan-out terminal SO. A similar operation can be performed in the test circuit TCb or TCc.

A scan test of a plurality of logic circuits can be made by one scan path, by performing the aforementioned operation.

In an ordinary scan test, the operations described in 1 to 3 must be repeated by the number of test patterns. Description is now made on a scan test sufficiently performing single shift-out in reply to all patterns, i.e., the scan test operation employing the test result compression function.

The scan test operation employing the test result compression function is described with reference to FIG. 14. In the scan test employing the test result compression function, shift-in of the test patterns and comparison and compression are alternately performed after initialization. After comparison and compression in reply to all desired test patterns are completed, the compressed test results are shifted out.

In the scan test employing the test result compression function, the comparison enable signal CMPEN takes both values of "0" and "1".

1. Initialization

As initialization, "1" is set in all flip-flops 4 included in the connection circuits CCC forming the test circuit CTC. The shift mode control signal SM is set at "1" and the test holding control signals THLD0 and THLD1 are set at "0" respectively so that "1" is shifted in from the scan-in terminal SI, whereby "1" is set in the flip-flops 4. The comparison enable signal CMPEN is set at "0".

2. Shift-In and Comparison and Compression of Test Patterns

In preparation for inputting of the test patterns in the data circuit 1, the test patterns are shifted in the input side connection circuits CC. At this time, the test holding control signal THLD1 is set at "1", in order to hold "1" set in the flip-flops 4 of the connection circuits CCC in the initialization. The values of the test holding control signal THLD0 and the shift mode control signal SM are equal to those in the initialization respectively. Namely, the test patterns to be inputted in the data circuit 1 are shifted in from the scan-in terminal SI in such a state that the test holding control signal THLD0 is "0", the test holding control signal THLD1 is "1" and the shift mode control signal SM is "1".

The data circuit 1 of this embodiment is of four bits, and hence 4-bit test patterns are shifted in. The test patterns are shifted in the order of the input side connection circuits CC[0]→CC[1]→CC[2]→CC[3], to be inputted therein. For example, a quaternary full periodic series is supplied as the test patterns. The full periodic series is formed by adding data whose all bits are "0" to an M series. Therefore, the full periodic series generates data of all combinations. Therefore, test patterns of all combinations can be efficiently set in the connection circuits CC by supplying the full periodic series as the test patterns. Further, the test patterns can be efficiently inputted in the data circuit 1 by repeatedly shifting in the test patterns when the test holding control signal THLD0 is "0" and then setting the test holding control signal THLD0 at "1" for holding the test patterns in the connection circuits CC so that "0" and "1" are successively repeated in a marching pattern.

The comparison enable signal CMPEN is set at "1" only for the test patterns for making the test in the state of inputting the expected data EXP, thereby comparing the output data of the data circuit 1 with the expected data EXP. The comparison results are compressed by the aforementioned circuit operations of the test circuit CTC.

3. Shift-Out of Test Results

The test holding control signal THLD1 and the shift mode control signal SM are set at "0" and "1" respectively. At this time, the test results compressed in the connection circuits CCC are successively shifted out from the scan-out terminal SO.

Figure 12:
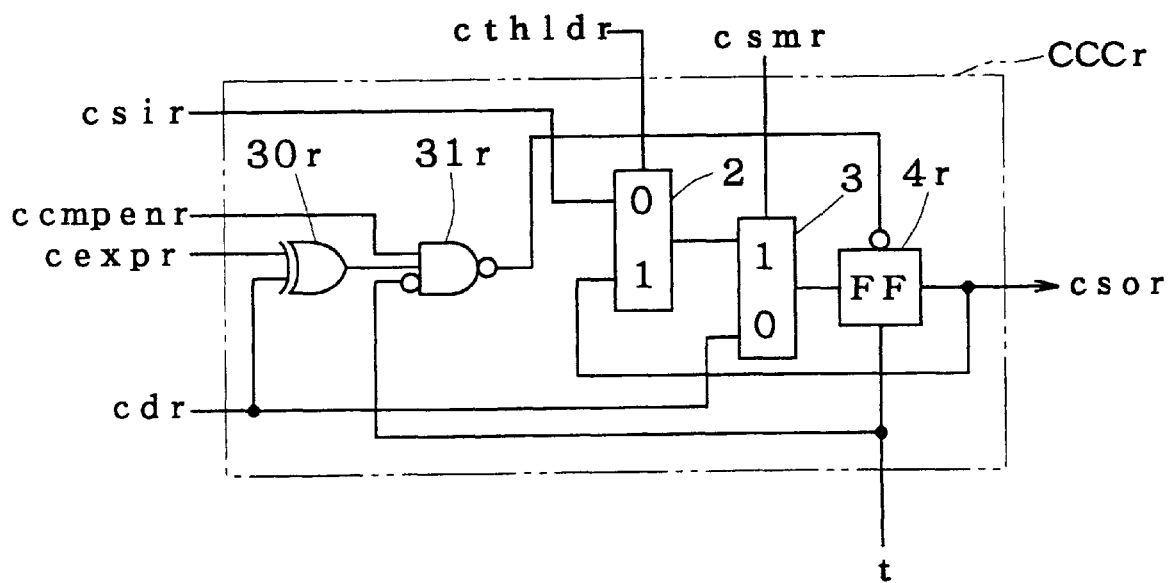
FIG. 12 is a circuit diagram showing a connection circuit CCCr.

The above are the circuit operations of the circuit shown in FIG. 14. Similar circuit operations can be attained also by employing a connection circuit CCCr shown in FIG. 12 in place of each connection circuit CCC shown in FIG. 11. The connection circuit CCCr is characterized in that a reset terminal which is generally provided on a flip-flop is effectively utilized. The connection circuit CCCr is now described with reference to difference between the same and the connection circuit CCC.

The connection circuit CCCr comprises terminals having the same functions as those provided in the connection circuit CCC, and further with a clock terminal t. Namely, an input terminal cdr, a scan-in terminal csir, a test holding terminal cthldr, a shift mode terminal csmr, a scan-out terminal csor, an expected data terminal cexpr and a comparison terminal ccmpenr provided on the connection circuit CCCr have functions identical to those of the input terminal cd, the scan-in terminal csi, the test holding terminal cthld, the shift mode terminal csm, the scan-out terminal cso, the expected data terminal cexp and the comparison terminal ccmpen provided on the connection circuit CCC respectively.

The connection circuit CCCr is formed by selectors 2 and 3, a flip-flop 4r, an Ex-OR gate 30r, and a gate 31r. The Ex-OR gate 30r is identical in structure and function to the Ex-OR gate 30, while the gate 31r executes the NAND operation of signals which are inputted in two input terminals respectively and an inverted signal of a signal which is inputted in one inversion input terminal, and outputs the logic from an output terminal.

In the embodiments heretofore described, a reset terminal and a clock terminal which are provided in each flip-flop 4 may not serve specific functions, and hence description and illustration thereof are omitted. In the connection circuit CCCr, however, the reset terminal is effectively utilized and a signal inputted in the clock terminal is utilized to take synchronization, thereby compressing test results. Therefore, the reset terminal and the clock terminal of the flip-flop 4r are illustrated in particular only in the connection circuit CCCr. Following this, it is necessary to add a clock terminal T to the test circuit CTC to be connected with the clock terminal t of the connection circuit CCCr. However, the clock terminal T of the test circuit CTC is omitted.

Main differences between the connection circuits CCCr and CCC are:

1. the difference between the gate 31r and the NAND gate 31 and the AND gate 32;

2. the difference between connection between the flip-flop 4 and the selector 2 and that between the flip-flop 4r and the selector 2; and 3. the difference resulting from the presence and connection of the clock terminal t. Other connection is similar and hence redundant description is omitted.

An output terminal of the Ex-OR gate 30r is connected to a first input terminal of the gate 31r, while the comparison terminal ccmpenr is connected to a second input terminal of the gate 31r. The clock terminal t is connected to an inversion input terminal of the gate 31r, as well as to the clock terminal of the flip-flop 4r in common. An output terminal of the gate 31r is connected to the reset terminal of the flip-flop 4r. When "0" is received, the reset terminal of the flip-flop 4r resets data stored in itself. The output terminal of the flip-flop 4r is connected to a data input 1 terminal of the selector 2, as well as to the scan-out terminal csor of the connection circuit CCCr.

Circuit operations of the connection circuit CCCr are now described. Circuit operations which are absolutely identical to those of the circuit operations 1 and 2 of the connection circuit CCC and a circuit operation which is similar to the circuit operation 3 of the connection circuit CCC are attained also when the connection circuit CCCr is employed. The circuit operation 3 in case of employing the connection circuit CCCr is now described.

When a comparison enable signal ccmpenr is "0", the gate 31r outputs "1" to the reset terminal of the flip-flop 4r regardless of output data from the Ex-OR gate 30r and a clock signal t which is inputted in the clock terminal t. Therefore, no data is reset in the flip-flop 4r, and the connection circuit CCCr keeps holding the data of the flip-flop 4r.

When the comparison enable signal ccmpenr is "1" and the clock signal t inputted from the clock terminal t is "0", the gate 31r outputs an inverted logic of output data of the Ex-OR gate 30r. When expected data expr and input data cdr match with each other in the Ex-OR gate 30r, therefore, the gate 31r outputs "1" to the reset terminal of the flip-flop 4r. Thus, the connection circuit CCCr keeps holding the data of the flip-flop 4r.

If the expected data expr and the input data cdr mismatch with each other in the Ex-OR gate 30r, the gate 31r outputs "0" to the reset terminal of the flip-flop 4r. Thus, the data is reset in the flip-flop 4r, whereby "0" is continuously held in the selectors 2 and 3 and the flip-flop 4r.

Namely, the connection circuit CCCr has a circuit function of holding the data of the flip-flop 4r when the expected data expr and the input data cdr match with each other, while holding "0" in the flip-flop 4r when the data mismatch with each other. This circuit function is identical to that of the connection circuit CCC. However, the following advantage can be attained by employing the connection circuit CCCr in particular:

The connection circuit CCC holds the data by a loop which is formed by the selectors 2 and 3, the flip-flop 4 and the AND gate 32. On the other hand, the connection circuit CCCr holds the data by a loop which is formed by only the selectors 2 and 3 and the flip-flop 4r, thereby reducing such a possibility that the data are influenced by unwanted noises or the like.

While the connection circuit CCCr takes synchronization by the clock signal t, such synchronization by the clock signal may not be taken by removing the inversion input terminal from the gate 31r so that the gate 31r defines a NAND gate.

As clearly understood from the above description, the test circuit CTC can be formed by employing the connection circuit CCCr, similarly to the case of employing the connection circuit CCC.

Test results in reply to a plurality of test patterns may be shifted out only once by providing the test circuit CTC on the output side of the data circuit 1 and forming the scan test employing the test result compression function. Therefore, time required for making the scan test employing the test result compression nction on a plurality of test patterns is shorter than that required for making the dinary scan test on a plurality of test patterns a plurality of times. In other rds, the test time can be reduced.

When the control circuit CTL3 shown in FIG. 14 is employed, an effect imilar to that described with reference to the embodiment 1 is attained. In the ontrol circuit CTL3, the test control signal TEST controls whether the holding ermi- nal HLD0 or the test holding terminal THLD0 and the shift mode terminal SM is selected. Therefore, a scan test of the data circuit 1 can be made independently of the holding control signal HLD0 supplied from the data circuit la in the circuit shown in FIG. 4 by employing the control circuit CTL3.

The structural difference between the control circuits CTL3 and CCTL3 resides only in the inputted control signals. The operations of the selectors 5, 6, 7 and 8 are identical to each other since the same are simultaneously controlled by the test control signal TEST. As to the invention related to the structure of the control circuits, description of each control circuit controlling the test circuit TC can be made and this description may be applied to that for each control circuit for controlling the test circuit CTC. Therefore, the circuit shown in FIG. 14 can be illustrated as FIG. 17 while omitting the circuit on the output side of the data circuit 1. Illustration of the circuit on the output side of the data circuit I is hereafter omitted unless particularly required.

Figure 16:
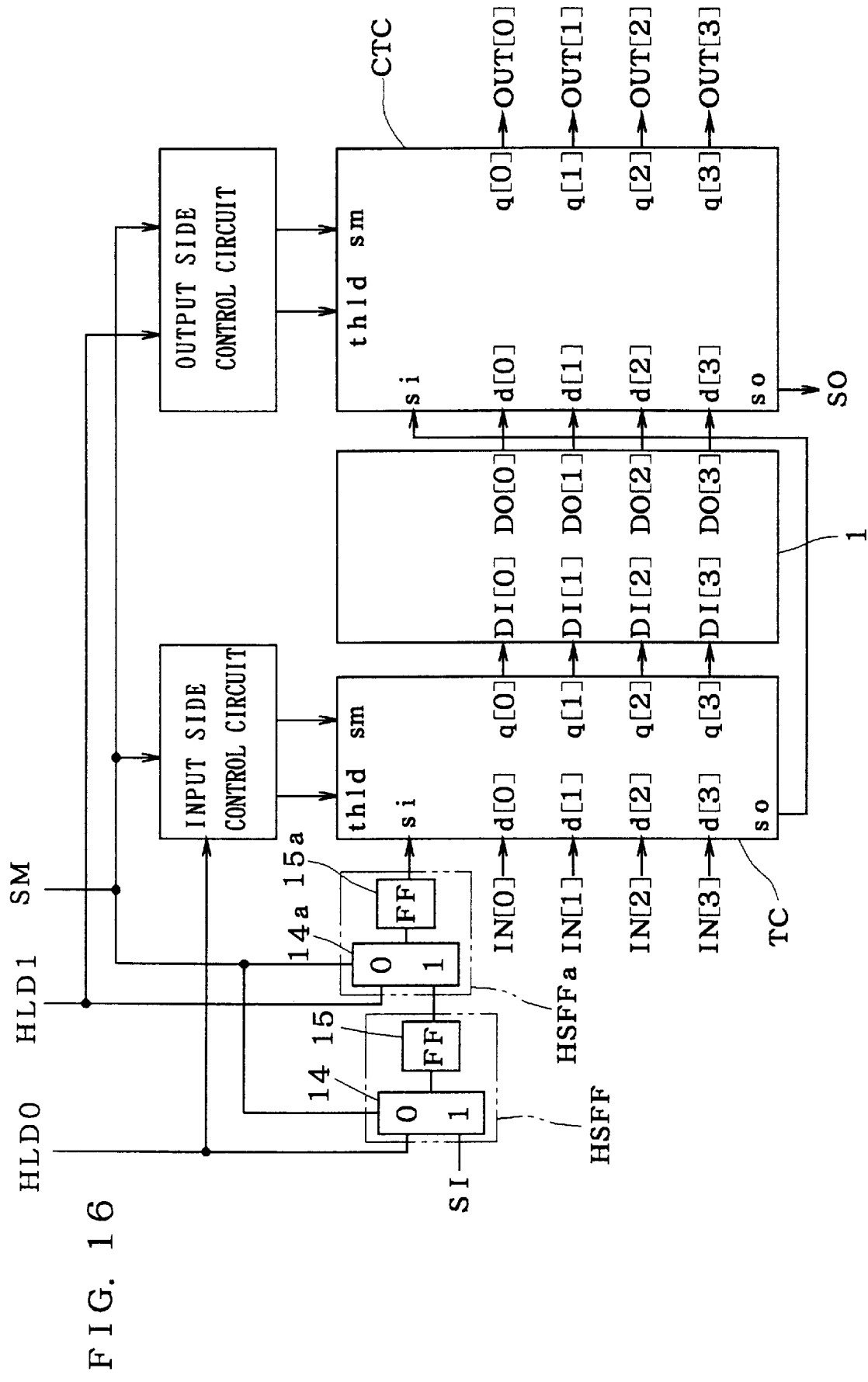
FIG. 16 is a circuit diagram showing a circuit provided with scan flip-flops HSFF and HSFFa.

In this embodiment, the holding control signals HLD0 and HLD1 which are inputted in the control circuits on the input and output sides are different from each other. Therefore, it is necessary to employ a plurality of scan flip-flops for confirming the holding control signals. Such scan flip-flops employed for confirming a plurality of holding control signals are now described with reference to FIG. 16. FIG. 16 illustrates the state of connection of scan flip-flops which are employed for confirming a plurality of holding control signals, while omitting test holding terminals, expected data terminals, comparison terminals and the like.

Consider that the holding control signals HLD0 and HLD1 are confirmed. Scan flip-flops HSFF and HSFFa are inserted between the scan-in terminal SI and the scan-in terminal si of the test circuit TC. The scan flip-flop HSFF is a circuit consisting of a selector 14 and a flip-flop 15. Similarly, the scan flip-flop HSFFa is a circuit consisting of a selector 14a and a flip-flop 15a. The scan flip-flop HSFF is provided in order to confirm the holding control signal HLD0 which is inputted in the control circuits controlling the test circuit TC. Similarly, the scan flip-flop HSFFa is provided in order to confirm the holding control signal HLD1 which is inputted in the control circuits controlling the test circuit CTC. Each of the selectors 14 and 14a has a data input 0 terminal, a data input 1 terminal, an output terminal, and a control terminal. The shift mode control signal SM for switching the selectors 14 and 14a is inputted in the respective control terminals.

The data input 0 terminals are selected and connected to the output terminals when the shift mode control signal SM is "0". On the other hand, the data input 1 terminals are selected and connected to the output terminals when the shift mode control signal SM is "1". Therefore, data outputted from the selectors 14 and 14a can be selected by switching the shift mode control signal SM inputted in the selectors 14 and 14a between "1" and "0". The scan-in terminal SI is connected to the data input 1 terminal of the selector 14. The holding terminal HLD0 is connected to the data input 0 terminal of the selector 14. The output terminal of selector 14 is connected to an input terminal of the flip-flop 15. An output minal of the flip-flop 15 is connected to the data input 1 terminal of the selector The holding terminal HLD1 is connected to the data input 0 terminal of the ector 14a. An output terminal of the flip-flop 15a is connected to the scan-in rminal si of the test circuit TC. The flip-flops 15 and 15a are D flip-flops or flip-flops having functions which are similar to those of the D flip-flops.

In the aforementioned scan flip-flops HSFF and HSFFa, the values of the lding control signals HLD0 and HLD1 can be stored in the flip-flops 15 and 15a respectively by setting the shift mode control signal SM at "0". In the structure shown in FIG. 16, the output terminals of the scan flip-flops HSFF and HSFFa are onnected to the scan-in terminal si of the test circuit TC. Therefore, the shift ode control signal SM may be set at "1" and the test holding control signals HLD0 and THLD1 may be set at "0" so that observation is made after taking out logics of the holding control signals HLD0 and HLD1 from the scan path as scanout data S0 which were stored in the scan flip-flops HSFF and HSFFa respectively when the shift mode control signal SM was "0". For example, observation of other control signals such as the test control signals THLD0 and THLD1 is also enabled by employing a similar structure.

While the selectors 14 and 14a are controlled by the shift mode control signal SM as described above, a control terminal which is irrelevant to control of the test circuits TC and CTC can be newly provided for controlling the selectors 14 and 14a by a control signal outputted from this control terminal. However, the following advantage is attained by employing the shift mode control signal SM for controlling the selectors 14 and 14a:

In the test circuits TC and CTC according to this embodiment, the shift mode control signal SM is set at "0" when the test control signal TEST is "1", so that input data IN are incorporated in the input terminals DI on the input side through the connection circuits CC. At this time, output data DO which are test results of the data circuit 1 are outputted from the data output terminals OUT on the output side through connection circuits CCC. When the shift mode control signal SM is "0", the control signals HLD0 and HLD1 are stored in the scan flip-flops HSFF and HSFFa, the selectors 14 and 14a, while the same are not shifted in the test circuit TC. When test patterns are shifted in or the test results are shifted out in a scan test, the shift mode control signal SM is set at "1". Therefore, the test patterns which are shifted in from the shift in terminal SI are made to conduct in the selectors 14 and 14a, whereby the scan flip-flops HSFF and HSFFa inhibit neither shift-in of the test patterns nor shift-out of the test results. No bad influence is exerted on the scan test operation also when the selectors 14 and 14a are controlled by the shift mode control signal SM, whereby the control terminal supplying the control signal to the scan flip-flops HSFF and HSFFa can be reduced by employing the shift mode control signal SM.

While the scan flip-flops HSFF and HSFFa are inserted between the scan-in terminal SI and the scan-in terminal si of the test circuit TC, the same function is attained also when the scan flip-flops are inserted between the scan-out terminal so of the test circuit TC and the scan-in terminal si of the test circuit CTC, and observation of the holding control signals HLD0 and HLD1 is enabled. The same function is attained also when the scan flip-flops are inserted between the scan-out terminal so of the test circuit CTC and the scan-out terminal SO.

While two control signals are observed in the above description, the number of observable control signals is not restricted to two. When there are a plurality of control signals to be observed, the same number of scan flip-flops may be connected in series with each other, as clearly understood from the above.

The holding functions of the test circuits TC and CTC according to this embodiment can be employed for the ordinary operation and the scan test operation, whereby the circuit area can be reduced by eliminating the overhead.

Still another control circuit according to this embodiment is now described. FIG. 18 is a circuit diagram showing a control circuit CTL3a which is similarly structured as the control circuit CTL3 shown in FIG. 17 to have the same function.

The difference between the control circuits CTL3a and CTL3 resides only in structural difference. The structural difference is the difference in a terminal which is connected to a data input 0 terminal of a selector 6. Namely, an output terminal of a selector 5 is connected to the data input 0 terminal of the selector 6.

Circuit operations of the control circuit CTL3a are described. Considering the aforementioned structural difference, consideration may be made only on the case where the test control signal TEST is "0". The selector 6 outputs an output of the selector 5 when the test control signal TEST is "0", whereby the holding control signal HLD0 is outputted from the output terminal of the selector 6.

Therefore, the circuit operations of the control circuit CTL3a are identical to those of the control circuit CTL3.

Figure 17:
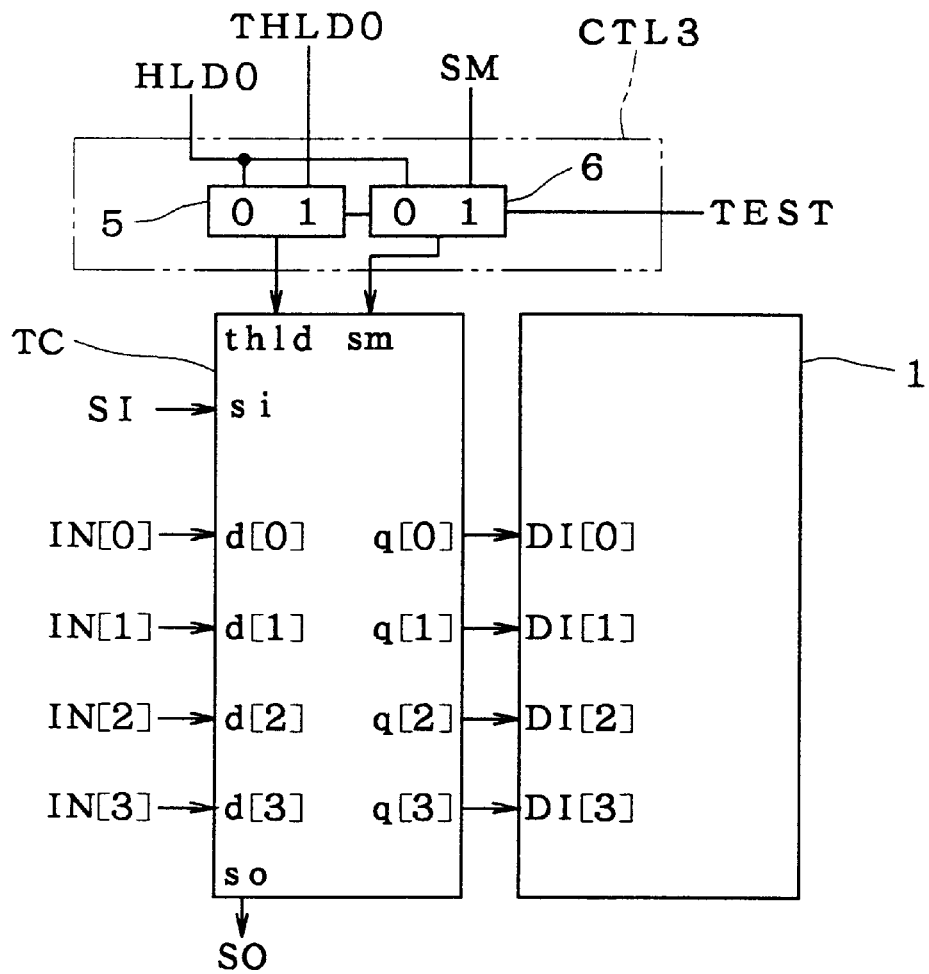
FIG. 17 is a circuit diagram showing the circuit appearing in FIG. 14 only on its input side.
Figure 18:
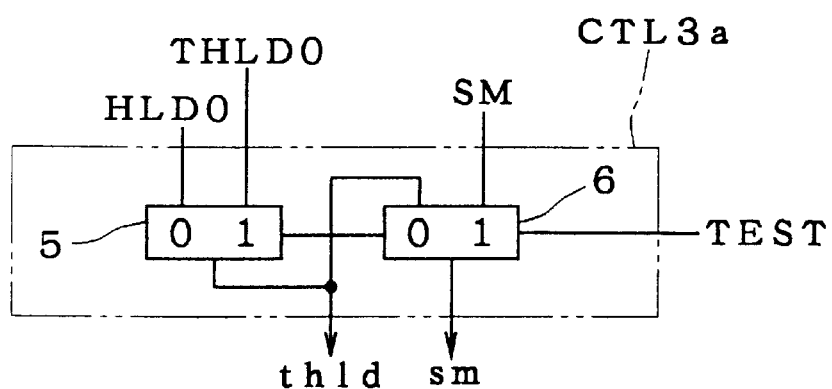
FIG. 18 is a circuit diagram showing a control circuit CTL3a having the same function as the control circuit CTL3.
Figure 19:
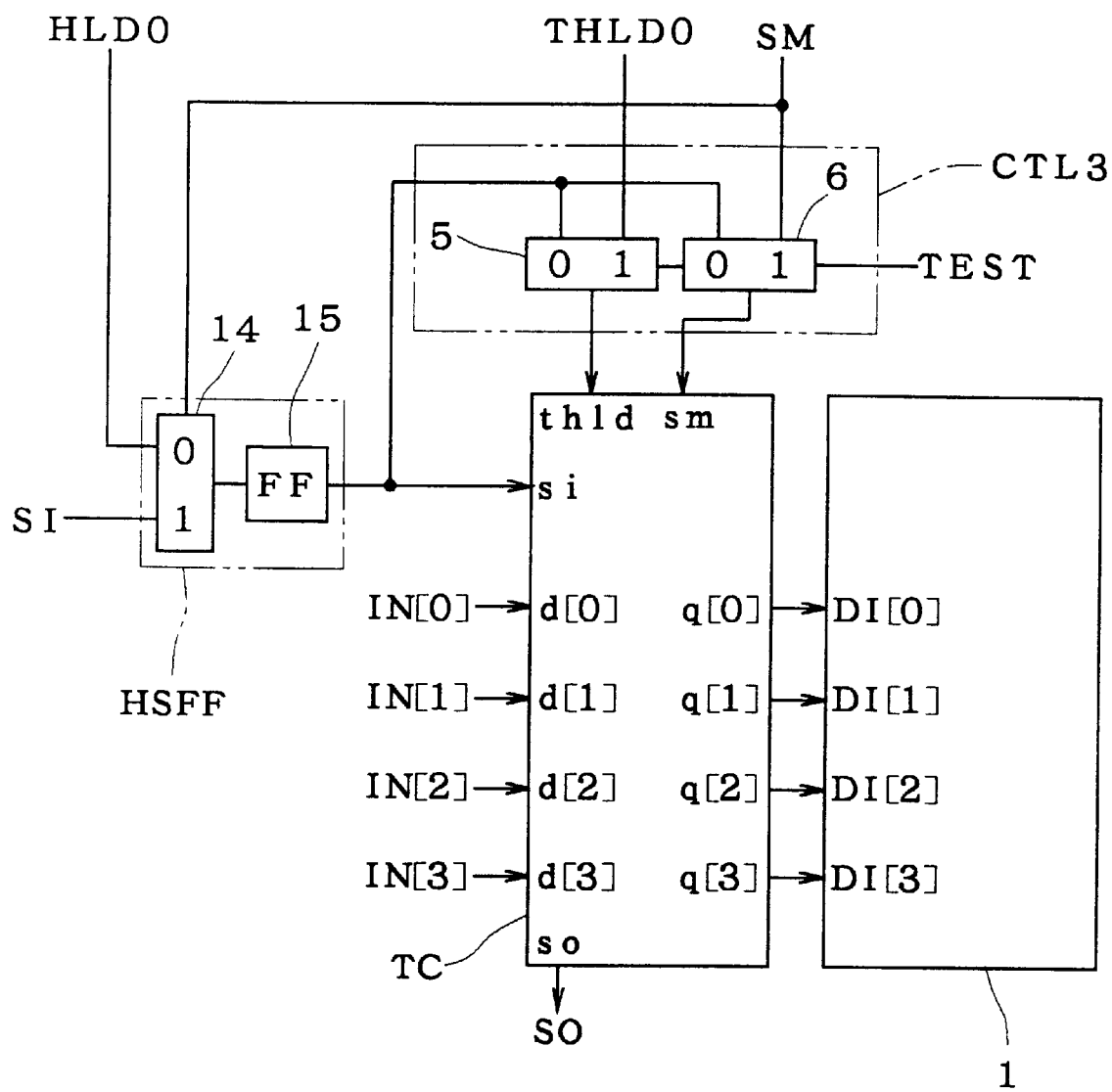
FIG. 19 is a circuit diagram showing a circuit provided with a holding terminal HLD0 which is connected to a control circuit CLT3 through a scan flip-flop HSFF.

Referring to FIG. 17, the control circuit CTL3 is directly connected to the holding terminal HLD0, the test holding terminal THLD0 and the shift mode control signal SM. It is also possible to connect the holding terminal HLD0 to the control circuit CTL3 through the scan flip-flop HSFF as shown in FIG. 19, by setting the shift mode control signal SM which is inputted in the control terminal of the selector 14 at "0" in the ordinary operation.

A testing circuit according to this embodiment which can be obtained by changing the structure of scan flip-flops is now described. Components having the same structures, functions etc. as those of the above circuits are denoted by the same reference numerals, to omit redundant description.

Figure 20:
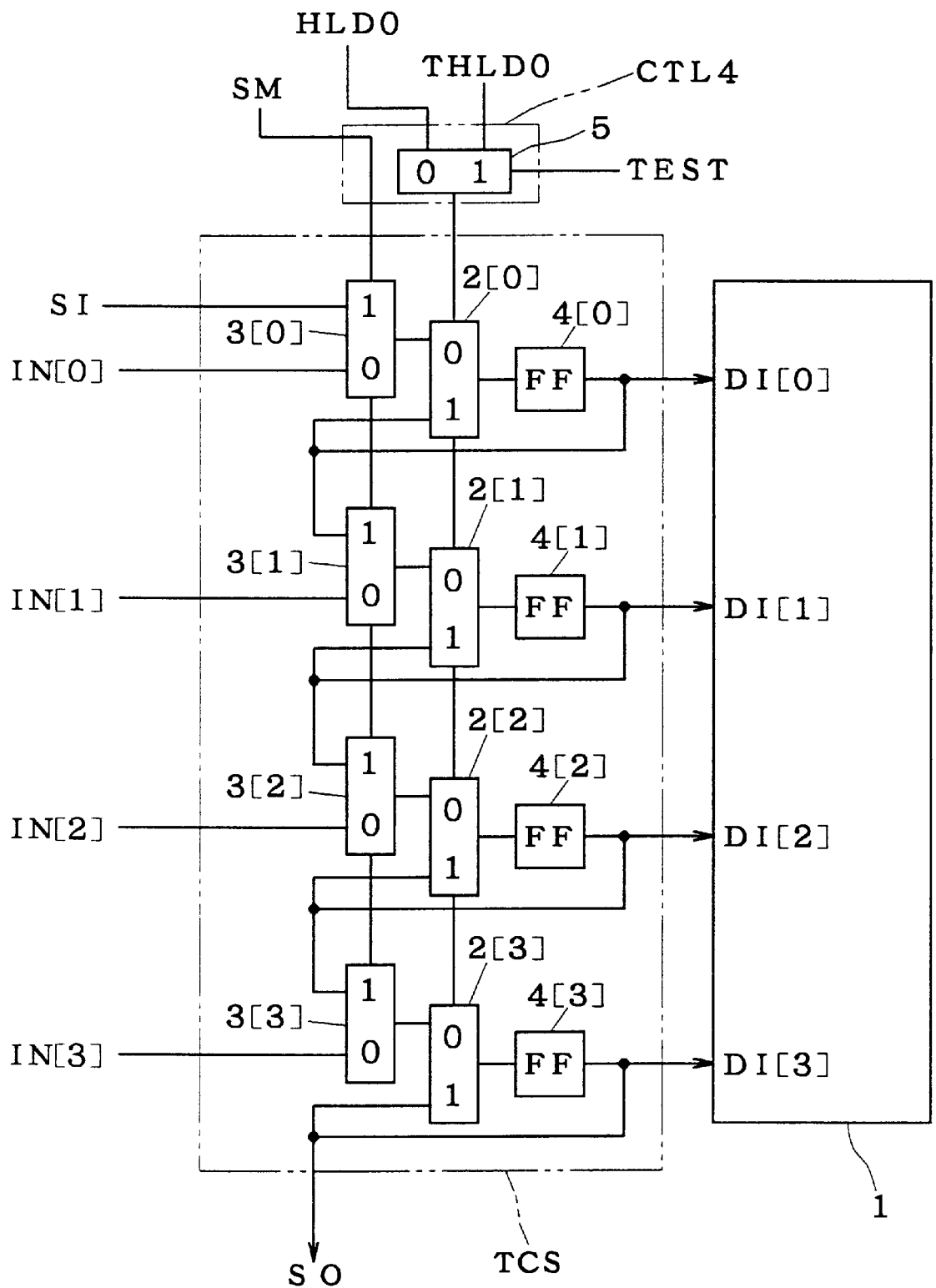
FIG. 20 is a circuit diagram showing a test circuit TCS according to the embodiment 2 of the present invention.

FIG. 20 is a circuit diagram showing a logic circuit and the testing circuit according to this embodiment. A test circuit TCS according to this embodiment is a circuit which can be employed in place of the test circuit TC. Similarly to the test circuit TC, the test circuit TCS according to this embodiment is also formed by flip-flops 4, selectors 2 for switching a holding function and selectors 3 for switching the scan mode. The selectors 2 are controlled by the test holding control signal thld, and the selectors 3 are controlled by the shift mode control signal sm.

The difference between the test circuits TC and TCS resides in that the order of the selectors 2 for switching the holding function and the selectors 3 for switching the scan mode is exchanged.

The test circuit TCS is now described. The test circuit TCS can be employed for either input or output side of the data circuit 1. Operations of the test circuit TCS employed on the output side are similar to those of the test circuit TCS employed on the input side. Therefore, FIG. 20 illustrates only the input side, and the description is also made only on the input side unless required in particular.

The data circuit 1 is input-controlled by the test circuit TCS. The test circuit TCS is inserted between the data input terminals IN and the input terminals DI of the data circuit 1. The test circuit TCS comprises input terminals d[0] to d[3] for inputting input data IN[0] to IN[3], output terminals q[0] to q[3] for outputting the data to the input terminals DI of the data circuit 1, a scan-in terminal si, a test holding terminal thld, a shift mode terminal sm, and a scan-out terminal so.

Operations of the test circuit TCS by the test holding control signal thld and the shift mode control signal sm which are inputted in the test holding terminal thld and the shift mode terminal sm respectively are now described. When the shift mode control signal sm and the test holding control signal thld are "0", the test circuit TCS incorporates data inputted in the input terminals d, and outputs the same from the output terminals q as such. When the shift mode control signal sm is "1" and the test holding control signal thld is "0", the test circuit TC incorporates data inputted in the scan-in terminal si and outputs the same from the scan-out terminal so. When the test holding control signal thld is "1", data are held in the test circuit TCS.

The test circuit TCS performing the aforementioned operations is formed as follows: Output terminals [N−1] of the flip-flops 4 are connected to data input 1 terminals of the selectors 3[N]. When N=0, in particular, the scan-in terminal si is connected to the data input 1 terminal of the selector 3[0]. The data input terminal IN is connected to the data input 0 terminals of the selectors 3[N]. The output terminals of the selectors 3[N] are connected to the data input 0 terminals of the selectors 2[N]. The output terminals of the flip-flops 4[N] are connected to the data input 1 terminals of the selectors 2[N]. The output terminals of the selectors 2[N] are connected to the input terminals of the flip-flops 4[N]. The output terminals of the flip-flops 4[N] are connected to the data input 1 terminals of the selectors 2[N] as described above, and further to the input terminals DI[N] of the data circuit 1 and the selectors 3[N+1] in common. When N=3, in particular, the output terminal of the flip-flop 4[3] is connected to the data input 1 terminal of the selector 2[3], the input terminal DI[3] and the scan-out terminal so of the test circuit TCS in common.

When the test circuit TCS is provided on the output side of the data circuit 1, the following conversion may be made in the above description:

data input terminals IN→output terminals DO input terminals DI→data output terminals OUT The ordinary operation and the scan test operation can be made also by the aforementioned test circuit TCS.

A control circuit CTL4 according to this embodiment which supplies the test holding control signal thld and the shift mode control signal sm to the test circuit TCS is now described. The control circuit CTL4 is a circuit which is supplied with the test control signal TEST, the shift mode control signal SM, and the test holding control signal THLD0 and the holding control signal HLD0, and outputs the test holding control signal thld and the shift mode control signal sm to the test circuit TCS.

The control circuit CTL4 regularly outputs the shift mode control signal SM as the shift mode control signal sm. When the test control signal TEST is "0", the control circuit CTL4 outputs the holding control signal HLD0 as the test holding control signal thld. When the test control signal TEST is "1", the control circuit CTL4 outputs the test holding control signal THLD0 as the test holding control signal thld.

Connection of the control circuit CTL4 is described with reference to FIG. 20. The control circuit CTL4 includes a single selector 5. The test control signal TEST is inputted in a control terminal of the selector 5.

The holding terminal HLD0 is connected to a data input 0 terminal of the selector 5. The test holding control terminal THLD0 is connected to a data input 1 terminal of the selector 5. An output terminal of the selector 5 is connected to the test holding terminal thld of the test circuit TCS. The shift mode control terminal SM is directly connected to the shift mode terminal sm of the test circuit TCS.

In relation to a control circuit CTL4 which is employed on the output side of the data circuit 1, the following conversion may be made in the above description:

holding terminal HLD0→holding terminal HLD1 test holding terminal THLD0→test holding terminal THLD1

The ordinary operation and the scan test operation can be made also by the aforementioned test circuit TCS.

The circuit operations of the circuit shown in FIG. 20 are summarized as follows: Description is made on the case of providing the test circuits TCS on the input and output sides of the data circuit 1. The circuit operations include the ordinary operation and the scan test operation.

The ordinary circuit operation is identical to that of the circuit consisting of the control circuit CTL1, CTL2 or CTL3 and the test circuit TC.

The scan test operation is now described. Only in execution and data holding, the operations of the circuit consisting of the control circuit CTL4 and the test circuit TCS are different from those of the circuit consisting of the control circuit CTL3 and the test circuit TC. Therefore, description is made only on the execution and the data holding.

1. Execution

A circuit operation which is identical to that of the circuit consisting of the control circuit CTL3 and the test circuit TC is attained by setting the shift mode control signal SM and the test holding control signal THLD1 at "0".

2. Holding

In order to hold data on the input side in an intermediate stage of the scan test, the test holding control signal THLD0 may be set at "1". In order to hold the data on the output side, on the other hand, the test holding control signal THLD1 is set at "1".

The above are the circuit operations of the control circuit shown in FIG. 20. When the test circuits TCS are provided on the input and output sides of the data circuit 1 respectively, the input and output side test circuits TCS can be simultaneously controlled by the shift mode control signal SM.

A scan path which is formed by the aforementioned test circuit TCS is described. When the test circuit TCS is provided on the input side of the data circuit 1, two selectors 2 and 3 are included between each data input terminal IN and each input terminal DI of the logic circuit. Also when the test circuit TCS is provided on the output side of the data circuit 1, two selectors 2 and 3 are included between each output terminal DO and each data output terminal OUT. Therefore, only an operation speed which is similar to that of the conventional test circuit is attained in the ordinary operation.

However, each control circuit CTL4 controlling the test circuit TCS includes only one selector 5, whereby the circuit area can be reduced. Also in the test circuit TCS, its holding function can be employed in the ordinary operation and the scan test operation, whereby the circuit area can be reduced by eliminating the overhead.

Embodiment 3

An embodiment 3 of the present invention relates to a control circuit controlling a testing circuit.

The control circuit according to this embodiment is adapted to control a test circuit TC or CTC in a structure which is simpler than those of the control circuits according to the embodiments 1 and 2. The control circuit for controlling the test circuit TC or CTC supplies a test holding control signal thld and a shift mode control signal sm to the test circuit TC or CTC. The structure and the function of this circuit remain unchanged whether the same is employed for the test circuit TC or CTC, and hence the description is made only with reference to the test circuit TC. The following description is made on an input side of a data circuit 1, and this also applies to the output side.

Figure 21:
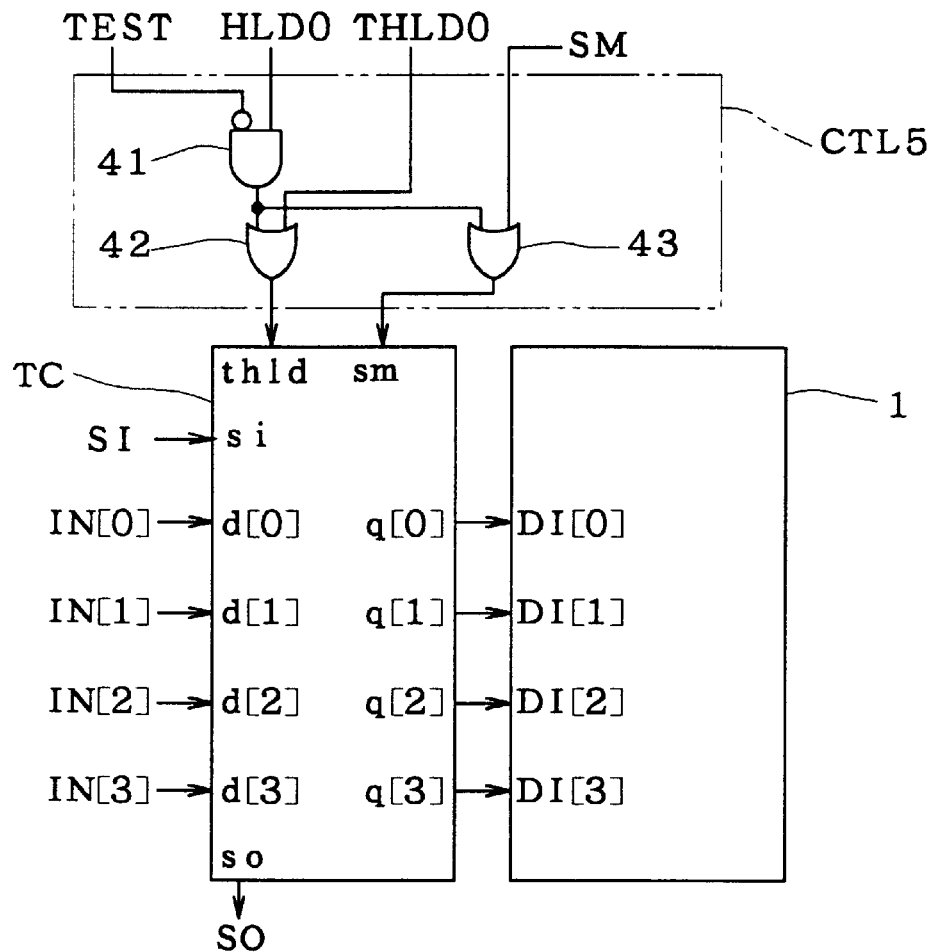
FIG. 21 is a circuit diagram showing a control circuit CTL5 according to an embodiment 3 of the present invention.

FIG. 21 is a circuit diagram showing a control circuit CTL5 according to this embodiment. The control circuit CTL5 receives a holding control signal HLD0, a test holding control signal THLD0, a shift mode control signal SM and a test control signal TEST, and supplies the test holding control signal thld and the shift mode control signal sm to the test circuit TC. The test holding control signal THLD0 is set at "0" in an ordinary operation, whereby the control circuit CTL5 is reduced in circuit area as compared with the control circuit according to the embodiment 2. When the control circuit CTL5 is provided on a test circuit TC on the output side, the following conversion may be made:

holding control signal HLD0→holding control signal HLD1 test holding control signal THLD0→test holding control signal THLD1

The structure of the control circuit CTL5 is described with reference to FIG. 21. The control circuit CTL5 can be formed by three gates. Each gate has two input terminals and one output terminal. These gates include a gate 41 and OR gates 42 and 43.

The gate 41 has an input terminal ge and an inversion input terminal re. This gate 41 executes the AND operation of an inverted logic of an input signal re which is inputted in the inversion input terminal re and an input signal ge which is inputted in the input terminal ge. Each of the OR gates 42 and 43 executes the OR operation of two input signals.

The state of connection of the control circuit CTL5 is described. A test terminal TEST is connected to the inversion input terminal of the gate 41. A holding terminal HLD0 is connected to the input terminal ge of the gate 41. The output terminal of the gate 41 is connected to the first input terminals of the OR gates 42 and 43 in common. A test holding terminal THLD0 is connected to the second input terminal of the OR gate 42. A shift mode terminal SM is connected to the second input terminal of the OR gate 43. The output terminals of the OR gates 42 and 43 output the test holding control signal thld and the shift mode control signal sm to the test circuit TC respectively.

Circuit operations of the control circuit shown in FIG. 21 are summarized as follows: The circuit operations include control of an ordinary operation and control of a scan test operation. Table 4 shows optimum set values of respective signals and data related to the control circuit CTL5 in the ordinary operation and the scan test.

TABLE 4

|  | Ordinary Operation |  | Scan Test |  |  |
| --- | --- | --- | --- | --- | --- |
|  | Input/Output Synchronization | Hold | Data Input | Data Execution Output | Hold |
| TEST | 0 |  |  | 1 |  |
| SM | 0 |  | 1 | 0 | 1 | 1 |
| HLD0 | 0 | 1 |  | DC |  |
| THLD0 | 0 |  | 0 | 0 | 0 | 1 |
| SI | DC |  | 1/0 | DC | 1/0 | DC |

The difference between the ordinary circuit operations of the control circuits CTL5 and CTL3 is now described. The test control signal TEST is set at "0" in the ordinary operation similarly to the setting in the control circuit CTL3, the shift mode control signal SM and the test holding control signal THLD0 are set at "0" in the control circuit CTL5, in particular. Due to such setting, the circuit operation of the control circuit CTL5 in the ordinary operation is identical to that of the control circuit CTL3.

The circuit operation of the control circuit CTL5 in the scan test operation is identical to that of the control circuit CTL3, and hence redundant description is omitted.

Also when the test circuit TC is controlled by the control circuit CTL5, the control of the ordinary operation and that of the scan test operation shown in the embodiment 2 can be attained.

The control circuit CTL5 is formed by three gates, whereby the circuit area of the semiconductor device can be reduced by making control with the control circuit CTL5 while setting the test holding control signal at "0".

Figure 22:
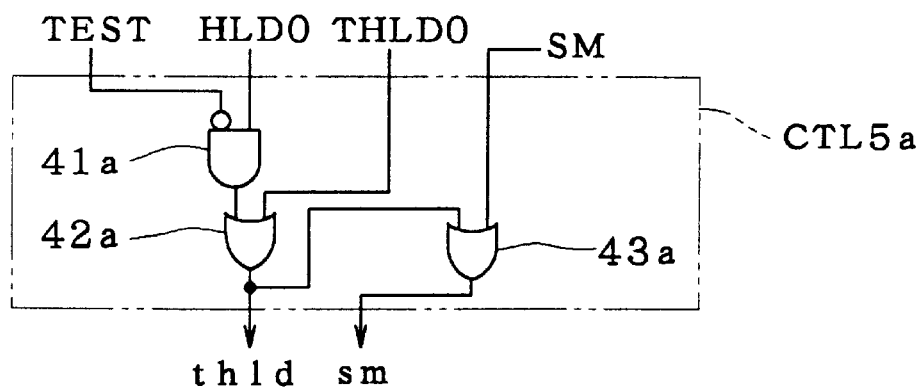

FIG. 22 shows a control circuit CTL5a which is formed similarly to the control circuit CTL5, to have the same function.

Description on the structure and connection of the control circuit CTL5a is made with reference to the difference between the same and the control circuit CTL5. Similarly to the control circuit CTL5, the control circuit CTL5a can be formed by three gates including a gate 41a and OR gates 42a and 43a. The gate 41a and the OR gates 42a and 43a are identical in structure and function to the gate 41 and the OR gates 42 and 43 respectively.

While the output terminal of the gate 41 is connected to the first input terminal of the OR gate 43 in the control circuit CTL5, an output terminal of the OR gate 42a is connected to a first input terminal of the OR gate 43a in the control circuit CTL5a.

No difference results in the circuit operations of the control circuits CTL5 and CTL5a due to the aforementioned difference in connection, and hence description on the circuit operations is omitted.

The control circuit CTL5a is formed similarly to the control circuit CTL5, and its circuit operations are identical to those of the control circuit CTL5. Therefore, an effect which is similar to that of the control circuit CTL5 can be attained by employing the control circuit CTL5a.

Description is now made on a control circuit CTL6 which can control a test circuit TC or CTC without receiving a test control signal TEST, similarly to the control circuit CTL2 shown in the embodiment 1.

Figure 23:
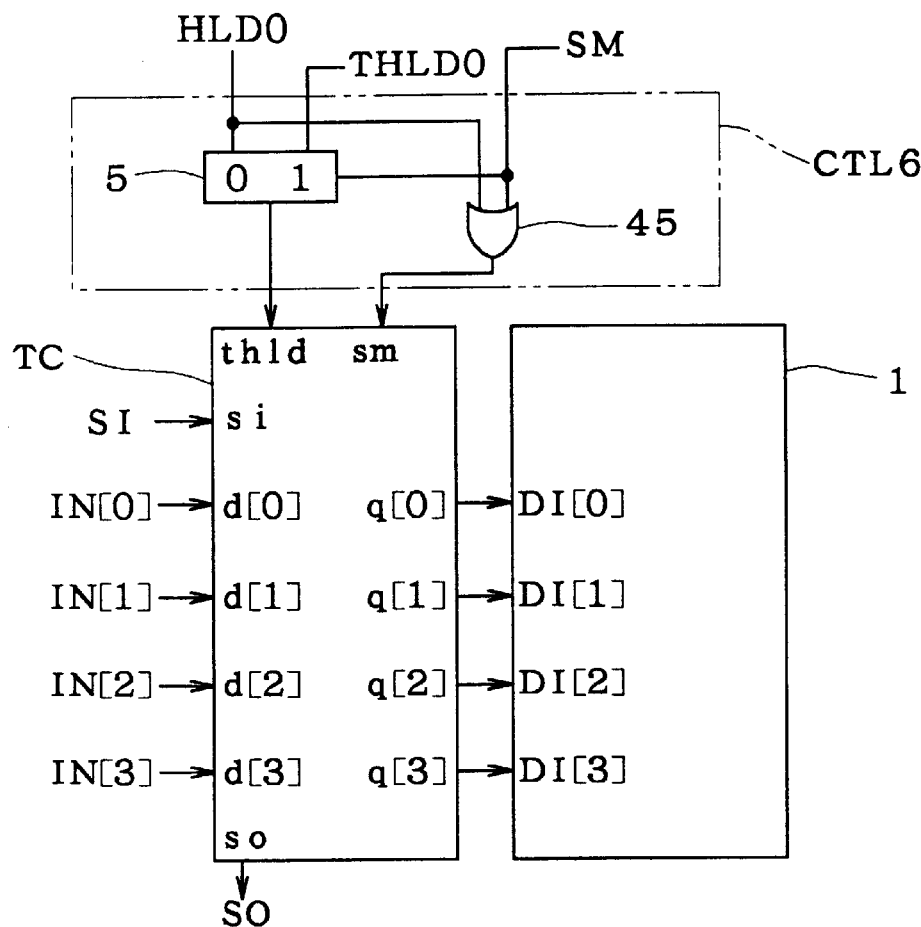
FIG. 23 is a circuit diagram showing a control circuit CTL6.

FIG. 23 is a circuit diagram showing the control circuit CTL6 according to this embodiment. While the shift mode control signal SM is set at "0" in the control circuit CTL5, the test terminal TEST is omitted in the control circuit CTL6 by further setting the holding control signal HLD0 at "0" in the scan test operation.

When the control circuit CTL6 is provided for an output side test circuit TC, the following conversion may be made:

holding control signal HLD0→holding control signal HLD1 test holding control signal THLD0→test holding control signal THLD1

The structure of the control circuit CTL6 is described with reference to FIG. 23. The control circuit CTL6 is formed by a selector 5 and an OR gate 45.

The state of connection of the control circuit CTL6 is now described. The selector 5 has a data input 0 terminal, a data input 1 terminal, an output terminal, and a control terminal. The holding terminal HLD0 is connected to the data input 0 terminal of the selector 5 and a first input terminal of the OR gate 45 in common. The test holding terminal THLD0 is connected to the data input 1 terminal of the selector 5. The shift mode terminal SM is connected to the control terminal of the selector 5 and a second input terminal of the OR gate 45 in common. The output terminals of the selector 5 and the OR gate 45 output the test holding control signal thld and the shift mode control signal sm to the test circuit TC respectively.

Circuit operations of the control circuit shown in FIG. 23 are summarized as follows: The circuit operations include control of an ordinary operation and control of a scan test operation. Table 5 shows optimum set values of the respective signals and data related to the control circuit CTL6 in the ordinary operation and the scan test.

TABLE 5

|  | Ordinary Operation |  | Scan Test |  |  |
| --- | --- | --- | --- | --- | --- |
|  | Input/Output Synchronization | Hold | Data Input | Data Execution Output | Hold |
| SM | 0 |  | 1 | 0 | 1 | 1 |
| HLD0 | 0 | 1 |  | 0 |  |
| THLD0 | DC |  | 0 | 0 | 0 | 1 |
| SL | DC |  | 1/0 | DC | 1/0 | DC |

In the ordinary operation, a circuit operation which is identical to those of the control circuits CTL3 and CTL5 can be attained by setting the shift mode control signal SM at "0".

The circuit operation of the control circuit CTL6 in the scan test operation is now described. In the scan test operation, the shift mode control signal SM is set at "1" when shift-in of test patterns, shift-out of test results and holding of data are performed. At this time, the circuit operation of the control circuit CTL6 is identical to those of the control circuits CTL3 and CTL5. When execution is made in the scan test operation, the shift mode control signal SM and the holding control signal HLD0 are set at "0", so that the circuit operation of the control circuit CTL6 is identical to those of the control circuits CTL3 and CTL5.

Also when the test circuit TC is controlled by the control circuit CTL6, therefore, the control of the ordinary operation and that of the scan test operation shown in the embodiment 2 can be attained.

The control circuit CTL6 can control the test circuit TC without employing the test terminal TEST, by setting the holding control signal HLD0 at "0" in the scan test operation. The circuit area of the semiconductor device can be reduced by employing the control circuit according to this embodiment, since the test terminal TEST can be omitted.

Figure 24:
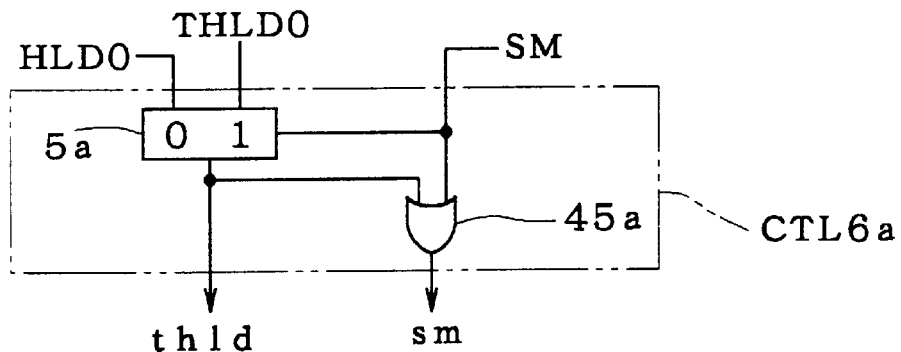

FIG. 24 shows a control circuit CTL6a which is formed similarly to the control circuit CTL6, to have the same function.

The structure of the control circuit CTL6a is described with reference to FIG. 24. The control circuit CTL6a is formed by a selector 5a and an OR gate 45a which are identical in structure and function to the selector 5 and the OR gate 45 forming the control circuit CTL6.

While the holding terminal HLD0 is connected to the first input terminal of the OR circuit 45 in the control circuit CTL6, an output terminal of the selector 5a is connected to a first input terminal of the or gate 45a in the control circuit CTL6a. No difference in circuit operation results from this difference in the state of connection but the circuit operations of the control circuit CTL6a are identical to those of the control circuit CTL6. Thus, operations which are similar to those of the control circuit CTL6 can be performed also when the control circuit CTL6a is employed.

Therefore, the control of the ordinary operation and that of the scan test operation shown in the embodiment 2 can be attained also when the test circuit TC is controlled by the control circuit CTL6a. Further, an effect which is identical to that of the control circuit CTL6 can be attained by the control circuit CTL6a.

A control circuit which is obtained by further simplifying the structure of the control circuit indicated in this embodiment is now shown.

Figure 25:
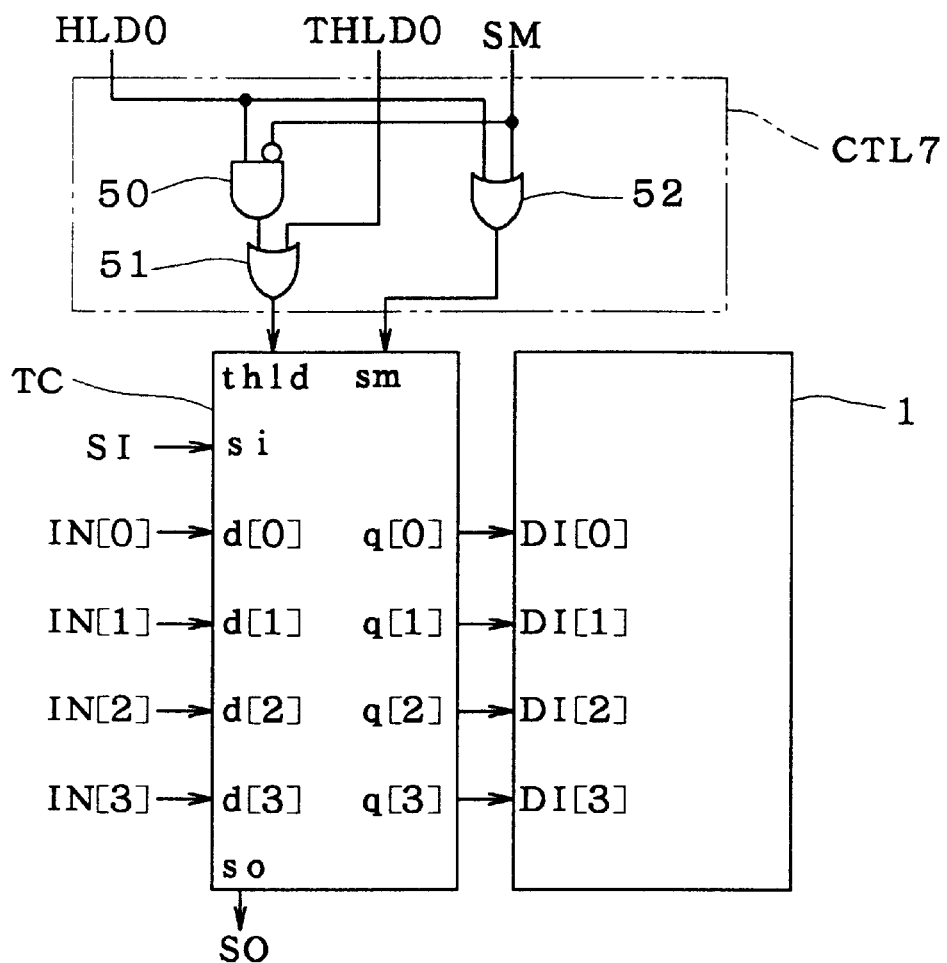
FIG. 25 is a circuit diagram showing a control circuit CTL7.

FIG. 25 is a circuit diagram showing a control circuit CTL7 according to this embodiment. Terminals provided in the control circuit CTL7 are identical to those provided in the control circuit CTL6. Further, the circuit structure of the control circuit CTL7 is extremely similar to that of the control circuit CTL5. Table 6 shows optimum set values of respective signals and data related to the control circuit CTL7 in an ordinary operation and a scan test.

TABLE 6

|  | Ordinary Operation | | Scan Test | | | |
| --- | --- | --- | --- | --- | --- | --- |
|  | Input/Output Synchronization | Hold | Data Input | Execution | Data Output | Hold |
| SM | 0 |  | 1 | 0 | 1 | 1 |
| HLD0 | 0 | 1 |  |  | 0 |  |
| THLD0 | 0 |  | 0 | 0 | 0 | 1 |
| SI | DC |  | 1/0 | DC | 1/0 | DC |

In the control circuit CTL7, circuit operations which are identical to those of the control circuits CTL5 and CTL6 can be attained with a small circuit structure by setting the shift mode control signal SM and the test holding control signal THLD0 at "0" in the ordinary operation while setting the holding control signal HLD0 at "0" in the scan test operation respectively.

The structure and the state of connection of the control circuit CTL7 are described with reference to FIG. 25. Similarly to the control circuit CTL5, the control circuit CTL7 can be formed by three gates including a gate 50 and OR gates 51 and 52. The gate 50 is identical in structure and function to the gate 41 forming the control circuit CTL5.

The state of connection of the control circuit CTL7 is described with reference to the difference between the same and the control circuit CTL5. In the control circuit CTL5, the test terminal TEST is connected to the inversion input terminal re of the gate 41, and the holding terminal HLD0 is connected to the first input terminal of the OR gate 43. On the other hand, the shift mode terminal SM is connected to an inversion input terminal of the gate 50, and the holding terminal HLD0 is connected to a first input terminal of the OR gate 52. As to connection of the remaining terminals, the control circuits CTL5 and CTL7 are identical to each other.

In order to understand circuit operations of the control circuit CTL7, it is sufficient to understand operations of the gate 50 whose inversion input terminal re is connected with the shift mode control terminal SM and the OR gate 52 whose first input terminal is connected with the holding terminal HLD0.

The operation of the gate 50 is first described. In the control operation employing the control circuit CTL5, the values of the test control signal TEST and the shift mode control signal SM are different only in execution of the scan test, with reference to the ordinary operation and the scan test operation. As to the gate 50 whose inversion input terminal re is connected with the shift mode terminal SM, therefore, only execution of the scan test may be considered. In execution of the scan test, however, the OR gate 52 whose output terminal is connected to a control terminal of a selector 3 may simply output "0", and the shift mode control signal SM is set at "0" in execution of the scan test, whereby this condition is satisfied. Therefore, the operation of the gate 50 exerts no influence on the execution of the scan test.

The operation of the OR gate 52 is now described. When the shift mode control signal SM is "1", the OR gate 52 necessarily outputs "1", similarly to the operation of the OR gate 43. Therefore, the ordinary operation and execution of the scan test in which the shift mode control signal SM is "0" may be understood. The execution of the scan test has already been described with reference to the gate 50. The OR gate 52 may output "0" in the ordinary operation, and the holding control signal HLD0 is set at "0" in the ordinary operation, whereby this condition is satisfied.

It is understood from the above description that the circuit operations of the control circuits CTL7 and CTL5 are identical to each other.

Therefore, the control of the ordinary operation and that of the scan test operation shown in the embodiment 2 can be attained also by controlling the test circuit TC by the control circuit CTL7.

Since the control circuit CTL7 is formed by three gates, the circuit area of the semiconductor device can be reduced as compared with the case of making control with the control circuit CTL6 by making control with the control circuit CTL7 while setting the test holding control signal THLD0 at "0".

Further, the control circuit CTL7 can control the test circuit without employing the test terminal TEST by setting the holding control signal HLD0 at "0" in the scan test operation. The test terminal TEST can be omitted, whereby the circuit area of the semiconductor device is further reduced when the control circuit according to this embodiment is employed.

Figure 26:
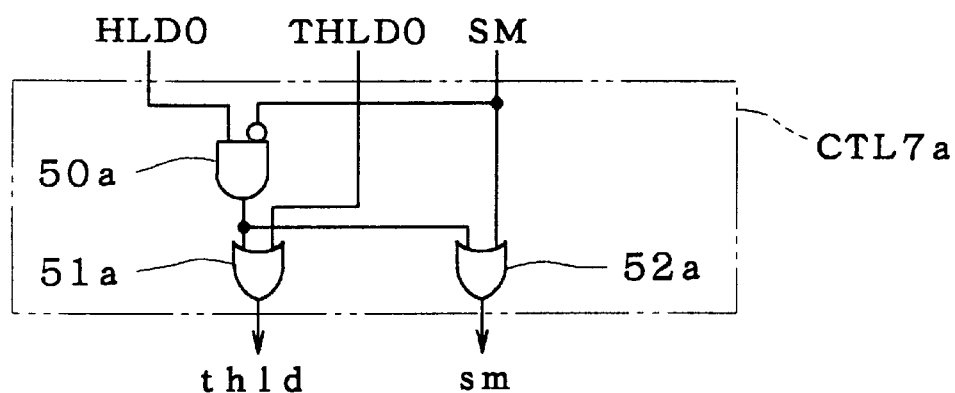
Figure 27:
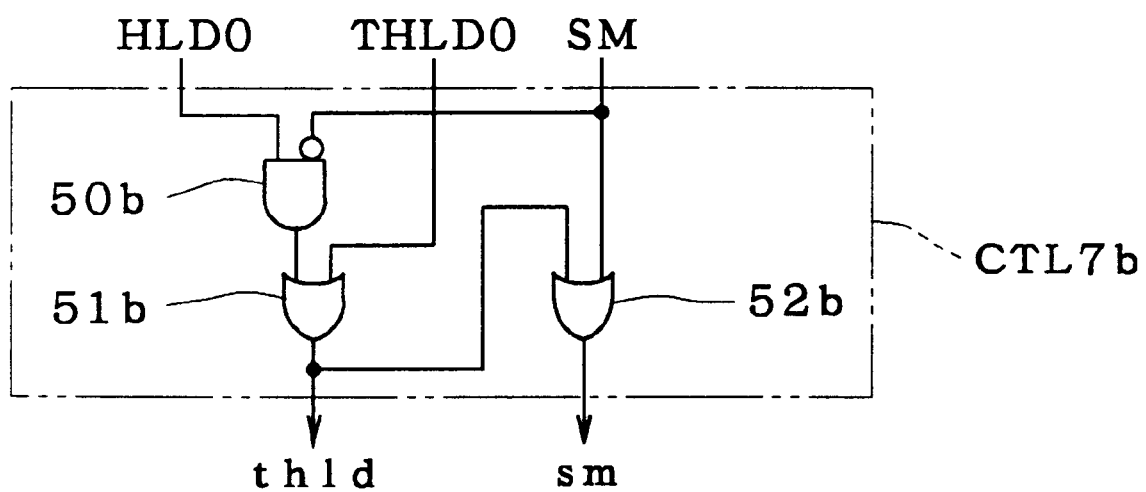
FIG. 27 is a circuit diagram showing a control circuit CTL7b.

FIGS. 26 and 27 show control circuits CTL7a and CTL7b which are formed similarly to the control circuit CTL7 to have the same functions. FIGS. 26 and 27 are circuit diagrams showing the control circuits CTL7a and CTL7b according to this embodiment respectively.

Differences between the structures of the control circuits CTL7a and CTL7b and that of the control circuit CTL7 are described with reference to FIGS. 26 and 27. The control circuit CTL7a is formed by a gate 50a and OR gates 51a and 52a, while the control circuit CTL7b is formed by a gate 50b and OR gates 51b and 52b. The gates 50a and 50b and the OR gates 51a, 51b, 52a and 52b are identical in function and structure to the gate 50 and the OR gates 51 and 52 respectively.

The states of connection of the control circuits CTL7a and CTL7b are now described with differences between the same and the control circuit CTL7. In the control circuit CTL7, the holding terminal HLD0 is connected to the first input terminal of the OR gate 52. In the control circuit CTL7a, an output terminal of the gate 50a is connected to a first input terminal of the OR gate 52a. In the control circuit CTL7b, an output terminal of the OR gate 51b is connected to a first input terminal of the OR gate 52b.

No differences result in the circuit operations of the control circuits CTL7, CTL7a and CTL7b due to the aforementioned differences in connection, so test circuits TC can be controlled by the control circuits CTL7a and CTL7b in place of the control circuit CTL7.

The test circuits TC can be controlled by the various control circuits shown in this embodiment.

Embodiment 4

In an embodiment 4 of the present invention, the test circuits TC and CTC shown in the embodiment 2 are employed to form a scan path, to be employed for an operation test of a RAM.

Figure 28:
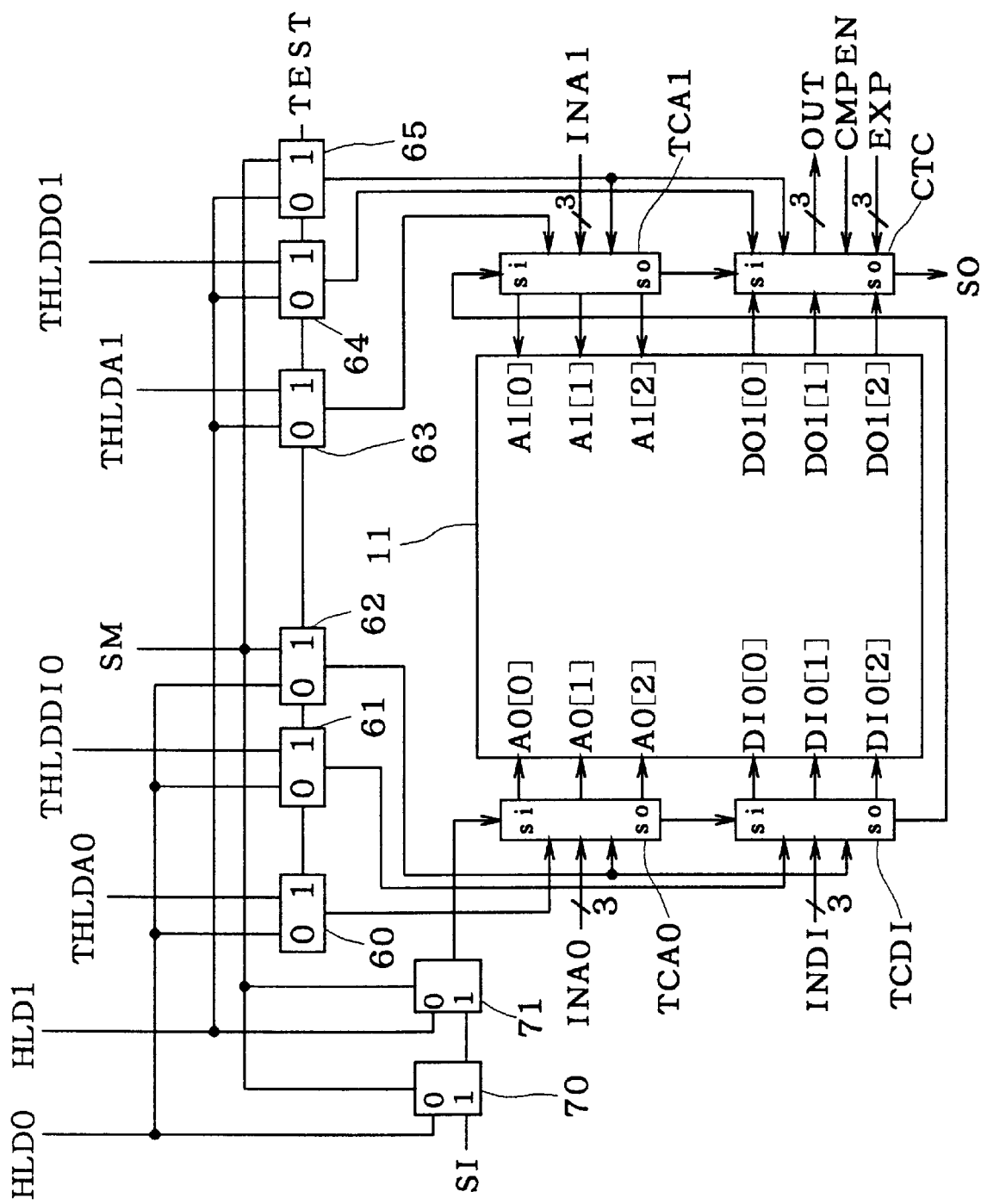
FIG. 28 is a circuit diagram showing a RAM provided with a scan path according to an embodiment 4 of the present invention.

FIG. 28 is a circuit diagram showing the RAM which is provided with a testing circuit. Elements having the same structures and functions with those shown in the embodiments 1 to 3 are denoted by the same reference numerals.

As shown in FIG. 28, the RAM 11 which is a logic circuit is input/output-controlled by test circuits TCA0, TCD1, TCA1 and CTC which define the testing circuit.

The RAM 11 is now described. The RAM 11 comprises address input terminals A0[0] to A0[2] for address writing and input terminals DI0[0] to DI0[2] for data input, for writing in the RAM 11. Further, the RAM 11 comprises address input terminals A1[0] to A1[2] for address writing and output terminals DO1[0] to DO1[2] for data output, for reading data from the RAM 11.

The RAM 11 is a circuit writing input data DI0[0] to DI0[2] which are supplied in the input terminals DI0[0] to DI0[2] in addresses specific to input data A0[0] to A0[2] which are supplied to the address input terminals A0[0] to A0[2]. Further, the RAM 11 is a circuit outputting data which are inputted in specific addresses corresponding to input data A1[0] to A1[2] which are supplied to the address input terminals A1[0] to A1[2] from data output terminals DO1[0] to DO1[2]. While the RAM 11 shown in this embodiment is of three bits, the testing circuit according to this embodiment can be applied to a RAM of any bit number.

Terminals for inputting data in the address input terminals A0[0] to A0[2] are data input terminals INA0[0] to INA0[2], those for inputting data in the input terminals DI0[0] to DI0[2] are data input terminals INDI[0] to INDI[2], those for inputting data in the address input terminals A1[0] to A1[2] are data input terminals INA1[0] to INA1[2], and those for outputting data from the output terminals DO1[0] to DO1[2] are data output terminals OUT[0] to OUT[2].

The test circuits TCA0, TCDI, TCA1 and CTC are now described. The test circuits TCA0, TCDI and TCA1 are similar in structure and operation to the test circuit TC. The test circuit TCA0 is inserted between the address input terminal A0[0] to A0[2] and INA0[0] and INA0[2]. The test circuit TCDI is inserted between the input terminals DI0[0] to DI0[2] and INDI[0] to INDI[2]. The test circuit TCA1 is inserted between the address input terminals A1[0] to A1[2] and the output terminals INA1[0] to INA1[2]. The test circuit CTC is inserted between the output terminals DO1[0] to DO1[2] and OUT[0] to OUT[2].

Description is made on connection between a scan-in terminal SI and a scan-out terminal SO which are employed for making a scan test and the test circuits TCA0, TCDI, TCA1 and CTC.

Referring to FIG. 28, the scan path is formed as the scan-in terminal SI→scan flip-flops 70 and 71→a scan-in terminal si of the test circuit TCA0→a scan-out terminal so of the test circuit TCA0→a scan-in terminal si of the test circuit TCDI→a scan-out terminal so of the test circuit TCDI→a scan-in terminal si of the test circuit TCA1→a scan-out terminal so of the test circuit TCA1→a scan-in terminal si of the test circuit CTC→a scan-out terminal so of the test circuit CTC→the scan-out terminal SO. The scan flip-flops 70 and 71 may be provided any of between the test circuits TCA0 and TCDI, between the test circuits TCDI and TCA1, between the test circuits TCA1 and CTC, and between the test circuit CTC and the scan-out terminal SO.

The scan flip-flops 70 and 71 are now described. The scan flip-flops 70 and 71 are scan flip-flops which are employed for observing holding control signals HLD0 and HOD1 respectively. Similarly to the scan flip-flop HSFF shown in FIG. 6, each of the scan flip-flops 70 and 71 is formed by one selector and one flip-flop. The data input 0 terminal, the data input 1 terminal and the control terminal of the selector 14 forming the scan flip-flop HSFF can be regarded as those of the scan flip-flop HSFF itself. Similarly, each of the scan flip-flops 70 and 71 comprises a data input 0 terminal, a data input 1 terminal, an output terminal, and a control terminal. In response to a signal inputted in the control terminal, each of the scan flip-flop 70 and 71 outputs either one of signals which are inputted in the data input 0 terminal and the data input 1 terminal.

Each of the test circuits TCA0, TCDI, TCA1 and CTC comprises a test holding terminal thld and a shift mode terminal sm, and is supplied with a test holding control signal thld and a shift mode control signal sm respectively. Further, the test circuit CTC further comprises a comparison terminal cmpen and expected terminals exp[0] to exp[2], and is supplied with a comparison enable signal CMPEN and expected data EXP[0] to EXP[2] respectively.

A circuit supplying the test holding control signal thld and the shift mode control signal sm to the test circuits TCA0, TCDI, TCA1 and CTC respectively is now described. The circuit supplying the test holding control signal thld and the shift mode control signal sm is formed by selectors 60 to 65.

Each of the selectors 60 to 65 comprises a data input 0 terminal, a data input 1 terminal, an output terminal, and a control terminal. A test terminal TEST is connected to the control terminals of the selectors 60 to 65 in common.

The output terminals of the selectors 60 and 61 are connected to the test holding terminals thld of the test circuits TCA0 and TCDI respectively, to supply the test holding control signals thld thereto independently of each other. The output terminal of the selector 62 is connected to the respective shift mode terminals sm of the test circuits TCA0 and TCDI in common, to supply the shift mode control signal sm in common. Similarly, the output terminals of the selectors 63 and 64 are connected to the test holding terminals thld of the test circuits TCA1 and CTC respectively, to supply the test holding control signals thld thereto independently of each other. The output terminal of the selector 65 is connected to the respective shift mode terminals sm of the test circuits TCA1 and CTC, to supply the shift mode control signal sm in common.

The holding terminals are now described. The holding terminal HLD0 is connected to the respective data input 0 terminals of the scan flip-flop 70 and the selectors 60 to 62 in common. Similarly, the holding terminal HLD1 is connected to the respective data input 0 terminals of the scan flip-flop 71 and the selectors 63 to 65 in common. The shift mode terminal SM is connected to the respective data input 1 terminals of the selectors 62 and 65 and the respective control terminals of the scan flip-flops 70 and 71 in common. Test holding terminals THLDA0 and THLDDI0 are connected to the data input 1 terminals of the selectors 60 and 61 respectively. Test holding terminals THLDA1 and THLDDO1 are connected to the data input 1 terminals of the selectors 63 and 64 respectively.

The circuit operations of the circuit shown in FIG. 28 are described. The circuit operations include an ordinary operation and test operations. The test operations include an ordinary scan test operation and a scan test operation employing a test result compression function.

The ordinary operation is first described. In the ordinary operation, the test control signal TEST and the comparison enable signal CMPEN are set at "0". When the test control signal TEST is "0", the selectors 60 to 65 output data inputted in the data input 0 terminals respectively. Therefore, the holding control signal HLD0 is supplied to the test circuits TCA0 and TCDI as the test holding control signal thld and the shift mode control signal sm. The holding control signal HLD1 is supplied to the test circuits TCA1 and CTC as the test holding control signal thld and the shift mode control signal sm. If the holding control signal HLD0 is "0" at this time, input data INA0 and INDI are incorporated in the address input terminals A0 and the input terminals DI of the RAM 11 through the test circuits TCA0 and TCDI respectively. When the holding control signal HLD0 is "1", on the other hand, the input data INA0 and INDI are held in the test circuits TCA0 and TCDI. When the holding control signal HLD1 is "0", the input data INA1 are similarly incorporated in the address input terminals A1 of the RAM 11 through the test circuit TCA1. The output data DO1 are outputted from the data output terminals OUT through the test circuit CTC. When the holding control signal HLD1 is "1", the input data INA1 and the output data DO1 are held in the test circuits TCA1 and CTC.

Namely, the holding control signal HLD0 simultaneously controls data holding in the test circuits TCA0 and TCD1 in the ordinary operation. Further, the holding control signal HLD1 simultaneously controls data holding in the test circuits TCA1 and CTC. Therefore, data holding in the write address input terminals A0 and the input terminals DI0 and data holding in the read address input terminals A1 and the output terminals DO1 are controlled independently of each other.

The test operation is now described. In the test operation, the test control signal TEST is set at "1", and the comparison enable signal CMPEN is set at "0". When the test control signal TEST is "1", the selectors 60 to 65 output data which are inputted in the data input 1 terminals respectively. At this time, a test holding control signal THLDA0 and the shift mode control signal SM are inputted in the test circuit TCA0 as the test holding control signal thld and the shift mode control signal sm respectively. A test holding control signal THLDDI0 and the shift mode control signal SM are inputted in the test circuit TCDI as the test holding control signal thld and the shift mode control signal sm respectively. Further, a test holding control signal THLDA1 and the shift mode control signal SM are inputted in the test circuit TCA1 as the test holding control signal thld and the shift mode control signal sm respectively. A test holding control signal THLDDO1 and the shift mode control signal SM are inputted in the test circuit CTC as the test holding control signal thld and the shift mode control signal sm respectively.

Control in the test operation is summarized. The shift mode control signal SM is inputted in the test circuits TCA0, TCDI, TCA1 and CTC in common as the shift mode control signal sm, for controlling selection of data inputted in the test circuits TCA0, TCDI, TCA1 and CTC. Data holdings in the test circuits TCA0, TCDI, TCA1 and CTC are independently made by the test holding control signals THLDA0, THLDDI0, THLDA1 and THLDDO1 respectively.

Data holding in each test circuit is independently carried out, whereby the following advantage is attained:

Consider that the path from the address input terminals A0 and A1 and the input terminals DI to the output terminals DO includes two flip-flops consisting of single flip-flops on input and output terminal sides. Consider that a logic circuit 12 which must be synchronized with the RAM 11 is present. It is assumed that a path between input and output terminals of the logic circuit 12 includes three flip-flops, for example. In order to attain synchronization between the RAM 11 and the logic circuit 12, data may be held in the RAM 11 by a time required for passing data through one flip-flop. Namely, synchronization can be attained by holding data by difference between the numbers of the flip-flops included in the path.

In the circuit shown in FIG. 28, data holding in the write address input terminals A0 and the input terminals DI and that in the read address input terminals A1 and the output terminals DO are controlled independently of each other. Therefore, the output of the RAM 11 can be synchronized while flexibly coping with the number of the flip-flops forming the path and being included in the logic circuit 12 which must be synchronized therewith.

In the test operation, data holding in the address input terminals A0, that in the input terminals DI, that in the address input terminals A1 and that in the output terminals DO are controlled independently of each other. Therefore, the operation test of the RAM 11 can be efficiently made.

Figure 29:
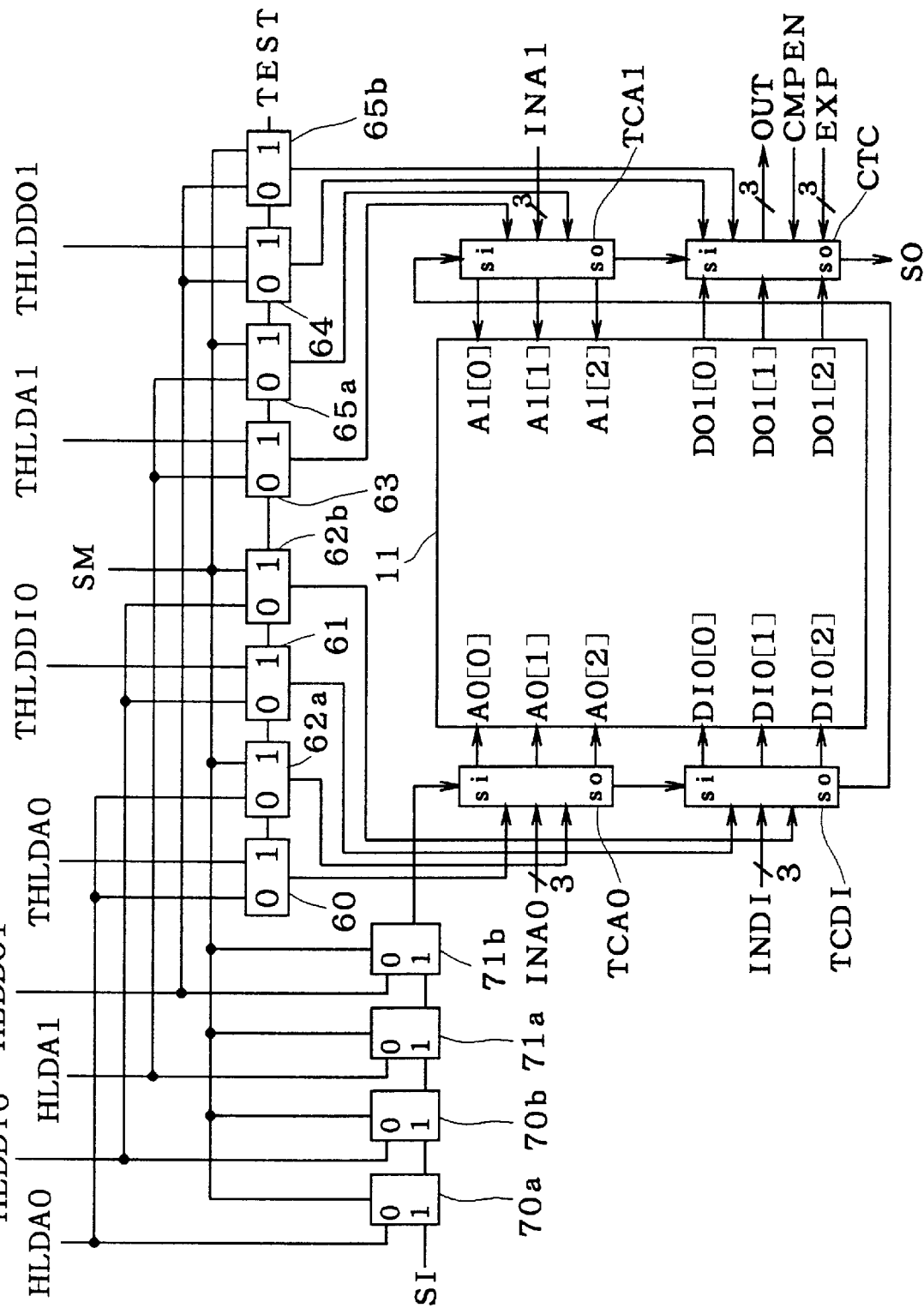
FIG. 29 is a circuit diagram showing a circuit which is formed by further improvement of that appearing in FIG. 28.
Figure 30:
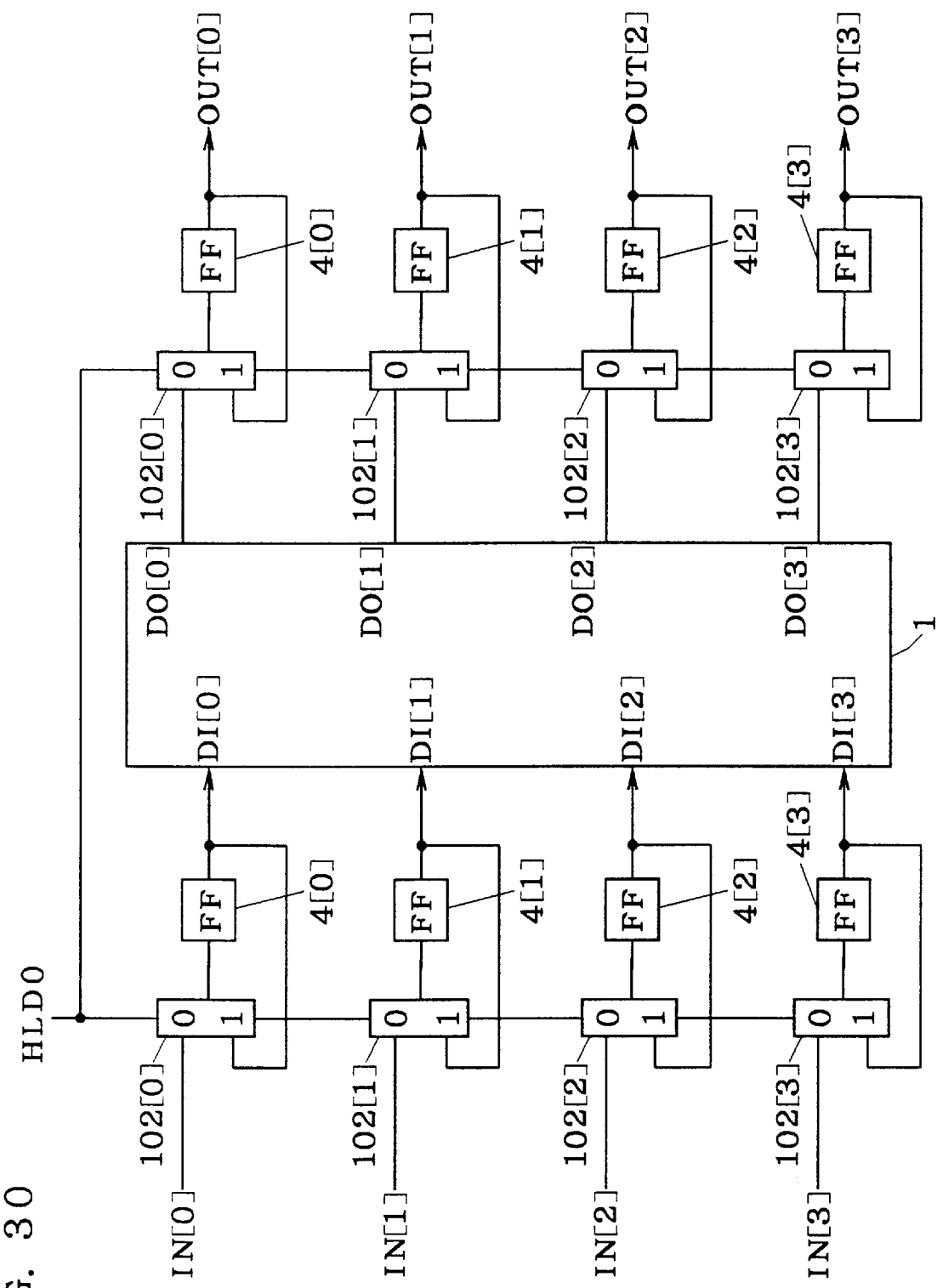
FIG. 30 is a circuit diagram showing a logic circuit having a holding function.
Figure 31:
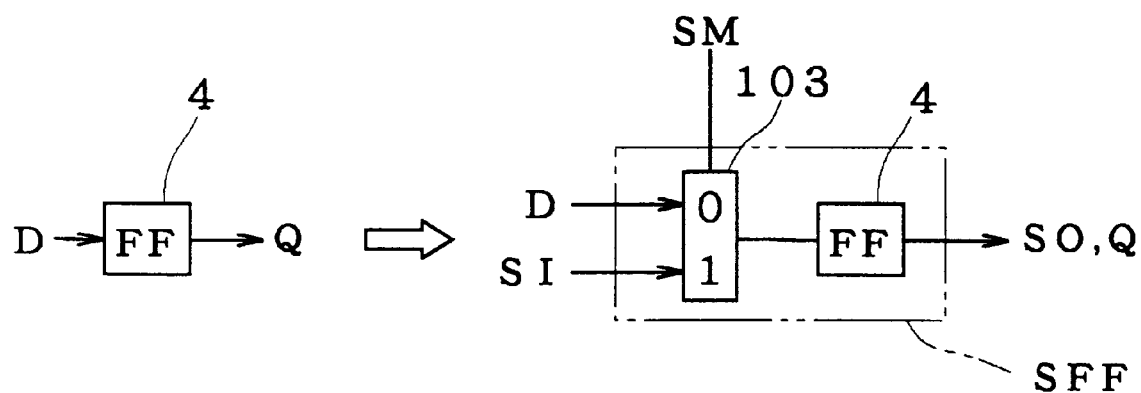
FIG. 31 is a circuit diagram showing a state of scan-converting of a flip-flop 4.
Figure 32:
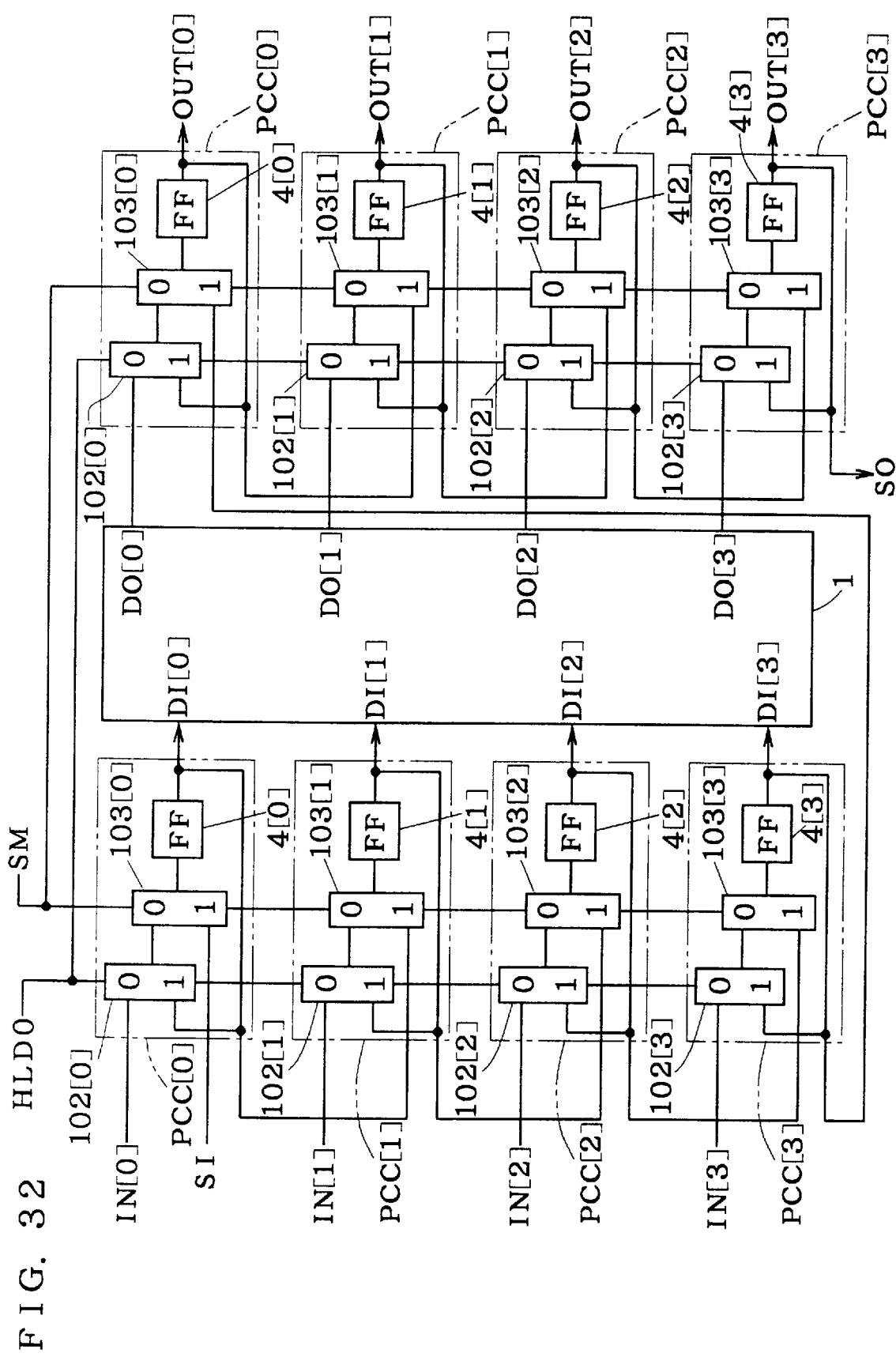
FIG. 32 is a circuit diagram showing a circuit formed by scan-converting of the flip-flop appearing in FIG. 30.
Figure 33:
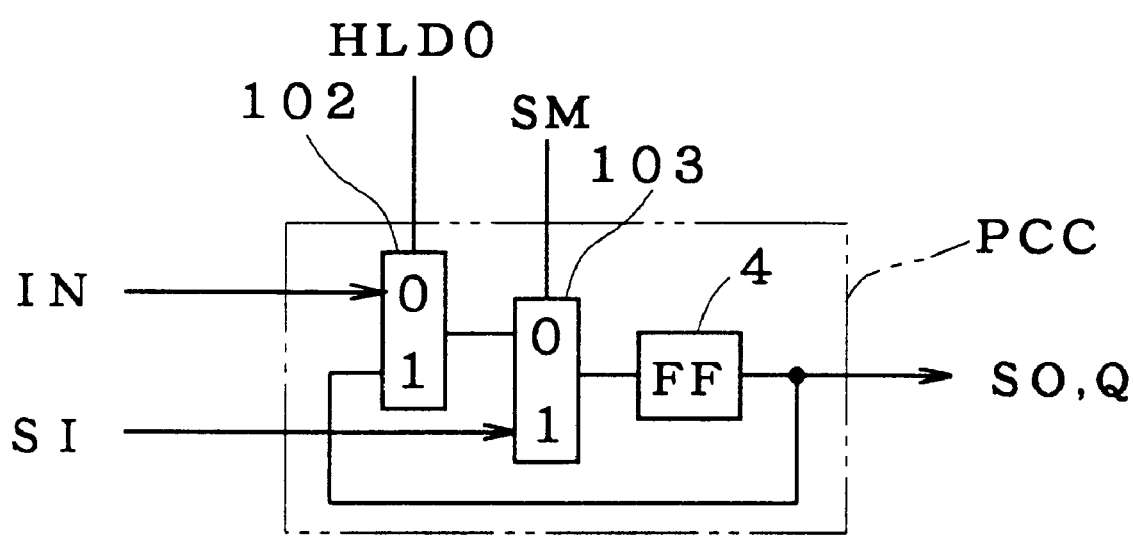
FIG. 33 is a circuit diagram showing a connection circuit PCC.

FIG. 29 shows a circuit which can control data holding in address input terminals A0, that in input terminals DI, that in address input terminals A1 and that in output terminals DO independently of each other also in an ordinary operation.

FIG. 29 is a circuit diagram showing a RAM 11 provided with a testing circuit. Similarly to the circuit shown in FIG. 28, the RAM 11 which is a logic circuit is input/output-controlled by test circuits TCA0, TCDI, TCA1 and CTC which define a testing circuit.

In order to independently control data holding in the ordinary operation, the holding terminals shown in FIG. 28 are converted as follows:

holding terminal HLD0→holding terminals HLDA0 and HLDDI0 holding terminal HLD1→holding terminals HLDA1 and HLDDO1

Following such conversion of the holding terminals, the following conversion is made also as to selectors and scan flip-flops:

selector 62→selectors 62a and 62b selector 65→selectors 65a and 65b scan flip-flop 70→scan flip-flops 70a and 70b scan flip-flop 71→scan flip-flops 71a and 71b The selectors 62a, 62b, 65a and 65b are identical in structure and function to the selectors 62 and 65. Similarly, the scan flip-flops 70a, 70b, 71a and 71b are identical in structure and function to the scan flip-flops 70 and 71. With respect to the circuit shown in FIG. 29, only a part which is different from that of the circuit shown in FIG. 28 is now described.

The scan flip-flops 70a, 70b, 71a and 71b are now described. The scan flip-flops 70a, 70b, 71a and 71b are scan flip-flops which are employed for observing holding control signals HLDA0, HLDDI0, HLDA1 and HLDDO1 respectively. The scan flip-flops 70a, 70b, 71a and 71b comprise data input 0 terminals, data input 1 terminals, output terminals and control terminals respectively. In response to signals inputted in the control terminals, the scan flip-flops 70a, 70b, 71a and 71b output either signals inputted in the data input 0 terminals or those inputted in the data input 1 terminals respectively.

A circuit supplying the test holding control signal thld and the shift mode control signal sm to test circuits TCA0, TCDI, TCA1 and CTC respectively is described. The circuit supplying the test holding control signal thld and the shift mode control signal sm is formed by selectors 60, 61, 62a, 62b, 63, 64, 65a and 65b.

The selectors 60, 61, 62a, 62b, 63, 64, 65a and 65b are selectors comprising data input 0 terminals, data input 1 terminals, output terminals and control terminals respectively. The test terminal TEST is connected to the control terminals of these selectors in common.

The output terminals of the selectors 60 and 62a are connected to the test holding terminal thld and the shift mode terminal sm of the test circuit TCA0 respectively, to supply the test holding control signal thld and the shift mode control signal sm. Due to similar connection, the selectors 61 and 62b supply the test holding control signal thld and the shift mode control signal sm to the test circuit TCDI. The selectors 63 and 65a supply the test holding control signal thld and the shift mode control signal sm to the test circuit TCA1. The selectors 64 and 65b supply the test holding control signal thld and the shift mode control signal sm to the test circuit CTC.

Holding terminals are now described. A holding terminal HLDA0 is connected to the data input 0 terminals of the scan flip-flop 70a and the selectors 60 and 62a in common. A holding terminal HLDDI0 is connected to the data input 0 terminals of the scan flip-flop 70b and the selectors 61 and 62b in common. Similarly, a holding terminal HLDA1 is connected to the data input 0 terminals of the scan flip-flip 71a and the selectors 63 and 65a in common. A holding terminal HLDDO1 is connected to the data input 0 terminals of the scan flip-flop 71b and the selectors 64 and 65b in common. A shift mode terminal SM is connected to the data input 1 terminals of the selectors 62a, 62b, 65a and 65b and the control terminals of the scan flip-flops 70a, 70b, 71a and 71b in common. Test holding terminals THLDA0 and THLDDI0 are connected to the data input 1 terminals of the selectors 60 and 61 respectively. Test holding terminals THLDA1 and THLDDO1 are connected to the data input I terminals of the selectors 63 and 64 respectively.

The circuit operations of the circuit shown in FIG. 29 are now described. Similarly to the circuit shown in FIG. 28, the circuit operations include an ordinary operation and test operations.

The ordinary operation is now described. In the ordinary operation, the test control signal TEST and the comparison enable signal CMPEN are set at "0". When the test control signal TEST is "0", the selectors 60, 61, 62a, 62b, 63, 64, 65a and 65b output data inputted in the data input 0 terminals respectively. Therefore, the holding control signal HLDA0 is supplied to the test circuit TCA0 as the test holding control signal thld and the shift mode control signal sm. The holding control signal HLDDI0 is supplied to the test circuit TCD1 as the holding control signal thld and the shift mode control signal sm. Similarly, the holding control signal HLDA1 is supplied to the test circuit TCA1 as the test holding control signal thld and the shift mode control signal sm. The holding control signal HLDDO1 is supplied to the test circuit CTC as the test holding control signal thld and the shift mode control signal sm.

Therefore, switching of input of input data INA0, INDI and INA1 and output of OUT in the test circuits TCA0, TCDI, TCA1 and CTC and data holding can be controlled independently of each other by switching the holding control signals HLDA0, HLDDI0, HLDA1 and HLDDO1 between "0" and "1".

The test operation is now described. In the test operation, the test control signal TEST is set at "1", and the comparison enable signal CMPEN is set at "0". When the test control signal TEST is "1", the selectors 60, 61, 62a, 62b, 63, 64, 65a and 65b output data inputted in the data input 1 terminals respectively. As described above, the shift mode terminal SM is connected to the respective data input 1 terminals of the selectors 62a, 62b, 65a and 65b in common. Similarly to the circuit shown in FIG. 28, the test holding terminals THLDA0 and THLDDI0 are connected to the data input 1 terminals of the selectors 60 and 61 respectively, while the test holding terminals THLDA1 and THLDDO1 are connected to the data input 1 terminals of the selectors 63 and 64 respectively. Therefore, the circuit operation in the test operation is identical to that of the circuit shown in FIG. 28.

Namely, a circuit operation which is identical to that in the circuit shown in FIG. 28 is attained in the circuit shown in FIG. 29 in the test operation. In the ordinary operation, data holding in the address input terminals A0, that in the input terminals DI, that in the address input terminals A1 and that in the output terminals DO can be controlled independently of each other, whereby a further excellent effect is attained.

While the invention has been shown and described in detail, the foregoing description is in all aspects illustrative and not restrictive. It is therefore understood that numerous modifications and variations can be devised without departing from the scope of the invention.

We claim:

1. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for said connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first and second control input terminals for said control circuit, first and second control output terminals for said control circuit, and a test terminal for said control circuit, first and second control input signals for said control circuit and a test signal for said control circuit are inputted in said first and second control input terminals for said control circuit and said test terminal for said control circuit respectively while first and second control output signals are outputted from said first and second control output terminals for said control circuit respectively, said first and second control input signals for said control circuit, said first and second control output signals for said control circuit, and said test signal for said control circuit take said two-valued logic respectively, the logics of said first and second control output signals for said control circuit are equal to that of said second control input signal for said control circuit when said test signal for said control circuit takes either one of said two-valued logic, the logic of said first control output signal for said control circuit is equal to an inverted logic of said first control input signal for said control circuit and the logic of said second control output signal for said control circuit is equal to that of said first control input signal for said control circuit when said test signal for said control circuit takes the other one of said two-valued logic, said first control output terminal for said control circuit is connected to said first control terminal for said connection circuit, and said second control output terminal for said control circuit is connected to said second control terminal for said connection circuit, thereby controlling said connection circuit.

2. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for said connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first and second control input terminals for said control circuit and first and second control output terminals for said control circuit, first and second control input signals for said control circuit are inputted in said first and second control input terminals for said control circuit respectively while first and second control output signals for said control circuit are outputted from said first and second control output terminals for said control circuit respectively, said first and second control input signals for said control circuit and said first and second control output signals for said control circuit take said two-valued logic respectively, the logics of said first and second control output signals for said control circuit are equal to that of said second control input signal for said control circuit when said first control input signal for said control circuit takes said first logic, the logic of said first control output signal for said control circuit is equal to an inverted logic of said first control input signal for said control circuit and the logic of said second control output signal for said control circuit is equal to that of said first control input signal for said control circuit when said first control input signal for said control circuit takes said second logic, said first control output terminal for said control circuit is connected to said first control terminal for said connection circuit, and said second control output terminal for said control circuit is connected to said second control terminal for said connection circuit, thereby controlling said connection circuit.

3. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first to third control input terminals for said control circuit, first and second control output terminals for said control circuit, and a test terminal for said control circuit, first to third control input signals for said control circuit and a test signal for said control circuit are inputted in said first to third control input terminals for said control circuit and said test terminal for said control circuit respectively while first and second control output signals for said control circuit are outputted from said first and second control output terminals for said control circuit respectively, said first to third control input signals for said control circuit, said first and second control output signals for said control circuit, and said test signal for said control circuit take said two-valued logic respectively, the logics of said first and second control output signals for said control circuit are equal to that of said second control input signal for said control circuit when said test signal for said control circuit takes either one of said two-valued logic, the logics of said first and second control output signals for said control circuit are equal to those of said first and third control input signals for said control circuit respectively when said test signal for said control circuit takes the other one of said two-valued logic, said first control output terminal for said control circuit is connected to said first control terminal for said connection circuit, and said second control output terminal for said control circuit is connected to said second control terminal for said connection circuit, thereby controlling said connection circuit.

4. The scan path forming circuit in accordance with claim 3, wherein said connection circuit further comprises a comparison terminal and an expectation terminal, and includes an exclusive OR element, a NAND element and an AND element, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, said AND element comprises an output terminal for said AND element and two input terminals for said AND element, connection between said output terminal for said storage circuit and said second input terminal for said second switching circuit is that through said AND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, said output terminal for said NAND element is connected to one of said input terminals for said AND element, and said output terminal for said storage circuit is connected to the other one of said input terminals for said AND element.

5. The scan path forming circuit in accordance with claim 3, wherein said connection circuit further comprises a comparison terminal and an expectation terminal, and includes an exclusive OR element and a NAND element, said storage circuit further comprises an initialization terminal for said storage circuit, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, and said output terminal for said NAND element is connected to said initialization terminal for said storage circuit.

6. The scan path forming circuit in accordance with claim 3, being a scan path forming circuit provided for a RAM comprising a write terminal and a read terminal, said connection circuit is prepared every said write terminal and every said read terminal, said write terminal is connected to said output terminal for said connection circuit in said connection circuit prepared for said write terminal, said read terminal is connected to said input terminal for said connection circuit in said connection circuit prepared for said read terminal, a write control circuit controlling said connection circuit prepared every said write terminal is said control circuit, a read control circuit controlling said connection circuit prepared every said read terminal is said control circuit, and control by said write control circuit and that by said read control circuit are independent of each other.

7. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for said connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first to third control input terminals for said control circuit, first and second control output terminals for said control circuit, and a test terminal for said control circuit, first to third control input signals for said control circuit and a test signal for said control circuit are inputted in said first to third control input terminals for said control circuit and said test terminal for said control circuit respectively while first and second control output signals for said control circuit are outputted from said first and second control output terminals for said control circuit respectively, said first to third control input signals for said control circuit, said first and second control output signals for said control circuit, and said test signal for said control circuit take said two-valued logic respectively, the logics of said first and second control output signals for said control circuit are equal to that of said second control input signal for said control circuit when said test signal for said control circuit takes either one of said two-valued logic and said first and third control input signals for said control circuit take said first logic respectively, the logics of said first and second control output signals for said control circuit are equal to those of said first and third control input signals for said control circuit respectively when said test signal for said control circuit takes the other one of said two-valued logic, said first control output terminal for said control circuit is connected to said first control terminal for said connection circuit, and said second control output terminal for said control circuit is connected to said second control terminal for said connection circuit, thereby controlling said connection circuit.

8. The scan path forming circuit in accordance with claim 7, wherein said connection circuit further comprises a comparison terminal and an expectation terminal, and includes an exclusive OR element, a NAND element and an AND element, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, said AND element comprises an output terminal for said AND element and two input terminals for said AND element, connection between said output terminal for said storage circuit and said second input terminal for said second switching circuit is that through said AND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, said output terminal for said NAND element is connected to one of said input terminals for said AND element, and said output terminal for said storage circuit is connected to the other one of said input terminals for said AND element.

9. The scan path forming circuit in accordance with claim 4, wherein said connection circuit further comprises a comparison terminal and an expectation terminal, and includes an exclusive OR element and a NAND element, said storage circuit further comprises an initialization terminal for said storage circuit, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, and said output terminal for said NAND element is connected to said initialization terminal for said storage circuit.

10. The scan path forming circuit in accordance with claim 7, being a scan path forming circuit provided for a RAM comprising a write terminal and a read terminal, said connection circuit is prepared every said write terminal and every said read terminal, said write terminal is connected to said output terminal for said connection circuit in said connection circuit prepared for said write terminal, said read terminal is connected to said input terminal for said connection circuit in said connection circuit prepared for said read terminal, a write control circuit controlling said connection circuit prepared every said write terminal is said control circuit, a read control circuit controlling said connection circuit prepared every said read terminal is said control circuit, and control by said write control circuit and that by said read control circuit are independent of each other.

11. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for said connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first to third control input terminals for said control circuit and first and second control output terminals for said control circuit, first to third control input signals for said control circuit are inputted in said first to third control input terminals for said control circuit respectively while first and second control output signals for said control circuit are outputted from said first and second control output terminals for said control circuit respectively, said first to third control input signals for said control circuit and said first and second control output signals for said control circuit take said two-valued logic respectively, the logics of said first and second control output signals for said control circuit are equal to that of said second control input signal for said control circuit when said first control input signal for said control circuit takes said first logic, the logics of said first and second control output signals for said control circuit are equal to those of said first and third control input signals for said control circuit respectively when said first control input signal for said control circuit takes said second logic, said first control output terminal for said control circuit is connected to said first control terminal for said connection circuit, and said second control output terminal for said control circuit is connected to said second control terminal for said connection circuit, thereby controlling said connection circuit.

12. The scan path forming circuit in accordance with claim 11, wherein said connection circuit further comprises a comparison terminal and an expectation terminal, and includes an exclusive OR element, a NAND element and an AND element, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, said AND element comprises an output terminal for said AND element and two input terminals for said AND element, connection between said output terminal for said storage circuit and said second input terminal for said second switching circuit is that through said AND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, said output terminal for said NAND element is connected to one of said input terminals for said AND element, and said output terminal for said storage circuit is connected to the other one of said input terminals for said AND element.

13. The scan path forming circuit in accordance with claim 11, wherein said connection circuit further comprises a comparison terminal and an expectation terminal, and includes an exclusive OR element and a NAND element, said storage circuit further comprises an initialization terminal for said storage circuit, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, and said output terminal for said NAND element is connected to said initialization terminal for said storage circuit.

14. The scan path forming circuit in accordance with claim 11, being a scan path forming circuit provided for a RAM comprising a write terminal and a read terminal, said connection circuit is prepared every said write terminal and every said read terminal, said write terminal is connected to said output terminal for said connection circuit in said connection circuit prepared for said write terminal, said read terminal is connected to said input terminal for said connection circuit in said connection circuit prepared for said read terminal, a write control circuit controlling said connection circuit prepared every said write terminal is said control circuit, a read control circuit controlling said connection circuit prepared every said read terminal is said control circuit, and control by said write control circuit and that by said read control circuit are independent of each other.

15. A scan path forming circuit, comprising:

a connection circuit; and a control circuit, wherein said connection circuit includes first and second switching circuits, a storage circuit, an input terminal for said connection circuit, a test input terminal for said connection circuit, an output terminal for said connection circuit, and first and second control terminals for said connection circuit, first and second control signals for said connection circuit being inputted in said first and second control terminals respectively for said connection circuit take two-valued logic consisting of first and second logics being different from each other respectively, said first switching circuit has a first input terminal for said first switching circuit, a second input terminal for said first switching circuit, an output terminal for said first switching circuit, and a control terminal for said first switching circuit, said second switching circuit has a first input terminal for said second switching circuit, a second input terminal for said second switching circuit, an output terminal for said second switching circuit, and a control terminal for said second switching circuit, said storage circuit has input and output terminals for said storage circuit, said control terminal for said first switching circuit forms said first control terminal for said connection circuit, said first input terminal for said first switching circuit forms said input terminal for said connection circuit, said first input terminal for said first switching circuit is connected to said output terminal for said first switching circuit when said first control signal for said connection circuit takes said first logic, said second input terminal for said first switching circuit is connected to said output terminal for said first switching circuit when said first control signal for said connection circuit takes said second logic, said control terminal for said second switching circuit forms said second control terminal for said connection circuit, said first input terminal for said second switching circuit forms said test input terminal for said connection circuit, said first input terminal for said second switching circuit is connected to said output terminal for said second switching circuit when said second control signal for said connection circuit takes said first logic, said second input terminal for said second switching circuit is connected to said output terminal for said second switching circuit when said second control signal for said connection circuit takes said second logic, said output terminal for said second switching circuit is connected to said second input terminal for said first switching circuit, said output terminal for said first switching circuit is connected to said input terminal for said storage circuit, said output terminal for said storage circuit forms said output terminal for said connection circuit and is connected to said second input terminal for said second switching circuit, said control circuit includes first to third control input terminals for said control circuit and first and second control output terminals for said control circuit, first to third control input signals for said control circuit are inputted in said first to third control input terminals for said control circuit respectively while first and second control output signals for said control circuit are outputted from said first and second control output terminals for said control circuit respectively, said first to third control input signals for said control circuit and said first and second control output signals for said control circuit take said two-valued logic respectively, the logics of said first and second control output signals for said control circuit are equal to that of said second control input signal for said control circuit when said first and third control input signals for said control circuit take said first logic, the logics of said first and second control output signals for said control circuit are equal to those of said first and third control input signals for said control circuit respectively when said first control input signal for said control circuit takes said second logic, said first control output terminal for said control circuit is connected to said first control terminal for said connection circuit, and said second control output terminal for said control circuit is connected to said second control terminal for said connection circuit, thereby controlling said connection circuit.

16. The scan path forming circuit in accordance with claim 15, wherein said connection circuit further comprises a comparison terminal and an expectation terminal, and includes an exclusive OR element, a NAND element and an AND element, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, said AND element comprises an output terminal for said AND element and two input terminals for said AND element, connection between said output terminal for said storage circuit and said second input terminal for said second switching circuit is that through said AND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, said output terminal for said NAND element is connected to one of said input terminals for said AND element, and said output terminal for said storage circuit is connected to the other one of said input terminals for said AND element.

17. The scan path forming circuit in accordance with claim 15, wherein said connection circuit further comprises a comparison terminal and an expectation terminal, and includes an exclusive OR element and a NAND element, said storage circuit further comprises an initialization terminal for said storage circuit, a comparison signal to be inputted in said comparison terminal takes said two-valued logic, said exclusive OR element comprises an output terminal for said exclusive OR element and two input terminals for said exclusive OR element, said NAND element comprises an output terminal for said NAND element and two input terminals for said NAND element, either one of said input terminals for said exclusive OR element forms said expectation terminal, the other one of said input terminals for said exclusive OR element and said first input terminal for said first switching circuit are connected in common, said output terminal for said exclusive OR element is connected to either one of said input terminals for said NAND element, the other one of said input terminals for said NAND element forms said comparison terminal, and said output terminal for said NAND element is connected to said initialization terminal for said storage circuit.

18. The scan path forming circuit in accordance with claim 15, being a scan path forming circuit provided for a RAM comprising a write terminal and a read terminal, said connection circuit is prepared every said write terminal and every said read terminal, said write terminal is connected to said output terminal for said connection circuit in said connection circuit prepared for said write terminal, said read terminal is connected to said input terminal for said connection circuit in said connection circuit prepared for said read terminal, a write control circuit controlling said connection circuit prepared every said write terminal is said control circuit, a read control circuit controlling said connection circuit prepared every said read terminal is said control circuit, and control by said write control circuit and that by said read control circuit are independent of each other.

19. A scan path forming circuit, comprising:

a connection circuit; and a control circuit, wherein said connection circuit includes an input terminal for said connection circuit, a test input terminal for said connection circuit, an output terminal for said connection circuit, first and second control terminals for said connection circuit, and an expectation terminal, first and second control signals for said connection circuit to be inputted in said first and second control terminals for said connection circuit take two-valued logic consisting of first and second logics being different from each other respectively, said connection circuit outputs a signal inputted in said input terminal for said connection circuit from said output terminal for said connection circuit when said first control signal for said connection circuit takes said first logic, said connection circuit outputs a signal inputted in said test input terminal for said connection circuit from said output terminal for said connection circuit when said first control signal for said connection circuit takes said second logic and said second control signal for said connection circuit takes said first logic, said connection circuit keeps on outputting a signal having been outputted from said output terminal for said connection circuit if the logic of a signal inputted in said expectation terminal and that of said signal inputted in said input terminal for said connection circuit are in agreement, and keeps on outputting said first logic from said output terminal for said connection circuit if the logic of said signal inputted in said expectation terminal and that of said signal inputted in said input terminal for said connection circuit are in disagreement when said first and second control signals for said connection circuit each take said second logic, said control circuit includes first to third control input terminals for said control circuit and first and second control output terminals for said control circuit, first to third control input signals for said control circuit are inputted in said first to third control input terminals for said control circuit respectively while first and second control output signals for said control circuit are outputted from said first and second control output terminals for said control circuit respectively, said first to third control input signals for said control circuit and said first and second control output signals for said control circuit take said two-valued logic respectively, the logics of said first and second control output signals for said control circuit are equal to that of said second control input signal for said control circuit when said first and third control input signals for said control circuit take said first logic, the logics of said first and second control output signals for said control circuit are equal to those of said first and third control input signals for said control circuit respectively when said first control input signal for said control circuit takes said second logic, said first control output terminal for said control circuit is connected to said first control terminal for said connection circuit, and said second control output terminal for said control circuit is connected to said second control terminal for said connection circuit, thereby controlling said connection circuit.

20. The scan path forming circuit in accordance with claim 19, being a scan path forming circuit provided for a RAM comprising a write terminal and a read terminal, said connection circuit is prepared every said write terminal and every said read terminal, said write terminal is connected to said output terminal for said connection circuit in said connection circuit prepared for said write terminal, said read terminal is connected to said input terminal for said connection circuit in said connection circuit prepared for said read terminal, a write control circuit controlling said connection circuit prepared every said write terminal is said control circuit, a read control circuit controlling said connection circuit prepared every said read terminal is said control circuit, and control by said write control circuit and that by said read control circuit are independent of each other.

* * * * *